US006900066B2

(12) United States Patent
Toyota et al.

(10) Patent No.: US 6,900,066 B2
(45) Date of Patent: May 31, 2005

(54) COLD CATHODE FIELD EMISSION DEVICE AND PROCESS FOR THE PRODUCTION THEREOF, AND COLD CATHODE FIELD EMISSION DISPLAY AND PROCESS FOR THE PRODUCTION THEREOF

(75) Inventors: Motohiro Toyota, Kanagawa (JP); Ichiro Saito, Kanagawa (JP); Toshiki Shimamura, Kanagawa (JP); Masakazu Muroyama, Kanagawa (JP)

(73) Assignee: Sony Corporation (JP)

( * ) Notice: Subject to any disclaimer, the term of this patent is extended or adjusted under 35 U.S.C. 154(b) by 45 days.

(21) Appl. No.: 10/395,379

(22) Filed: Mar. 25, 2003

(65) Prior Publication Data

US 2003/0190772 A1 Oct. 9, 2003

(30) Foreign Application Priority Data

Mar. 27, 2002 (JP) .................................... P2002-088857

(51) Int. Cl.[7] ................................................ H01L 21/00
(52) U.S. Cl. ........................................................ 438/20
(58) Field of Search ............................. 438/20, 22, 30, 438/34, 29, 257, 259

(56) References Cited

U.S. PATENT DOCUMENTS 6,297,587 B1 * 10/2001 Kikuchi et al. ............. 313/495
6,465,941 B1 * 10/2002 Kubota et al. .............. 313/309
6,580,223 B2 * 6/2003 Konishi et al. .......... 315/169.3
6,771,236 B1 * 8/2004 Konishi et al. ............... 345/80

FOREIGN PATENT DOCUMENTS

| | | |
|---|---|---|
| JP | 03-246851 | 11/1991 |
| JP | 07-320629 | 12/1995 |
| JP | 07-320636 | 12/1995 |
| JP | 2000-215792 | 8/2000 |
| JP | 2000-285796 | 10/2000 |

* cited by examiner

*Primary Examiner*—David Nhu
(74) *Attorney, Agent, or Firm*—Rader, Fishman & Grauer, PLLC; Ronald P. Kananen

(57) ABSTRACT

A process for producing a cold cathode field emission device. A cathode electrode is formed on a front surface of a support member that transmits exposure light. An insulating layer is formed on an entire surface. A gate electrode is formed on the insulating layer. The support member is irradiated with exposure light from a back surface side of the support member through the hole as a mask for exposure. An electron-emitting-portion-forming-layer composed of a photosensitive material is formed at least inside the opening portion. The support member is irradiated with exposure light form a back surface side of the support member through the hole at a mask for exposure.

24 Claims, 36 Drawing Sheets

[STEP-130] CONTINUED

[STEP-140]

[STEP–210]

[STEP–220]

[STEP-230]

[STEP-230] CONTINUED

[STEP-240]

[STEP-330]

[STEP-340]

[STEP-340] CONTINUED

[STEP-350]

[STEP-410]

[STEP-420]

[STEP-420] CONTINUED

[STEP-430]

[STEP-440]

[STEP-450]

[STEP-470]

[STEP-520]

[STEP-530]

[STEP-530] CONTINUED

[STEP-700]

[STEP-720]

[STEP-730]

[STEP-730] CONTINUED

[STEP-740]

[STEP-750]

[STEP-750] CONTINUED

[STEP-810]

[STEP-820]

[STEP-830]

[STEP-830] CONTINUED

[STEP-840]

[STEP-930]

[STEP-940]

[STEP-940] CONTINUED

[STEP-950]

[STEP-1010]

[STEP-1020]

[STEP-1020] CONTINUED

[STEP-1030]

[STEP-1040]

[STEP-1050]

[STEP-1060]

[STEP-1060] CONTINUED

[STEP-1070]

[STEP-1120]

[STEP-1130]

[STEP-1130] CONTINUED

[STEP–30]

[STEP–40]

[STEP-50]

[STEP-60]

COLD CATHODE FIELD EMISSION DEVICE AND PROCESS FOR THE PRODUCTION THEREOF, AND COLD CATHODE FIELD EMISSION DISPLAY AND PROCESS FOR THE PRODUCTION THEREOF

BACKGROUND OF THE INVENTION AND RELATED ART STATEMENT

The present invention relates to a cold cathode field emission device and a process for the production thereof, and a cold cathode field emission display and a process for the production thereof.

In the field of displays for use in television receivers and information terminals, flat type (flat panel type) displays that can comply with demands for a decrease in thickness, a decrease in weight, a larger screen size and a higher definition are being studied as substitutes for conventional mainstream cathode ray tubes (CRT). Such flat type displays include a liquid crystal display (LCD), an electroluminescence display (ELD), a plasma display (PDP) and a cold cathode field emission display (FED). Of these, the liquid crystal display is widely used as a display for an information terminal. When attempts are made to apply it to a stationary television receiver, however, it still has problems to solve for attaining a higher brightness and a larger screen size. In contrast, the cold cathode field emission display uses cold cathode field emission devices (to be sometimes referred to as "field emission device" hereinafter) capable of emitting electrons from a solid to a vacuum on the basis of a quantum tunnel effect without relying on thermal excitation. The cold cathode field emission display is therefore attracting great attention in view of a high brightness and a low power consumption.

FIGS. 32 and 33 show one example of the cold cathode field emission display (to be sometimes referred to as "display" hereinafter) having field emission devices. FIG. 32 is a schematic partial end view of a conventional display, and FIG. 33 is a schematic partial exploded perspective view of a cathode panel CP and an anode panel AP.

Each field emission device shown in FIG. 32 is a field emission device that is a so-called Spindt-type field emission device having a conical electron emitting portion. The above field emission device comprises a cathode electrode 111 formed on a support member 110, an insulating layer 112 formed on the support member 110 and the cathode electrode 111, a gate electrode 113 formed on the insulating layer 112, an opening portion 114 made through the gate electrode 113 and the insulating layer 112 (first opening portion 114A made through the gate electrode 113 and a second opening portion 114B made through the insulating layer 112), and a conical electron emitting portion 115A formed on the cathode electrode 111 positioned in a bottom portion of the second opening portion 114B. Generally, the cathode electrode 111 and the gate electrode 113 are formed in the form of a stripe each and in directions in which projection images of these electrodes cross each other at right angles, and a plurality of field emission devices are generally formed in a region where the projection images of these electrodes overlap. Such a region corresponds to a region occupying one pixel and will be referred to as "overlap region" or "electron emitting region". Further, such electron emitting regions are arranged in the effective field (field that works as an actual display portion) of the cathode panel CP such that they are arranged in the form of two-dimensional matrix.

The anode panel AP comprises a substrate 30, a phosphor layer 31 (31R, 31B, 31G) that is formed on the substrate 30 and has a predetermined pattern, and an anode electrode 33 formed thereon. One pixel is constituted of a group of the field emission devices formed in the overlap region of the cathode electrode 111 and the gate electrode 113 on the cathode panel side, and the phosphor layer 31 being on the anode panel side and facing the group of the field emission devices. In the effective field, such pixels are arranged, for example, on the order of several hundred thousand to several million. A black matrix 32 is formed on the substrate 30 that appears between such phosphor layers 31.

The anode panel AP and the cathode panel CP are arranged such that the electron emitting region and the phosphor layer 31 face each other, and bonded to each other in their circumferential portions through a frame 34, whereby the display can be produced. An ineffective field surrounding the effective field and having a peripheral circuit for selecting pixels (ineffective field of the cathode panel CP in the shown example) is provided with a through-hole 36 for vacuuming, and a tip tube 37 that is sealed after vacuuming is connected to the through-hole 36. That is, a space surrounded by the anode panel AP, the cathode panel CP and the frame 34 is vacuumed and constitutes a vacuum space.

A relatively negative voltage is applied to the cathode electrode 111 from a cathode-electrode control circuit 40, a relatively positive voltage is applied to the gate electrode 113 from a gate-electrode control circuit 41, and a positive voltage higher than the voltage applied to the gate electrode 113 is applied to the anode electrode 33 from an anode-electrode control circuit 42. When the above display is allowed to perform displaying, for example, a scanning signal is inputted to the cathode electrode 111 from the cathode-electrode control circuit 40, and a video signal is inputted to the gate electrode 113 from the gate-electrode control circuit 41. An electric field generated by the voltages applied to the cathode electrode 111 and the gate electrode 113 causes the electron emitting portion 115A to emit electrons on the basis of a quantum tunnel effect, and the electrons are attracted toward the anode electrode 33 to collide with the phosphor layer 31. As a result, the phosphor layer 31 is exited to emit light, and a desired image can be obtained. That is, the operation of the display is controlled, in principle, on the basis of the voltage applied to the gate electrode 113 and the voltage applied to the electron emitting portion 115A through the cathode electrode 111.

The method for producing a Spindt-type field emission device will be explained hereinafter with reference to FIGS. 34A and 34B and FIGS. 35A and 35B which are schematic partial end views of the support member 110, etc., constituting the cathode panel.

Basically, the above Spindt-type field emission device can be obtained by a method of forming each electron emitting portion 115A by vertical vapor deposition of a metal material. That is, deposition particles enter perpendicularly to the first opening portion 114A made through the gate electrode 113. However, the amount of deposition particles that reach a bottom portion of the second opening portion 114B is gradually decreased by the shield effect of an overhanging deposit that is formed in the vicinity of the opening edge of the first opening portion 114A, and the electron emitting portion 115A that is a conical deposit is formed in a self-aligned manner. The method for producing the Spindt-type field emission device will be explained with regard to a method of forming a peel layer 116 on the gate electrode 113 and the insulating layer 112 beforehand for making it easy to remove an unnecessary overhanging deposit. FIGS. 34A and 34B and FIGS. 35A and 35B show one electron emitting portion.

[Step-10]

First, an electrically conductive material layer for a cathode electrode, for example, made of polysilicon, is formed on the support member 110 made, for example, of a glass substrate by a plasma CVD method, and then the electrically conductive material layer for a cathode electrode is patterned by lithography and a dry etching technique, to form the stripe-shaped cathode electrode 111. Then, the insulating layer 112 made of $SiO_2$ is formed on the entire surface by a CVD method.

[Step-20]

Then, an electrically conductive material layer (for example, TiN layer) for a gate electrode is formed on the insulating layer 112 by a sputtering method, and then the electrically conductive material layer for a gate electrode is patterned by lithography and a dry etching technique, whereby the stripe-shaped gate electrode 113 can be obtained. The stripe-shaped cathode electrode 111 extends leftward and rightward on the paper surface of the drawing, and the stripe-shaped gate electrode 113 extends perpendicularly to the paper surface of the drawing.

[Step-30]

Then, a resist layer is formed again, and the first opening portion 114A is formed through the gate electrode 113 by etching, and further, the second opening portion 114B is formed through the insulating layer 112 by etching. The cathode electrode 111 is exposed in the bottom portion of the second opening portion 114B, and then, the resist layer is removed. In the above manner, a structure shown in FIG. 34A can be obtained.

[Step-40]

Then, while the support member 110 is turned, nickel (Ni) is obliquely deposited on the insulating layer 112 and the gate electrode 113, to form the peel layer 116 (see FIG. 34B). In this case, the incidence angle of deposition particles with respect to the normal of the support member 110 is determined to be sufficiently large (for example, incidence angle of 65 to 85 degrees), whereby the peel layer 116 can be formed on the gate electrode 113 and the insulating layer 112 almost without depositing nickel on the bottom portion of the second opening portion 114B. The peel layer 116 extends from the opening edge of the first opening portion 114A like the form of eaves, and due to the peel layer 116, the diameter of the first opening portion 114A is substantially decreased.

[Step-50]

Then, an electrically conductive material such as molybdenum (Mo) is vertically (incidence angle of 3 to 10 degrees) deposited on the entire surface. In this case, with the growth of an electrically conductive material layer 117 having an overhanging form on the peel layer 116 as shown in FIG. 35A, the substantial diameter of the first opening portion 114A is decreased, so that deposition particles that contributes to the formation of a deposit on the bottom portion of the second opening portion 114B come to be gradually limited to deposition particles that pass the center of the first opening portion 114A. As a result, a conical deposit is formed on the bottom portion of the second opening portion 114B, and the conical deposit constitutes the electron emitting portion 115A.

[Step-60]

Then, the peel layer 116 is removed from the surface of the gate electrode 113 and the insulating layer 112 by a lift-off method, to selectively remove the electrically conductive material layer 117 above the gate electrode 113 and the insulating layer 112. In this manner, a cathode panel CP having a plurality of Spindt-type field emission devices can be obtained.

For obtaining a large amount of current of emitted electrons at a low driving voltage in the above display, it is effective to acutely sharpen the top end portion of the electron emitting portion. From this viewpoint, the electron emitting portion 115A of the above Spindt-type field emission device can be said to have an excellent performance. The above process for producing the Spindt-type field emission device is an excellent process capable of forming a conical deposit, as the electron emitting portion 115A, in the opening portions 114A and 114B in a self-aligned manner. However, it requires a high processing technique to form such conical electron emitting portions 115A, and with an increase in size of the display and with an increase in area of the effective field, it is getting difficult to uniformly form such electron emitting portions 115A that are sometimes several tens of millions in number in the entire region of the effective field. Further, many apparatuses for producing semiconductor devices are used, and when the display is increased in size, it is required to increase the size of the apparatuses for producing semiconductor devices, which causes the display production cost to increase.

There has been therefore proposed a so-called flat-type field emission device that does not employ any conical electron emitting portion but employs a flat electron emitting portion exposed on the bottom portion of the opening portion. In the flat-type field emission device, each electron emitting portion is formed on the cathode electrode positioned in the bottom portion of the opening portion, and is constituted of a material having a lower work function than a material constituting the cathode electrode so that the electron emitting portion can accomplish a larger current of emitted electrons even if it has a flat form. In recent years, various carbon materials including carbon nanotubes have been proposed as the above material.

In the production of the above flat-type field emission device, for example, a negative-type photosensitive paste layer 118 containing carbon nanotubes is formed on the entire surface including the inside of the opening portion 114 after a structure shown in FIG. 34A is obtained (see FIG. 36A). Then, the photosensitive paste layer 118 is exposed to light (see FIG. 36B), followed by development and removal of the photosensitive paste layer 118 in an unnecessary region. Then, the remaining photosensitive paste layer 118 is fired, whereby the electron emitting portion 115 can be obtained (see FIG. 36C). A reference numeral 119 shows a mask for exposure.

When the photosensitive paste layer 118 is exposed to light, the mask for exposure 119 is positioned in regard to a reference marker (not shown) provided beforehand, for avoiding a positional deviation between the mask for exposure 119 and the opening portion 114.

However, the support member 110 suffers deformation, for example, due to the thermal history of the support member 110 or due to stresses, etc., of various layers (cathode electrode 111, insulating layer 112, gate electrode 113, etc.) formed on the support member 110. As a result, a positional deviation frequently takes place between the mask for exposure 119 and the opening portion 114 when the photosensitive paste layer 118 is exposed to light. When the above phenomenon takes place, the distance from the opening edge of the first opening portion 114A made through the gate electrode 113 to the electron emitting portion 115 positioned in the bottom portion of the second opening portion 114B varies, and as a result, the amount of emitted electrons varies among such electron emitting portions 115, which causes display non-uniformity to take place. In the worst case, the photosensitive paste layer 118 remains on the side wall of the opening portion 114 and forms a short circuit between the gate electrode 113 and the cathode electrode 111.

OBJECT AND SUMMARY OF THE INVENTION

It is therefore an object of the present invention to provide a process for producing a cold cathode field emission device, which process makes it possible to form an electron emitting portion in a bottom portion of an opening portion made through a gate electrode and an insulating layer in a self-aligned manner in regard to the opening portion, a process for producing a cold cathode field emission display to which the above process is applied, and a cold cathode field emission device and cold cathode field emission display obtained by the above processes.

A process for producing a cold cathode field emission device according to a first-A aspect of the present invention for achieving the above object comprises the steps of;

(A) forming a cathode electrode on the front surface of a support member that transmits exposure light, said cathode electrode having a hole in a bottom of which the support member is exposed, being composed of a material that does not transmit exposure light and extending in a first direction, (B) forming an insulating layer on the entire surface, said insulating layer being composed of a photosensitive material that transmits exposure light, (C) forming a gate electrode on the insulating layer, said gate electrode being composed of a photosensitive material and extending in a second direction different from the first direction, (D) irradiating the support member with exposure light from the back surface side of the support member through said hole as a mask for exposure, to expose the insulating layer and the gate electrode in portions above the hole to the exposure light, developing the insulating layer and the gate electrode to remove the insulating layer and the gate electrode in the portions above the hole, whereby an opening portion is formed through the insulating layer and the gate electrode above the hole and part of the cathode electrode is exposed in a bottom portion of the opening portion, said opening portion having a larger diameter than said hole, (E) forming an electron-emitting-portion-forming-layer composed of a photosensitive material at least inside the opening portion, and (F) irradiating the support member with exposure light from the back surface side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole.

A process for producing a cold cathode field emission display, provided by the present invention, for achieving the above object comprises arranging a substrate having an anode electrode and a phosphor layer and a support member having a cold cathode field emission device such that the phosphor layer and the cold cathode field emission device face each other, and bonding the substrate and the support member in their circumferential portions.

A process for producing a cold cathode field emission display according to a first-A aspect of the present invention comprises producing a cold cathode field emission device on the basis of steps (A) to (F) of the process for producing a cold cathode field emission device according to the above first-A aspect of the present invention.

In explanations to be given below, the steps will be sometimes abbreviated as follows.

The step of "forming a cathode electrode on the front surface (first surface) of a support member that transmits exposure light, said cathode electrode having a hole in a bottom of which the support member is exposed, being composed of a material that does not transmit exposure light and extending in a first direction" will be sometimes abbreviated as the step of "forming a cathode electrode".

The step of "forming an insulating layer on the entire surface, said insulating layer being composed of a photosensitive material that transmits exposure light" will be sometimes abbreviated as the step of "forming an insulating layer composed of a photosensitive material that transmits exposure light".

The step of "forming a gate electrode on the insulating layer, said gate electrode being composed of a photosensitive material and extending in a second direction different from the first direction" will be sometimes abbreviated as the step of "forming a gate electrode composed of a photosensitive material".

The step of "irradiating the support member with exposure light from the back surface (second surface) side of the support member through said hole as a mask for exposure, to expose the insulating layer and the gate electrode in portions above the hole to the exposure light, developing the insulating layer and the gate electrode to remove the insulating layer and the gate electrode in the portions above the hole, whereby an opening portion is formed through the insulating layer and the gate electrode above the hole and part of the cathode electrode is exposed in a bottom portion of the opening portion, said opening portion having a larger diameter than said hole" will be sometimes abbreviated as the step of "forming an opening portion by exposure from the back surface side and exposing the cathode electrode".

The step of "forming an electron-emitting-portion-forming-layer composed of a photosensitive material at least inside the opening portion" will be sometimes abbreviated as the step of "forming an electron-emitting-portion-forming-layer composed of a photosensitive material".

The step of "irradiating the support member with exposure light from the back surface (second surface) side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole" will be sometimes abbreviated as the step of "forming an electron emitting portion on the cathode electrode by exposure and development".

In the process for producing a cold cathode field emission device or a cold cathode field emission display according to the first-A aspect of the present invention, in a process for producing a cold cathode field emission device or a cold cathode field emission display according to any one of a first-B aspect to a first-D aspect to be described later, and in a process for producing a cold cathode field emission device or a cold cathode field emission display according to any one of a third-A aspect to a third-D aspect to be described later, the opening portion is formed through the gate electrode and the insulating layer by a back-surface-exposure method in which the back surface (second surface) of the support member is exposed to light.

In a process for producing a cold cathode field emission device or a cold cathode field emission display according to a second-A aspect, a second-B aspect, a fourth-A aspect or a fourth-B aspect to be described later, an opening portion is formed through a gate electrode and an insulating layer by a front-surface-exposure method in which the front surface (first surface) of a support member is exposed to light.

A process for producing a cold cathode field emission device or a cold cathode field emission display according to any one of a third-A aspect to a third-D aspect, a fourth-A aspect and a fourth-B aspect differs from the process for producing a cold cathode field emission device or a cold cathode field emission display according to any one of the first-A aspect to a first-D aspect, a second-A aspect and a second-B aspect in that a light-transmittable layer is formed and that an electron emitting portion is formed on the light-transmittable layer.

A process for producing a cold cathode field emission device according to a first-B aspect of the present invention for achieving the above object comprises the steps of;

(A) "forming a cathode electrode", (B) "forming an insulating layer composed of a photosensitive material that transmits exposure light", (C) "forming a gate electrode composed of a photosensitive material", (D) "forming an opening portion by exposure from the back surface side and exposing the cathode electrode", (E) forming an electron-emitting-portion-forming-layer composed of a non-photosensitive material that transmits exposure light, at least inside the opening portion, (F) forming an etching mask layer composed of a resist material on the entire surface, (G) irradiating the support member with exposure light from the back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (H) etching the electron-emitting-portion-forming-layer with the etching mask layer, and then removing the etching mask layer, to form an electron emitting portion constituted of the electron-emitting-portion-forming-layer on the cathode electrode and inside the hole.

A process for producing a cold cathode field emission display according to a first-B aspect of the present invention comprises producing a cold cathode field emission device on the basis of steps (A) to (H) of the process for producing a cold cathode field emission device according to the first-B aspect of the present invention.

The step of "forming an electron-emitting-portion-forming-layer composed of a non-photosensitive material that transmits exposure light, at least inside the opening portion" will be sometimes abbreviated as the step of "forming an electron-emitting-portion-forming-layer composed of a non-photosensitive material".

Further, the step of "forming an etching mask layer composed of a resist material on the entire surface" will be sometimes abbreviated as the step of "forming an etching mask layer".

Further, the step of "irradiating the support member with exposure light from the back surface (second surface) side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion" will be sometimes abbreviated as the step of "exposing and developing the etching mask layer".

The step of "etching the electron-emitting-portion-forming-layer with the etching mask layer, and then removing the etching mask layer, to form an electron emitting portion constituted of the electron-emitting-portion-forming-layer on the cathode electrode and inside the hole" will be sometimes abbreviated as the step of "forming an electron emitting portion on the cathode electrode on the basis of etchings".

A process for producing a cold cathode field emission device according to a first-C aspect of the present invention for achieving the above object comprises the steps of;

(A) "forming a cathode electrode", (B) forming an insulating layer composed of a non-photosensitive material that transmits exposure light on the entire surface, (C) forming a gate electrode on the insulating layer, said gate electrode being composed of a non-photosensitive material that transmits exposure light and extending in a second direction different from the first direction, (D) forming an etching mask layer composed of a resist material on the gate electrode and the insulating layer, (E) irradiating the support member with exposure light from the back surface side of the support member through said hole as a mask for exposure, to expose the etching mask layer to the exposure light, and then developing the etching mask layer to form a mask-layer-opening through the etching mask layer in a portion above the hole, (F) etching the gate electrode and the insulating layer below the mask-layer-opening with the etching mask layer, and then removing the etching mask layer, whereby an opening portion is formed through the insulating layer and the gate electrode above the hole and part of the cathode electrode is exposed in a bottom portion of the opening portion, said opening portion having a larger diameter than said hole, (G) "forming an electron-emitting-portion-forming-layer composed of a photosensitive material", and (H) "forming an electron emitting portion on the cathode electrode by exposure and development".

A process for producing a cold cathode field emission display according to a first-C aspect of the present invention comprises producing a cold cathode field emission device on the basis of steps (A) to (H) of the process for producing a cold cathode field emission device according to the first-C aspect of the present invention.

The step of "forming an insulating layer composed of a non-photosensitive material that transmits exposure light on the entire surface" will be sometimes abbreviated as the step of "forming an insulating layer composed of a non-photosensitive material that transmits exposure light".

The step of "forming a gate electrode on the insulating layer, said gate electrode being composed of a non-photosensitive material that transmits exposure light and extending in a second direction different from the first direction" will be sometimes abbreviated as the step of "forming a gate electrode composed of a non-photosensitive material".

Further, the step of "forming an etching mask layer composed of a resist material on the gate electrode and the insulating layer" will be sometimes abbreviated as the step of "forming an etching mask layer on the gate electrode and the insulating layer".

Further, the step of "irradiating the support member with exposure light from the back surface (second surface) side of the support member through said hole as a mask for exposure, to expose the etching mask layer to the exposure light, and then developing the etching mask layer to form a mask-layer-opening through the etching mask layer in a portion above the hole" will be abbreviated as the step of "forming a mask-layer-opening through the etching mask layer".

A process for producing a cold cathode field emission device according to a first-D aspect of the present invention for achieving the above object comprises the steps of;

(A) "forming a cathode electrode", (B) "forming an insulating layer composed of a non-photosensitive material that transmits exposure light", (C) "forming a gate electrode composed of a non-photosensitive material", (D) forming a first etching mask layer composed of a resist material on the gate electrode and the insulating layer, (E) irradiating the support member with exposure light from the back surface side of the support member through said hole as a mask for exposure to expose the first etching mask layer to the exposure light, and then developing the first etching mask layer to form a mask-layer-opening through the first etching mask layer in a portion above the hole, (F) etching the gate electrode and the insulating layer below the mask-layer-opening with the first etching mask layer, and then removing the first etching mask layer, whereby an opening portion is formed through the insulating layer and the gate electrode above the hole and part of the cathode electrode is exposed in a bottom portion of the opening portion, said opening portion having a larger diameter than said hole, (G) "forming an electron-emitting-portion-forming-layer composed of a non-photosensitive material", (H) forming a second etching mask layer composed of a resist material on the entire surface, (I) irradiating the support member with exposure light from the back surface side of the support member through said hole as a mask for exposure, to expose the second etching mask layer to the exposure light in a portion above the hole, and then developing the second etching mask layer, thereby to leave the second etching mask layer on the electron-emitting-portion-forming-layer positioned in a bottom portion of the opening portion, and (J) etching the electron-emitting-portion-forming-layer with the second etching mask layer, and then removing the second etching mask layer, to form an electron emitting portion constituted of the electron-emitting-portion-forming-layer on the cathode electrode and inside the hole.

A process for producing a cold cathode field emission display according to a first-D aspect of the present invention comprises producing a cold cathode field emission device on the basis of steps (A) to (J) of the above process for producing a cold cathode field emission device according to the first-D aspect of the present invention.

The step of "forming a first etching mask layer composed of a resist material on the gate electrode and the insulating layer" will be sometimes abbreviated as the step of "forming a first etching mask layer on the gate electrode and the insulating layer".

Further, the step of "irradiating the support member with exposure light from the back surface (second surface) side of the support member through said hole as a mask for exposure to expose the first etching mask layer to the exposure light, and then developing the first etching mask layer to form a mask-layer-opening through the first etching mask layer in a portion above the hole" will be sometimes abbreviated as the step of "forming a mask-layer-opening through the first etching mask layer".

Further, the step of "forming a second etching mask layer composed of a resist material on the entire surface" will be sometimes abbreviated as the step of "forming a second etching mask layer".

Further, the step of "irradiating the support member with exposure light from the back surface (second surface) side of the support member through said hole as a mask for exposure, to expose the second etching mask layer to the exposure light in a portion above the hole, and then developing the second etching mask layer, thereby to leave the second etching mask layer on the electron-emitting-portion-forming-layer positioned in a bottom portion of the opening portion" will be sometimes abbreviated as the step of "exposing and developing the second etching mask layer".

A process for producing a cold cathode field emission device according to a second-A aspect of the present invention for achieving the above object comprises the steps of;

(A) "forming a cathode electrode", (B) forming an insulating layer composed of a photosensitive material on the entire surface, (C) forming a gate electrode on the insulating layer, said gate electrode being composed of a photosensitive material that transmits exposure light and extending in a second direction different from the first direction, (D) irradiating the support member with exposure light from the front surface side of the support member to expose the gate electrode and the insulating layer to the exposure light, and then developing the gate electrode and the insulating layer, whereby an opening portion is formed through the gate electrode and the insulating layer above the hole and part of the cathode electrode is exposed in a bottom portion of the opening portion, said opening portion having a larger diameter than said hole, (E) "forming an electron-emitting-portion-forming-layer composed of a photosensitive material", and (F) "forming an electron emitting portion on the cathode electrode by exposure and development".

A process for producing a cold cathode field emission display according to a second-A aspect of the present invention comprises producing a cold cathode field emission device on the basis of steps (A) to (F) of the above process for producing a cold cathode field emission device according to the second-A aspect of the present invention.

The step of "forming an insulating layer composed of a photosensitive material on the entire surface" will be sometimes abbreviated as the step of "forming an insulating layer composed of a photosensitive material".

The step of "forming a gate electrode on the insulating layer, said gate electrode being composed of a photosensitive material that transmits exposure light and extending in a second direction different from the first direction" will be sometimes abbreviated as the step of "forming a gate electrode composed of a photosensitive material that transmits exposure light".

Further, the step of "irradiating the support member with exposure light from the front surface (first surface) side of the support member to expose the gate electrode and the insulating layer to the exposure light, and then developing the gate electrode and the insulating layer, whereby an opening portion is formed through the gate electrode and the insulating layer above the hole and part of the cathode electrode is exposed in a bottom portion of the opening portion, said opening portion having a larger diameter than said hole" will be abbreviated as the step of "forming an opening portion by exposure from the front surface side".

A process for producing a cold cathode field emission device according to a second-B aspect of the present invention for achieving the above object comprises the steps of;

(A) "forming a cathode electrode", (B) "forming an insulating layer composed of a photosensitive material", (C) "forming a gate electrode composed of a photosensitive material that transmits exposure light", (D) "forming an opening portion by exposure from the front surface side", (E) "forming an electron-emitting-portion-forming-layer composed of a non-photosensitive material", (F) "forming an etching mask layer", (G) "exposing and developing the etching mask layer", and (H) "forming an electron emitting portion on the cathode electrode on the basis of etching".

A process for producing a cold cathode field emission display according to a second-B aspect of the present invention comprises producing a cold cathode field emission device on the basis of steps (A) to (H) of the above process for producing a cold cathode field emission device according to the second-B aspect of the present invention.

A process for producing a cold cathode field emission device according to a third-A aspect of the present invention for achieving the above object comprises the steps of;

(A) "forming a cathode electrode", (B) forming a light-transmittable layer composed of an electrically conductive material or a resistance material that transmits exposure light, at least inside the hole, (C) "forming an insulating layer composed of a photosensitive material that transmits exposure light", (D) "forming a gate electrode composed of a photosensitive material", (E) irradiating the support member from the back surface side of the support member through said hole as a mask for exposure to expose the insulating layer and the gate electrode to the exposure light in portions above the hole, then, developing the insulating layer and the gate electrode to remove the insulating layer and the gate electrode in portions above the hole, whereby an opening portion is formed through the insulating layer and the gate electrode above the hole and the light-transmittable layer is exposed in a bottom portion of the opening portion, (F) "forming an electron-emitting-portion-forming-layer composed of a photosensitive material", and (G) irradiating the support member from the back surface side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer.

A process for producing a cold cathode field emission display according to a third-A aspect of the present invention comprises producing a cold cathode field emission device on the basis of steps (A) to (G) of the above process for producing a cold cathode field emission device according to the third-A aspect of the present invention.

The step of "forming a light-transmittable layer composed of an electrically conductive material or a resistance material that transmits exposure light, at least inside the hole" will be sometimes abbreviated as the step of "forming a light-transmittable layer".

The step of "irradiating the support member from the back surface (second surface) side of the support member through said hole as a mask for exposure to expose the insulating layer and the gate electrode to the exposure light in portions above the hole, then, developing the insulating layer and the gate electrode to remove the insulating layer and the gate electrode in portions above the hole, whereby an opening portion is formed through the insulating layer and the gate electrode above the hole and the light-transmittable layer is exposed in a bottom portion of the opening portion" will be sometimes abbreviated as the step of "forming an opening portion by exposure from the back surface side and exposing the light-transmittable layer".

Further, the step of "irradiating the support member from the back surface (second surface) side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer" will be sometimes abbreviated as the step of "forming an electron emitting portion on the light-transmittable layer by exposure and development".

A process for producing a cold cathode field emission device according to a third-B aspect of the present invention for achieving the above object comprises the steps of;

(A) "forming a cathode electrode", (B) "forming a light-transmittable layer", (C) "forming an insulating layer composed of a photosensitive material that transmits exposure light", (D) "forming a gate electrode composed of a photosensitive material", (E) "forming an opening portion by exposure from the back surface side and exposing the light-transmittable layer", (F) "forming an electron-emitting-portion-forming-layer composed of a non-photosensitive material", (G) "forming an etching mask layer", (H) "exposing and developing the etching mask layer", and (I) etching the electron-emitting-portion-forming-layer with the etching mask layer, and then removing the etching mask layer, to form an electron emitting portion constituted of the electron-emitting-portion-forming-layer on the light-transmittable layer.

A process for producing a cold cathode field emission display according to a third-B aspect of the present invention comprises producing a cold cathode field emission device on the basis of steps (A) to (I) of the above process for producing a cold cathode field emission device according to the third-B aspect of the present invention.

The step of "etching the electron-emitting-portion-forming-layer with the etching mask layer, and then removing the etching mask layer, to form an electron emitting portion constituted of the electron-emitting-portion-forming-layer on the light-transmittable layer" will be sometimes abbreviated as the step of “forming an electron emitting portion on the light-transmittable layer on the basis of etching”.

A process for producing a cold cathode field emission device according to a third-C aspect of the present invention for achieving the above object comprises the steps of;

(A) “forming a cathode electrode”, (B) “forming a light-transmittable layer”, (C) “forming an insulating layer composed of a non-photosensitive material that transmits exposure light”, (D) “forming a gate electrode composed of a non-photosensitive material”, (E) “forming an etching mask layer on the gate electrode and the insulating layer”, (F) “forming a mask-layer-opening through the etching mask layer”, (G) etching the gate electrode and the insulating layer below the mask-layer-opening with the etching mask layer, and then removing the etching mask layer, whereby an opening portion is formed through the insulating layer and the gate electrode above the hole and the light-transmittable layer is exposed in a bottom portion of the opening portion, (H) “forming an electron-emitting-portion-forming-layer composed of a photosensitive material”, and (I) “forming an electron emitting portion on the light-transmittable layer by exposure and development”.

A process for producing a cold cathode field emission display according to a third-C aspect of the present invention comprises producing a cold cathode field emission device on the basis of steps (A) to (I) of the above process for producing a cold cathode field emission device according to the third-C aspect of the present invention.

A process for producing a cold cathode field emission device according to a third-D aspect of the present invention for achieving the above object comprises the steps of;

(A) “forming a cathode electrode”, (B) “forming a light-transmittable layer”, (C) “forming an insulating layer composed of a non-photosensitive material that transmits exposure light”, (D) “forming a gate electrode composed of a non-photosensitive material”, (E) “forming a first etching mask layer on the gate electrode and the insulating layer”, (F) “forming a mask-layer-opening through the first etching mask layer”, (G) etching the gate electrode and the insulating layer in portions below the mask-layer-opening with the first etching mask layer, and then removing the first etching mask layer, whereby an opening portion is formed through the insulating layer and the gate electrode above the hole and the light-transmittable layer is exposed in a bottom portion of the opening portion, (H) “forming an electron-emitting-portion-forming-layer composed of a non-photosensitive material”, (I) “forming a second etching mask layer”, (J) “exposing and developing the second etching mask layer”, and (K) etching the electron-emitting-portion-forming-layer with the second etching mask layer and then removing the second etching mask layer, to form an electron emitting portion constituted of the electron-emitting-portion-forming-layer on the light-transmittable layer.

A process for producing a cold cathode field emission display according to a third-D aspect of the present invention comprises producing a cold cathode field emission device on the basis of steps (A) to (K) of the above process for producing a cold cathode field emission device according to the third-D aspect of the present invention.

A process for producing a cold cathode field emission device according to a fourth-A aspect of the present invention for achieving the above object comprises the steps of;

(A) “forming a cathode electrode”, (B) “forming a light-transmittable layer”, (C) “forming an insulating layer composed of a photosensitive material”, (D) “forming a gate electrode composed of a photosensitive material that transmits exposure light”, (E) irradiating the support member with exposure light from the front surface side of the support member to expose the gate electrode and the insulating layer to the exposure light, and then developing the gate electrode and the insulating layer, whereby an opening portion is formed through the gate electrode and the insulating layer above the hole and the light-transmittable layer is exposed in a bottom portion of the opening portion, (F) “forming an electron-emitting-portion-forming-layer composed of a photosensitive material”, and (G) “forming an electron emitting portion on the light-transmittable layer by exposure and development”.

A process for producing a cold cathode field emission display according to a fourth-A aspect of the present invention comprises producing a cold cathode field emission device on the basis of steps (A) to (G) of the above process for producing a cold cathode field emission device according to the fourth-A aspect of the present invention.

The step of “irradiating the support member with exposure light from the front surface (first surface) side of the support member to expose the gate electrode and the insulating layer to the exposure light, and then developing the gate electrode and the insulating layer, whereby an opening portion is formed through the gate electrode and the insulating layer above the hole and the light-transmittable layer is exposed in a bottom portion of the opening portion” will be sometimes abbreviated as the step of “exposing the light-transmittable layer in a bottom portion of the opening portion”.

A process for producing a cold cathode field emission device according to a fourth-B aspect of the present invention for achieving the above object comprises the steps of;

(A) “forming a cathode electrode”, (B) “forming a light-transmittable layer”, (C) “forming an insulating layer composed of a photosensitive material”, (D) “forming a gate electrode composed of a photosensitive material that transmits exposure light”, (E) “exposing the light-transmittable layer in a bottom portion of the opening portion”, (F) “forming an electron-emitting-portion-forming-layer composed of a non-photosensitive material”, (G) “forming an etching mask layer”, (H) “exposing and developing the etching mask layer”, and (I) “forming an electron emitting portion on the light-transmittable layer on the basis of etching”.

A process for producing a cold cathode field emission display according to a fourth-B aspect of the present invention comprises producing a cold cathode field emission device on the basis of steps (A) to (I) of the above process for producing a cold cathode field emission device according to the fourth-B aspect of the present invention.

A cold cathode field emission device according to a first aspect of the present invention for achieving the above object comprises;

(a) a cathode electrode formed on a support member and extending in a first direction, (b) an insulating layer formed on the support member and the cathode electrode, (c) a gate electrode formed on the insulating layer and extending in a second direction different from the first direction, (d) an opening portion formed through the gate electrode and the insulating layer, and (e) an electron emitting portion, wherein electrons are emitted from the electron emitting portion exposed in a bottom portion of the opening portion, and wherein a hole reaching the support member is provided in that portion of the cathode electrode which portion is positioned in the bottom portion of the opening portion, and the electron emitting portion is formed on that portion of the cathode electrode, which portion is positioned in the bottom portion of the opening portion, and inside the hole.

A cold cathode field emission device according to a second aspect of the present invention for achieving the above object comprises;

(a) a cathode electrode formed on a support member and extending in a first direction, (b) an insulating layer formed on the support member and the cathode electrode, (c) a gate electrode formed on the insulating layer and extending in a second direction different from the first direction, (d) an opening portion formed through the gate electrode and the insulating layer, and (e) an electron emitting portion, wherein electrons are emitted from the electron emitting portion exposed in a bottom portion of the opening portion, and wherein a hole reaching the support member is provided in that portion of the cathode electrode which portion is positioned in the bottom portion of the opening portion, a light-transmittable layer is formed at least inside the hole, and the electron emitting portion is formed on the light-transmittable layer positioned in the bottom portion of the opening portion.

A cold cathode field emission display according to a first aspect of the present invention for achieving the above object comprises a substrate having an anode electrode and a phosphor layer and a support member having a cold cathode field emission device, the substrate and the support member being arranged to allow the phosphor layer and the cold cathode field emission device to face each other and bonded to each other in their circumferential portions, the cold cathode field emission device comprising;

(a) a cathode electrode formed on a support member and extending in a first direction, (b) an insulating layer formed on the support member and the cathode electrode, (c) a gate electrode formed on the insulating layer and extending in a second direction different from the first direction, (d) an opening portion formed through the gate electrode and the insulating layer, and (e) an electron emitting portion, wherein electrons are emitted from the electron emitting portion exposed in a bottom portion of the opening portion, and wherein a hole reaching the support member is provided in that portion of the cathode electrode which portion is positioned in the bottom portion of the opening portion, and the electron emitting portion is formed on that portion of the cathode electrode, which portion is positioned in the bottom portion of the opening portion, and inside the hole.

A cold cathode field emission display according to a second aspect of the present invention for achieving the above object comprises a substrate having an anode electrode and a phosphor layer and a support member having a cold cathode field emission device, the substrate and the support member being arranged to allow the phosphor layer and the cold cathode field emission device to face each other and bonded to each other in their circumferential portions, the cold cathode field emission device comprising;

(a) a cathode electrode formed on a support member and extending in a first direction, (b) an insulating layer formed on the support member and the cathode electrode, (c) a gate electrode formed on the insulating layer and extending in a second direction different from the first direction, (d) an opening portion formed through the gate electrode and the insulating layer, and (e) an electron emitting portion, wherein electrons are emitted from the electron emitting portion exposed in a bottom portion of the opening portion, and wherein a hole reaching the support member is provided in that portion of the cathode electrode which portion is positioned in the bottom portion of the opening portion, a light-transmittable layer is formed at least inside the hole, and the electron emitting portion is formed on the light-transmittable layer positioned in the bottom portion of the opening portion.

In the process for producing a cold cathode field emission device or the process for producing a cold cathode field emission display according to any one of the first-A aspect to the first-D aspect, the second-A aspect, the second-B aspect, the third-A aspect to the third-D aspect, the fourth-A aspect and the fourth-B aspect of the present invention, or in the cold cathode field emission device or the cold cathode field emission display according to the first or second aspect of the present invention (these will be sometimes generally referred to as "the present invention" hereinafter), the support member is preferably selected from a glass substrate, a glass substrate having an insulating film formed on its surface, a quartz substrate, a quartz substrate having an insulating film formed on its surface or a semiconductor substrate having an insulating film formed on its surface. In view of reducing a production cost, it is preferred to use a glass substrate or a glass substrate having an insulating film formed on its surface. The glass substrate includes high-distortion-point glass, soda glass ($Na_2O.CaO.SiO_2$), borosilicate glass ($Na_2O.B_2O_3.SiO_2$), forsterite ($2MgO.SiO_2$) and lead glass ($Na_2O.PbO.SiO_2$). The substrate constituting the anode panel can have the same constitution as that of the above support member.

The light source for exposure light in the present invention is preferably an ultraviolet ray source, and specific examples thereof include a low-pressure mercury lamp, a high-pressure mercury lamp, an ultrahigh-mercury lamp, a halogen lamp, an ArF Excimer laser and a KrF Excimer laser.

The material for constituting the cathode electrode includes various electrically conductive pastes such as silver paste and copper paste, metals such as tungsten (W), niobium (Nb), tantalum (Ta), titanium (Ta), molybdenum (Mo), chromium (Cr), aluminum (Al), copper (Cu), gold (Au), silver (Ag), nickel (Ni), iron (Fe) and zirconium (Zr), and alloys or compounds containing these metal elements (for example, nitrides such as TiN, and silicides such as $WSi_2$, $MoSi_2$, $TiSi_2$ and $TaSi_2$).

The photosensitive material for constituting the gate electrode includes silver paste, nickel paste and gold paste. Further, the non-photosensitive material that transmits exposure light and is used for constituting the gate electrode includes ITO, tin oxide, zinc oxide and titanium oxide. The photosensitive material that transmits exposure light and is used for constituting the gate electrode includes silver paste, nickel paste and gold paste. The silver paste, nickel paste and gold paste transmit exposure light at the stage of exposure (that is, before firing).

The cathode electrode and the gate electrode are preferably in the form of a stripe. From the view point of the simplification of constitution of the cold cathode field emission display, preferably, the projection image of the stripe-shaped cathode electrode extending in a first direction and the projection image of the gate electrode extending in a second direction cross each other at right angles.

The method of forming the cathode electrode or the gate electrode includes, for example, a combination of a vapor deposition method such as an electron beam deposition method or a filament deposition method, a sputtering method, a CVD method or an ion plating method with an etching method; a screen printing method; a plating method; and a lift-off method. From the viewpoint of reducing a production cost, it is most preferred to employ a screen printing method. When a screen printing method or a plating method is employed, the cathode electrode or the gate electrode having the form, for example, of a stripe can be directly formed.

The electrically conductive material for constituting the light-transmittable layer includes, for example, indium-tin oxide (ITO) and tin oxide ($SnO_2$). The electrically conductive material preferably has a resistance value of $1\times10^{-2}$ Ω or less. The resistance material for constituting the light-transmittable layer includes, for example, amorphous silicon, silicon carbide (SiC), SiCN, SiN, ruthenium oxide ($RuO_2$), tantalum oxide and tantalum nitride. The resistance material has a resistance value of approximately $1\times10^5$ to $1\times10^7$ Ω, preferably several MΩ. The method of forming the light-transmittable layer can be selected from a sputtering method, a CVD method or a screen printing method. From the viewpoint of reducing a production cost, it is preferred to employ a screen printing method. While the light-transmittable layer is formed at least inside the hole, the light-transmittable layer may extend from the hole to the upper surface of the cathode electrode near the hole, may be formed on the entire cathode electrode, or may be formed to reach the front surface of the support member beyond the upper surface of the cathode electrode so long as adjacent cathode electrodes are not short-circuited. In some constitution of the light-transmittable layer, the light-transmittable layer and the cathode electrode are exposed in the bottom portion of the opening portion. When it is difficult to attain a low resistance with the electrically conductive material constituting the light-transmittable layer, a bus line (bus electrode) composed of a material such as silver paste may be formed so as to be in contact with a side of the light-transmittable layer.

The insulating layer composed of a photosensitive material that transmits exposure light can be composed of a so-called positive-type resin (a resin having the property of undergoing decomposition by irradiation with exposure light to be soluble in a developing solution and being removable during development) and a material having a function as an insulating layer. The insulating layer composed of a photosensitive material can be composed of a so-called positive-type resin and a material having a function as an insulating layer, or may be composed of a so-called negative-type resin (a resin having the property of undergoing polymerization or crosslinking by irradiation with exposure light to be insoluble or sparingly soluble in a developing solution and remaining after development) and a material having a function as an insulating layer. The insulating layer composed of a non-photosensitive material that transmits exposure light can be composed of a material that transmits exposure light and has a function as an insulating layer. The material having a function as an insulating layer includes an $SiO_2$-containing material, glass paste, a polyimide resin, SiN, SiON, $CF_4$ and $SiOF_x$. The method of forming the insulating layer can be selected from known processes such as a CVD method, an application method, a sputtering method and a screen-printing method. From the viewpoint of reducing a production cost, it is preferred to employ a screen printing method.

After the electron-emitting-portion-forming-layer is formed such that it extends from the upper surface of the cathode electrode to the hole, or is formed on the light-transmittable layer, as an electron emitting portion, it is in some cases required to fire or cure some material constituting the electron-emitting-portion-forming-layer. In such cases, the upper limit of the temperature for the firing or curing can be set at a temperature at which the cold cathode field emission device or elements constituting the cathode panel are not thermally damaged.

The electron-emitting-portion-forming-layer composed of a photosensitive material can be formed from a so-called negative-type resin (a resin having the property of undergoing polymerization or crosslinking by irradiation with exposure light to be insoluble or sparingly soluble in a developing solution and remaining after development) and a material having an electrons-emitting function. The electron-emitting-portion-forming-layer composed of a non-photosensitive material that transmits exposure light can be formed from an inorganic or organic binder (for example, an inorganic binder such as silver paste or water glass or an organic binder such as an epoxy resin or a acrylic resin) and a material having an electrons-emitting function. Alternatively, the electron-emitting-portion-forming-layer can be also formed from a metal compound solution or dispersion in which a material having an electrons-emitting function is dispersed. In the latter case, the metal compound is fired, whereby the material having an electrons-emitting function is fixed to the cathode electrode surface or the light-transmittable layer surface with a matrix containing a metal atom derived from the metal compound. The matrix is preferably constituted of a metal oxide having electrical conductivity, and more specifically, it is preferably constituted of tin oxide, indium oxide, indium-tin oxide, zinc oxide, antimony oxide or antimony-tin oxide. After the metal compound is fired, there can be obtained a state where part of the material having the electrons-emitting function is embedded in the matrix, or a state where the entire material having the electrons-emitting function is embedded in the matrix. The matrix preferably has a volume resistivity of from $1\times10^{-9}$ Ω·m to $5\times10^{-6}$ Ω·m.

The metal compound for constituting the metal compound solution (dispersion) includes, for example, an organometal compound, an organic acid metal compound or a metal salt (such as chloride, nitrate or acetate). The organic acid metal compound solution is prepared, for example, by dissolving an organic tin compound, an organic indium compound, an organic zinc compound or an organic antimony compound in an acid (such as hydrochloric acid, nitric acid or sulfuric acid) and diluting the resultant solution with an organic solvent (such as toluene, butyl acetate or isopropyl alcohol). The organometal compound solution is prepared, for example, by dissolving an organic tin compound, an organic indium compound, an organic zinc compound or an organic antimony compound in an organic solvent (such as toluene, butyl acetate or isopropyl alcohol). The above solution preferably has a composition containing, per 100 parts by weight of the solution, 0.001 to 20 parts by weight of the material having the electrons-emitting function and 0.1 to 10 parts by weight of the metal compound. The solution may contain a dispersing agent and a surfactant. The above organic solvent may be replaced with water as a solvent in some cases.

The method of forming the electron-emitting-portion-forming-layer from the metal compound solution in which the material having an electrons-emitting function includes, for example, a spray method, a spin coating method, a dipping method, a die coating method and a screen printing method. Of these, a spray method is preferred in view of easiness in application.

The temperature for firing the metal compound can be set, for example, at a temperature at which a metal salt is oxidized to form a metal oxide having electrical conductivity or a temperature at which the organometal compound or the organic acid metal compound is decomposed to form the matrix (for example, metal oxide having electric conductivity) containing a metal atom derived from the organometal compound or the organic acid metal compound. For example, the above temperature is preferably set at 300° C. or higher.

The material having an electrons-emitting function includes a carbon nanotube structure. As a carbon nanotube structure, specifically, carbon nanotubes and/or carbon nanofibers are used. More specifically, the electron emitting portion may be constituted of carbon nanotubes, may be constituted of carbon nanofibers, or may be constituted of a mixture of carbon nanotubes with carbon nanofibers. Macroscopically, the carbon nanotubes or carbon nanofibers may have the form of a powder or a thin film. The carbon nanotube structure constituted of carbon nanotubes and/or carbon nanofibers can be produced or formed by a known PVD method such as an arc discharge method and a laser abrasion method, or any one of various CVD methods such as a plasma CVD method, a laser CVD method, a thermal CVD method, a gaseous phase synthesis method and a gaseous phase growth method.

Alternatively, the material having an electrons-emitting function is preferably selected from materials having a smaller work function Φ than the material for constituting the cathode electrode. Such a material is determined depending upon the work function of the material for constituting the cathode electrode, a voltage difference between the gate electrode and the cathode electrode and a required current density of electrons to be emitted. Specifically, the work function Φ of the above material having an electrons-emitting function is 3 eV or lower, preferably 2 eV or lower. The above material includes, for example, carbon (Φ<1 eV), cesium (Φ=2.14 eV), $LaB_6$ (Φ=2.66–2.76 eV), BaO (Φ=1.6–2.7 eV), SrO (Φ=1.25–1.6 eV), $Y_2O_3$ (Φ=2.0 eV), CaO (Φ=1.6–1.86 eV), BaS (Φ=2.05 eV), TiN (Φ=2.92 eV) and ZrN (Φ=2.92 eV). The material having an electrons-emitting function is not necessarily required to have electrical conductivity.

Alternatively, the material having an electrons-emitting function can be selected from materials that come to have a larger secondary electron gain than an electrically conductive material constituting the cathode electrode as required. That is, as required, the above material can be selected from metals such as silver (Ag), aluminum (Al), gold (Au), cobalt (Co), copper (Cu), molybdenum (Mo), niobium (Nb), nickel (Ni), platinum (Pt), tantalum (Ta), tungsten (W) and zirconium (Zr); semiconductors such as silicon (Si) and germanium (Ge); inorganic simple substances such as carbon and diamond; and compounds such as aluminum oxide ($Al_2O_3$), barium oxide (BaO), beryllium oxide (BeO), calcium oxide (CaO), magnesium oxide (Mgo), tin oxide ($SnO_2$), barium fluoride ($BaF_2$) and calcium fluoride ($CaF_2$). The above materials having an electrons-emitting function is not necessarily required to have electrical conductivity.

The resist material for the etching mask layer, the first etching mask layer and the second etching mask layer can be selected from known resist materials. When the etching mask layer, the first etching mask layer or the second etching mask layer is exposed to light by a back-surface-exposure method, the resist material therefor is selected from positive-type resist materials (resist materials that undergo decomposition by irradiation with exposure light to be soluble in a developing solution and is removed during development). When it is exposed to light by a front-surface-exposure method, the resist material therefor is selected from positive-type resist materials or negative-type resist materials (resist materials that undergo polymerization or crosslinking by irradiation with exposure light to be insoluble or sparingly soluble in a developing solution and remains after development).

In the step of "forming an electron-emitting-portion-forming-layer composed of a photosensitive material", it is sufficient to form the electron-emitting-portion-forming-layer composed of a photosensitive material at least inside the opening portion, and the electron-emitting-portion-forming-layer may be formed inside the opening portion, on the gate electrode and on the insulating layer. In the step of "forming an electron-emitting-portion-forming-layer composed of a non-photosensitive material", it is sufficient to form the electron-emitting-portion-forming-layer composed of a non-photosensitive material at least inside the opening portion, and the electron-emitting-portion-forming-layer may be formed on the entire surface (that is, inside the opening portion, on the gate electrode and on the insulating layer). The above electron-emitting-portion-forming-layer can be formed, for example, by a screen printing method or a spin coating method. Alternatively, the electron-emitting-portion-forming-layer may be formed inside the opening portion and on the gate electrode, may be formed in a region where the gate electrode and the cathode electrode overlap, or may be formed on the gate electrode and the insulating layer in portions above the cathode electrode. The above electron-emitting-portion-forming-layer can be formed, for example, by a screen printing method.

In the step of "forming an opening portion by exposure from the back surface side and exposing the cathode electrode", when the support member is irradiated with exposure light from the back surface (second surface) side of the support member through said hole as a mask for exposure, preferably, an exposure-light-shielding member (mask) is disposed on the back surface (second surface) side of the support member so that the insulating layer and the gate electrode are not exposed to exposure light in portions that should not to be irradiated with the exposure light.

In the step of "forming an opening portion by exposure from the back surface side and exposing the cathode electrode", the opening portion having a larger diameter than the hole can be formed through the insulating layer and the gate electrode above the hole by a method in which the insulating layer and the gate electrode are exposed to exposure light to excess (that is, a method of over-exposure) and/or a method in which the insulating layer and the gate electrode are developed to excess (that is, a method of over-development).

In the process for producing a cold cathode field emission device or the process for producing a cold cathode field emission display according to the first-C aspect of the present invention, the step (F) is carried out, in which the gate electrode and the insulating layer below the mask-layer-opening are etched with the etching mask layer, to form the opening portion, having a larger diameter than the hole, through the insulating layer and the gate electrode above the hole. The above opening portion can be formed by over-etching of the insulating layer and the gate electrode. In the process for producing a cold cathode field emission device or the process for producing a cold cathode field emission display according to the first-D aspect of the present invention, the step (F) is carried out, in which the gate electrode and the insulating layer below the mask-layer-opening are etched with the first etching mask layer, to form the opening portion, having a larger diameter than the hole, through the insulating layer and the gate electrode above the hole. The above opening portion can be formed by over-etching of the insulating layer and the gate electrode.

In the step of "forming an opening portion by exposure from the front surface side", the opening portion having a larger diameter than the hole can be formed by exposing the etching mask layer to exposure light through a proper exposure-light-shielding member (mask).

In the step of "forming an opening portion by exposure from the back surface side and exposing the light-transmittable layer", preferably, the opening portion having a larger diameter than the hole is formed through the insulating layer and the gate electrode above the hole. For this purpose, there can be employed a method in which the insulating layer and the gate electrode are exposed to exposure light to excess (that is, a method of over-exposure) and/or a method in which the insulating layer and the gate electrode are developed to excess (that is, a method of over-development).

In the process for producing a cold cathode field emission device or the process for producing a cold cathode field emission display according to the third-C aspect of the present invention, the step (G) is carried out, in which the gate electrode and the insulating layer below the mask-layer-opening are etched with the etching mask layer, to form the opening portion. In this case, preferably, the opening portion has a larger diameter than the hole, and such an opening portion can be formed by over-etching of the insulating layer and the gate electrode. In the process for producing a cold cathode field emission device or the process for producing a cold cathode field emission display according to the third-D aspect of the present invention, the step (G) is carried out, in which the gate electrode and the insulating layer below the mask-layer-opening are etched with the first etching mask layer, to form the opening portion. In this case, preferably, the opening portion has a larger diameter than the hole, and such an opening portion can be formed by over-etching of the insulating layer and the gate electrode.

In the step of "exposing the light-transmittable layer in a bottom portion of the opening portion", preferably, the opening portion having a larger diameter than the hole is formed. For this purpose, there can be employed a method in which the insulating layer and the gate electrode are exposed to exposure light to excess (that is, a method of over-exposure) and/or a method in which the insulating layer and the gate electrode are developed to excess (that is, a method of over-development).

After the formation of the electron emitting portion, it is preferred to carry out a kind of activation treatment (washing) of the electron emitting portion surface, from the view point of a further improvement in efficiency of emission of electrons from the electron emitting portion. The above treatment includes a plasma treatment in an atmosphere of a gas such as hydrogen gas, ammonia gas, helium gas, argon gas, neon gas, methane gas, ethylene gas, acetylene gas or nitrogen gas.

The plan form of the hole or the opening portion (a form obtained by cutting the hole or the opening portion with an imaginary plane in parallel with the support member surface) may be any form such as a circle, an oval, a rectangle, a polygon, a rounded rectangle, a rounded polygon or the like.

The material for constituting the anode electrode can be selected as required depending upon a constitution of the cold cathode field emission display. That is, when the cold cathode field emission display is a transmission type (the anode panel corresponds to a display surface), and when the anode electrode and the phosphor layer are stacked on the substrate (constituting the anode panel) in this order, not only the substrate but also the anode electrode is required to be transparent, and a transparent electrically conductive material such as ITO (indium-tin oxide) or the like is used. When the cold cathode field emission display is a reflection type (the cathode panel corresponds to a display surface), or even if it is a transmission type but when the phosphor layer and the anode electrode are stacked on the substrate in this order, ITO can be naturally used, and aluminum (Al) or chromium (Cr) can be also used. When aluminum (Al) or chromium (Cr) is used to constitute the anode electrode, the anode electrode specifically has a thickness of from $3\times10^{-8}$ m (30 nm) to $1.5\times10^{-7}$ m (150 nm), preferably from $5\times10^{-8}$ m (50 nm) to $1\times10^{-7}$ m (100 nm). The anode electrode can be formed by a vapor deposition method or a sputtering method.

The anode panel is preferably provided further with a plurality of partition walls for preventing the occurrence of a so-called optical crosstalk (color mixing) caused by electrons that recoil from the phosphor layer and enter another phosphor layer or secondary electrons that are emitted from one phosphor layer and enter another phosphor layer, or for preventing electrons recoiling from one phosphor layer or secondary electrons emitted from one phosphor layer from moving over a partition wall and entering other phosphor layer to collide with the phosphor layer.

The plan form of the partition walls includes the form of a lattice (grille) in which walls surround each phosphor layer that corresponds to one pixel and has, for example, a nearly rectangular (dot-shaped) plan form, and the form of bands or stripes in which walls extend along opposite two sides of a phosphor layer having a nearly rectangular or strip-shaped form. When the partition walls have the form of a lattice, the partition walls may have a form in which they surround a region of each phosphor layer continuously or discontinuously. When the partition walls have the form of bands or a stripes, the partition walls may have a form in which they extend continuously or discontinuously. After the partition walls are formed, they may be polished to flatten top surfaces thereof.

From the viewpoint of an improvement in the contrast of a display image, it is preferred to employ a constitution in which a black matrix for absorbing light from phosphor layers is formed between one phosphor layer and another phosphor layer and between the partition wall and the substrate. The material for the black matrix is preferably selected from materials capable of absorbing at least 99% of light from the phosphor layers. The above material includes carbon, metal thin films (for example, chromium, nickel, aluminum, molybdenum and alloys of these), metal oxides (such as chromium oxide), metal nitrides (such as chromium nitride), a heat-resistant organic resin, glass paste, and glass paste containing a black pigment or electrically conductive particles made of silver and the like. Specifically, the above material can be selected, for example, from a photosensitive polyimide resin, chromium oxide or a chromium oxide/chromium stacked film. In the chromium oxide/chromium stacked film, a chromium film is in contact with the substrate.

When the cathode panel and the anode panel are bonded to each other in their circumferential portions, they may be bonded with an adhesive, or a frame made of an insulating rigid material such as glass or ceramic may be used in combination with an adhesive. When the frame is used in combination with an adhesive, the facing distance between the cathode panel and the anode panel can be increased by selecting a frame height as required, as compared with a case where an adhesive alone is used. As a material for constituting the adhesive, a frit glass is generally used, while a so-called low-melting metal material having a melting point of 120 to 400° C. may be used. The above low-melting metal material includes In (indium: melting point 157° C.); an indium-gold low-melting alloy; tin (Sn)-containing high-temperature solders such as $Sn_{80}Ag_{20}$ (melting point 220–370°) and $Sn_{95}Cu_5$ (melting point 227–370° C.); lead (Pb)-containing high-temperature solders such as $Pb_{97.5}Ag_{2.5}$ (melting point 304° C.), $Pb_{94.5}Ag_{5.5}$ (melting point 304–365° C.) and $Pb_{97.5}Ag_{1.5}Sn_{1.0}$ (melting point 309° C.); zinc (Zn)-containing high-temperature solders such as $Zn_{95}Al_5$ (melting point 380° C.); tin-lead-containing standard solders such as $Sn_5Pb_{95}$ (melting point 300–314° C.) and $Sn_2Pb_{98}$ (melting point 316–322° C.); and brazing materials such as $Au_{88}Ga_{12}$ (melting point 381° C). All of the above subscripts show atomic %.

When the substrate, the support member and the frame are bonded, these three members may be bonded at the same time. Alternatively, one of the substrate and the support member may be bonded to the frame at a first stage, and the other of the substrate and the support member may be bonded to the frame at a second stage. When the above three members are bonded at the same time, or the bonding at the above second stage is carried out, in a high vacuum atmosphere, a space surrounded by the substrate, the support member and the frame comes to be vacuum simultaneously with the bonding. Alternatively, after the three members are bonded, the space surrounded by the substrate, the support member and the frame may be vacuumed to generate a vacuum. When the vacuuming is carried out after bonding, the atmosphere for the bonding may have atmospheric pressure or reduced pressure. The gas constituting the atmosphere may be atmosphere or may be an inert gas containing nitrogen or a gas (for example, Ar gas) belonging to the group 0 of the periodic table.

When the vacuuming is carried out after bonding, the vacuuming can be carried out through a chip tube previously connected to the substrate and/or the support member. The chip tube is typically formed of a glass tube, and it is bonded to a circumference of a through-hole formed in an ineffective field (that is, a region other than the effective field to function as a display portion) of the substrate and/or the support member with frit glass or the above low-melting metal material. When the space reaches a predetermined vacuum degree, the chip tube is sealed by thermal fusion. When the entire cold cathode field emission display is once heated and then temperature-decreased before the sealing, properly, a residual gas can be released into the space, and the residual gas can be removed out of the space by the vacuuming.

In the production process of the present invention, the electron emitting portion can be formed by the back-surface-exposure method, so that the electron emitting portion can be formed in the bottom portion of the opening portion formed through the gate electrode and the insulating layer, in a self-aligned manner in regard to the opening portion. In the process for producing a cold cathode field emission device or the process for producing a cold cathode field emission display according to any one of the first-A to first-D aspects of the present invention and the third-A to third-D aspects of the present invention, the opening portion can be formed by the back-surface-exposure method, so that the opening portion can be formed through the gate electrode and the insulating layer in a self-aligned manner in regard to the hole.

BRIEF DESCRIPTION OF THE DRAWINGS

FIG. 2C, are schematic partial cross-sectional views of a support member, etc., for explaining the process for producing a cold cathode field emission device in Example 1.

FIG. 3B, are schematic partial cross-sectional views of a support member, etc., for explaining the process for producing a cold cathode field emission device in Example 1.

FIG. 5B, are schematic partial end views of a support member, etc., for explaining the process for producing a cold cathode field emission device in Example 2.

FIG. 6B, is a schematic partial end view of a support member, etc., for explaining the process for producing a cold cathode field emission device in Example 2.

FIG. 8B, are schematic partial end views of a support member, etc., for explaining the process for producing a cold cathode field emission device in Example 3.

FIG. 10B, are schematic partial end views of a support member, etc., for explaining the process for producing a cold cathode field emission device in Example 4.

FIG. 11B, are schematic partial end views of a support member, etc., for explaining the process for producing a cold cathode field emission device in Example 4.

FIG. 12B, are schematic partial end views of a support member, etc., for explaining the process for producing a cold cathode field emission device in Example 4.

FIG. 13B, is a schematic partial end view of a support member, etc., for explaining the process for producing a cold cathode field emission device in Example 4.

FIG. 15B, is a schematic partial end view of a support member, etc., for explaining the process for producing a cold cathode field emission device in Example 5.

FIG. 17C, are schematic partial end views of a support member, etc., for explaining the process for producing a cold cathode field emission device in Example 7.

FIG. 18B, are schematic partial end views of a support member, etc., for explaining the process for producing a cold cathode field emission device in Example 7.

FIG. 20B, are schematic partial end views of a support member, etc., for explaining the process for producing a cold cathode field emission device in Example 8.

FIG. 21B, is a schematic partial end view of a support member, etc., for explaining the process for producing a cold cathode field emission device in Example 8.

FIG. 23B, are schematic partial end views of a support member, etc., for explaining the process for producing a cold cathode field emission device in Example 9.

FIG. 25B, are schematic partial end views of a support member, etc., for explaining the process for producing a cold cathode field emission device in Example 10.

FIG. 26B, are schematic partial end views of a support member, etc., for explaining the process for producing a cold cathode field emission device in Example 10.

FIG. 27B, are schematic partial end views of a support member, etc., for explaining the process for producing a cold cathode field emission device in Example 10.

FIG. 28B, is schematic partial end view of a support member, etc., for explaining the process for producing a cold cathode field emission device in Example 10.

FIG. 30B, is schematic partial end view of a support member, etc., for explaining the process for producing a cold cathode field emission device in Example 11.

FIG. 34B, are schematic partial end views of a support member, etc., for explaining a Spindt-type cold cathode field emission device.

DESCRIPTION OF THE PREFERRED EMBODIMENTS

The present invention will be explained on the basis of Examples with reference to drawings hereinafter.

EXAMPLE 1

Example 1 is concerned with the cold cathode field emission device (to be abbreviated as "field emission device" hereinafter) according to the first aspect of the present invention, the process for producing a field emission device according to the first-A aspect of the present invention, the cold cathode field emission display (to be abbreviated as "display" hereinafter) according to the first aspect of the present invention, and the process for producing a display according to the first-A aspect of the present invention.

Figure 1:
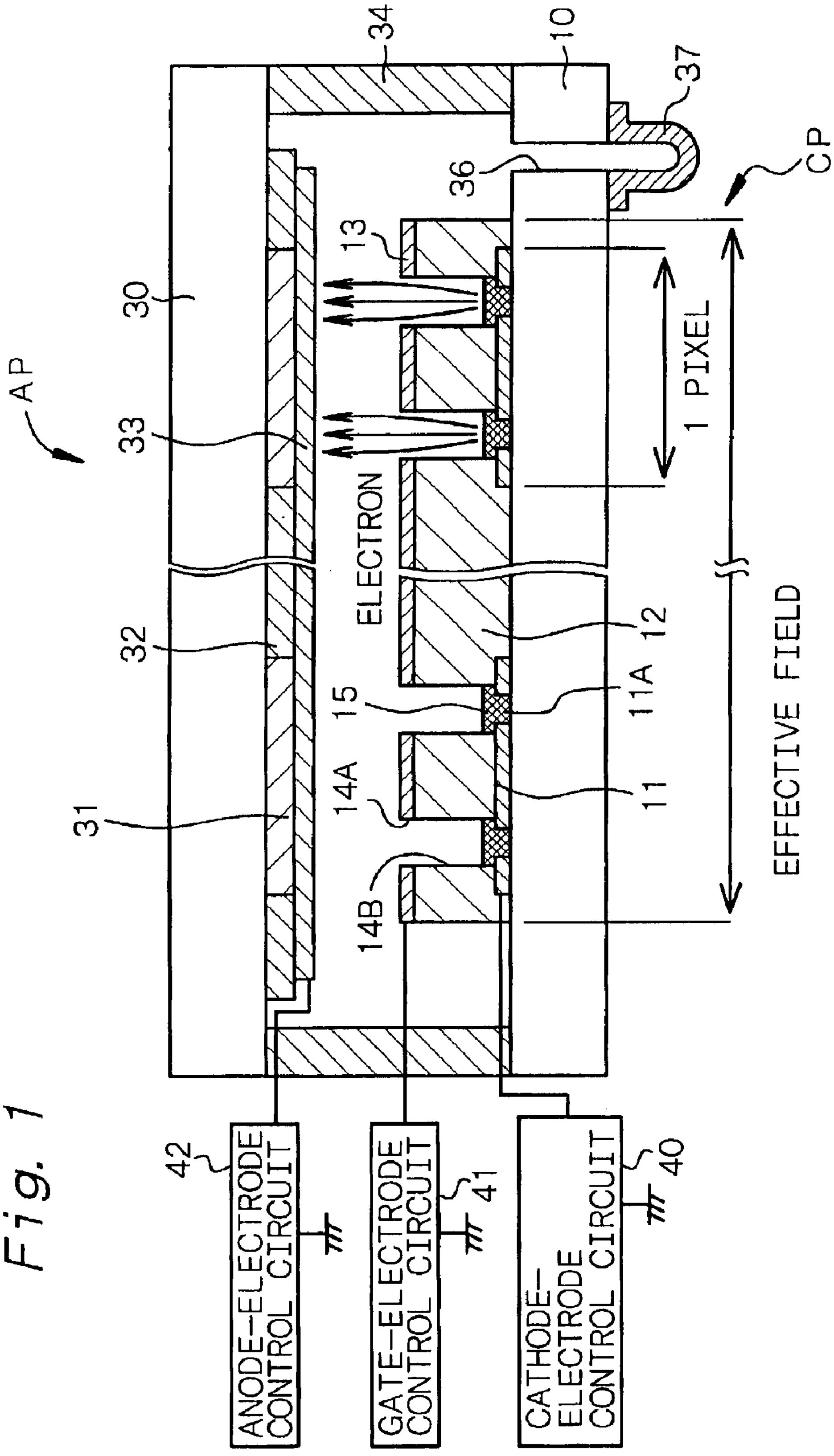
FIG. 1 is a schematic partial end view of a cold cathode field emission display having cold cathode field emission devices in Example 1.
Figure 4A:
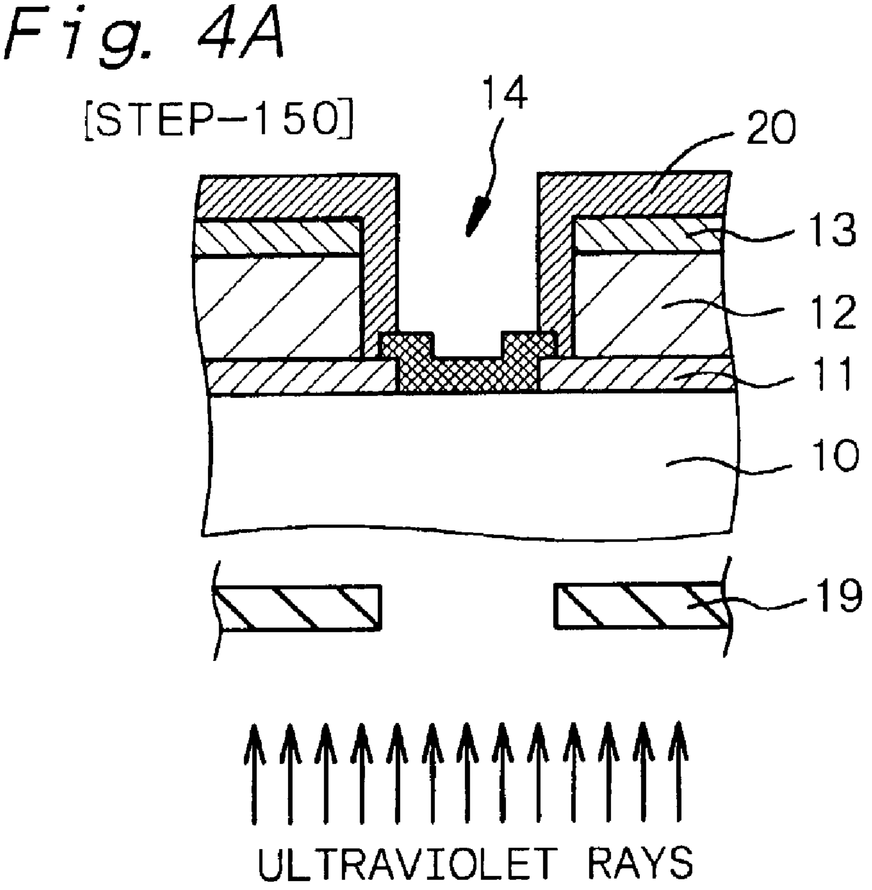
FIGS. 4A and 4B, following
Figure 4B:
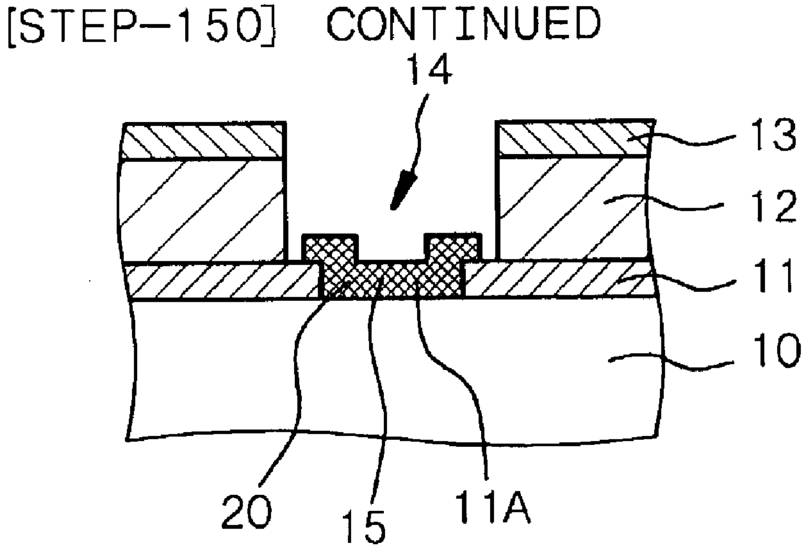
Figure 33:
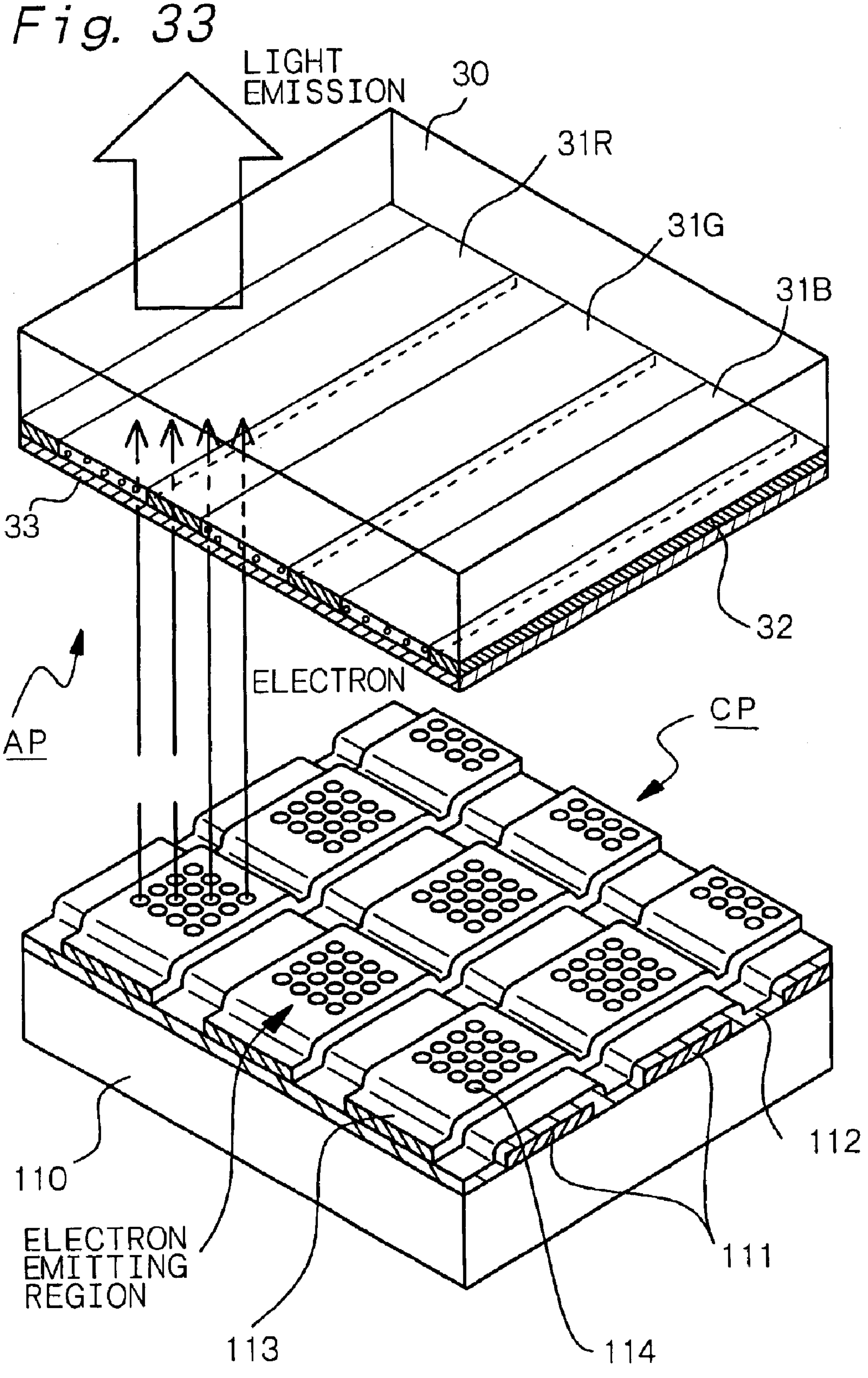
FIG. 33 is a schematic partial exploded perspective view of a cathode panel and an anode panel of a cold cathode field emission display.
Figure 34A:
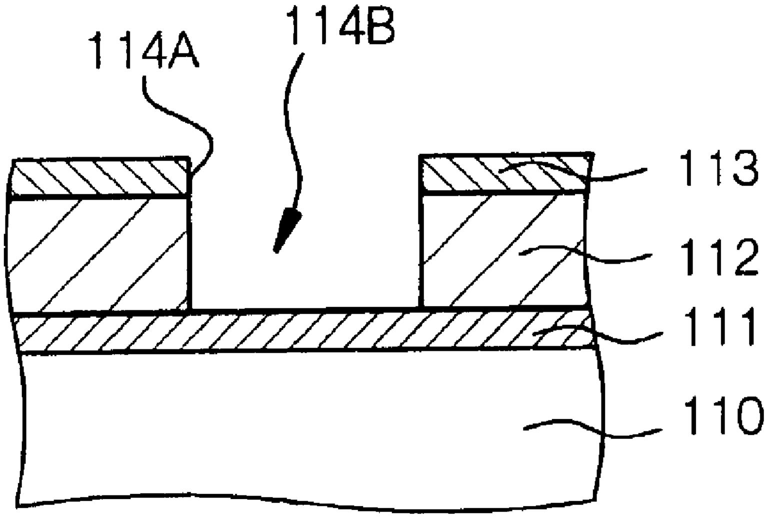
FIGS. 34A and 34B are schematic partial end views of a support member, etc., for explaining the process for producing a Spindt-type cold cathode field emission device.
Figure 34B:
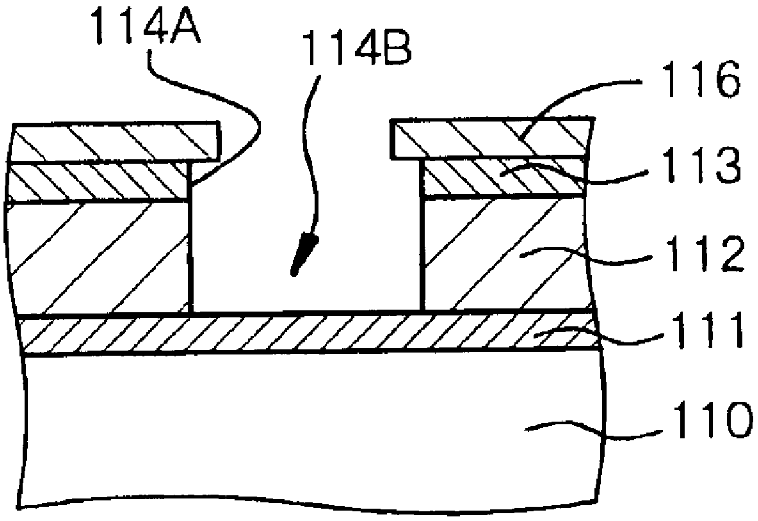
Figure 35A:
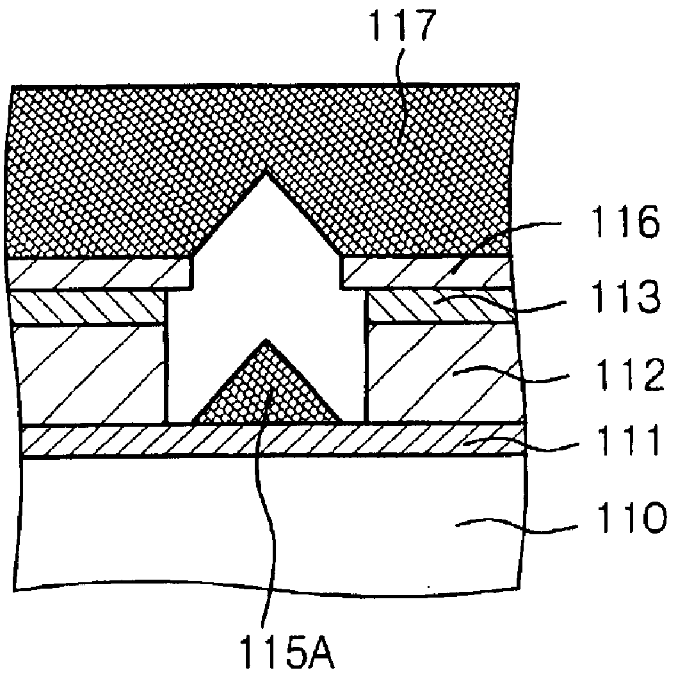
FIGS. 35A and 35B, following
Figure 35B:
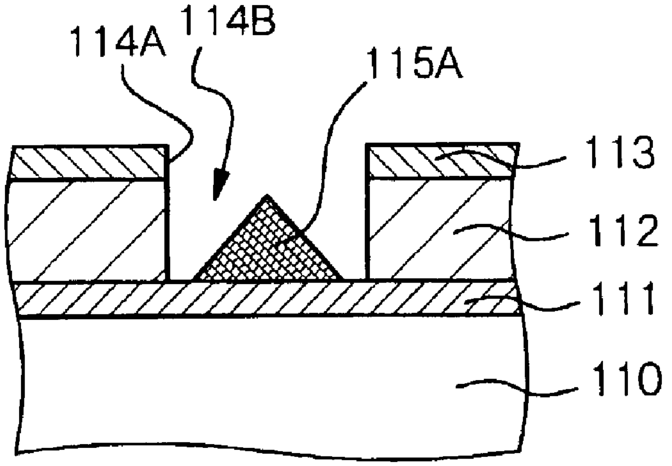
Figure 36A:
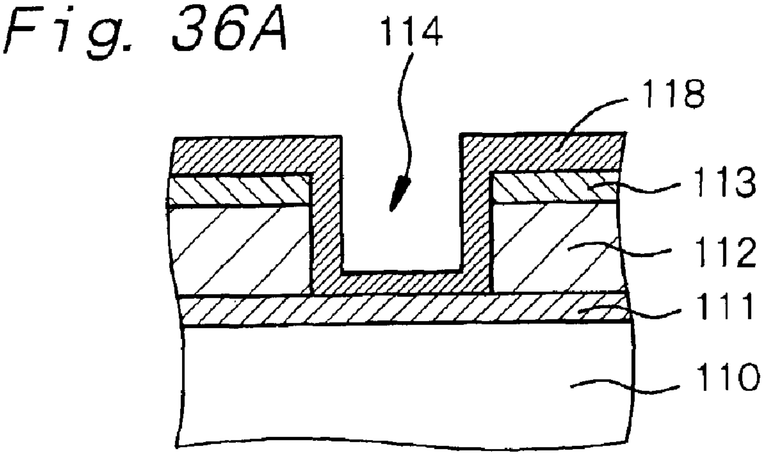
FIGS. 36A to 36C are schematic partial end views of a support member, etc., for explaining a flat-type cold cathode field emission device.
Figure 36B:
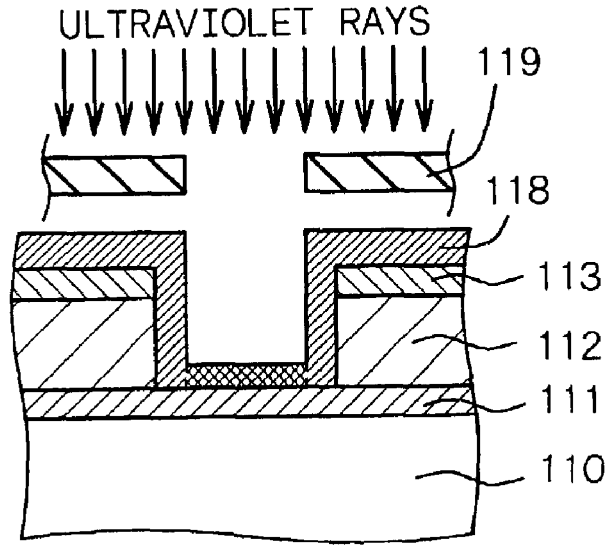
Figure 36C:
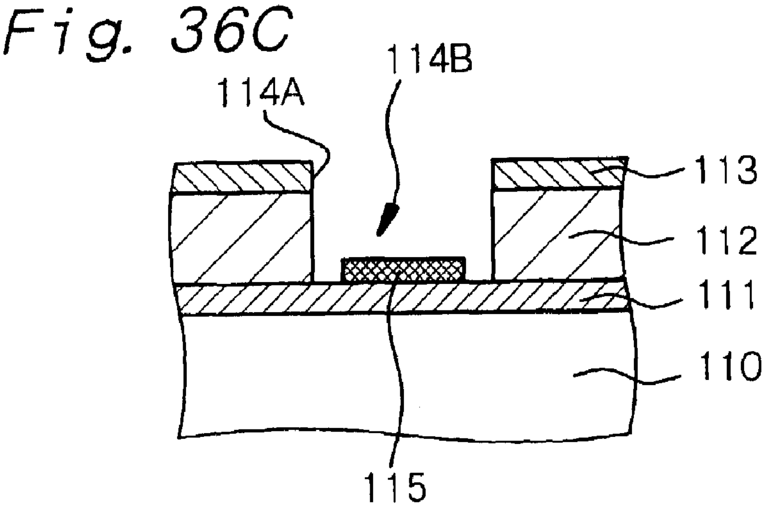

FIG. 1 shows a schematic partial end view of the display in Example 1, and FIG. 4B shows a schematic partial end view of the field emission device in Example 1. A schematic partial exploded perspective view of a cathode panel AP and an anode panel AP is substantially the same as shown in FIG. 33.

The field emission device of Example 1 comprises;

(a) a stripe-shaped cathode electrode 11 formed on a support member 10 and extending in a first direction, (b) an insulating layer 12 formed on the support member 10 and the cathode electrode 11, (c) a stripe-shaped gate electrode 13 formed on the insulating layer 12 and extending in a second direction different from the first direction, (d) an opening portion 14 formed through the gate electrode 13 and the insulating layer 12 (a first opening portion 14A formed through the gate electrode 13 and a second opening portion 14B formed through the insulating layer 12), and (e) an electron emitting portion 15, wherein electrons are emitted from the electron emitting portion 15 exposed in a bottom portion of the opening portion 14.

A hole 11A reaching the support member 10 is provided in that portion of the cathode electrode 11 which portion is positioned in the bottom portion of the opening portion 14. The electron emitting portion 15 is formed on that portion of the cathode electrode 11, which portion is positioned in the bottom portion of the opening portion 14, and inside the hole 11A. The projection image of the cathode electrode 11 having the form of a strip and the projection image of the gate electrode 13 having the form of a strip cross each other at right angles.

The display of Example 1 comprises a cathode panel CP and an anode panel AP and has a plurality of pixels. In the cathode panel CP, a number of electron emitting regions having the above field emission device(s) each are arranged in an effective field in the form of a two-dimensional matrix. The anode panel AP comprises a substrate 30, phosphor layers 31 (red-light-emitting phosphor layer 31R, green-light-emitting phosphor layer 31G and blue-light-emitting phosphor layer 31B) formed on the substrate 30 so as to have a predetermined pattern, and an anode electrode 33 made, for example, of an aluminum thin film so as to have the form of a sheet covering the entire surface of the effective field. A black matrix 32 is formed on the substrate 30 and between one phosphor layer 31 and another phosphor layer 31. The black matrix 32 may be omitted. When a monochromatic display is intended, it is not necessarily required to form the phosphor layers 31 in a predetermined pattern. Further, the anode electrode made of a transparent electrically conductive film such as an ITO film may be formed between the substrate and the phosphor layers 31. Alternatively, the anode panel AP may comprise an anode electrode 33 made of a transparent electrically conductive film formed on a substrate, phosphor layers 31 and a black matrix 32 formed on the anode electrode 33, and a light reflection electrically conductive film made of aluminum formed on the phosphor layers 31 and the black matrix 32 and electrically connected to the anode electrode 33.

The display has a structure in which the substrate 30 having the anode electrode 33 and the phosphor layers 31 (31R, 31G, 31B) and the support member 10 having the field emission devices are disposed such that phosphor layer 31 and field emission device face each other, and the substrate 30 and the support member 10 are bonded in their circumferential portions. Specifically, the cathode panel CP and the anode panel AP are bonded to each other in their circumferential portions through a frame 34. Further, a through-hole 36 for vacuum is provided in the ineffective field of the cathode panel CP, and a chip tube 37 to be sealed after vacuuming is connected to the through-hole 36. The frame 34 is made of ceramic or glass and has a height, for example, of 1.0 mm. An adhesive layer alone may be used in place of the frame 34 in some cases.

One pixel is constituted of the cathode electrode 11, the electron emitting portion 15 formed thereon, and the phosphor layer 31 arranged in the effective field of the anode panel AP so as to face the field emission device. In the effective field, such pixels are arranged on the order of hundreds of thousands to millions.

A relatively negative voltage is applied to the cathode electrode 11 from a cathode-electrode control circuit 40, a relatively positive voltage is applied to the gate electrode 13 from a gate-electrode control circuit 41, and a positive voltage higher than the voltage applied to the gate electrode 13 is applied to the anode electrode 33 from an anode-electrode control circuit 42. When the above display is used for displaying images, for example, a scanning signal is inputted to the cathode electrode 11 from the cathode-electrode control circuit 40, and a video signal is inputted to the gate electrode 13 from the gate-electrode control circuit 41. Alternatively, there may be employed a constitution in which a video signal is inputted to the cathode electrode 11 from the cathode-electrode control circuit 40, and a scanning signal is inputted to the gate electrode 13 from the gate-electrode control circuit 41. Due to an electric field caused when the voltages are applied to the cathode electrode 11 and the gate electrode 13, electrons are emitted from the electron emitting portion 15 on the basis of a quantum tunnel effect and drawn to the anode electrode 33 to collide with the phosphor layer 31. As a result, the phosphor layer 31 is excited to emit light, and an intended image can be obtained.

The processes for producing the field emission device and the display in Example 1 will be explained with reference to FIGS. 2A to 2C, FIG. 3A and 3B and FIGS. 4A and 4B hereinafter. Drawings for explaining the processes for producing the field emission device and the display show one electron emitting portion or its elements alone in an overlap region of the cathode electrode 11 and the gate electrode 13 for simplification of the drawings.

[Step-100]

First, the cathode electrode 11 is formed on the front surface (first surface) of the support member 10 that transmits exposure light. The cathode electrode 11 has the hole 11A in a bottom of which the support member is exposed, is composed of a material that transmits no exposure light, and extends in a first direction (perpendicular to the paper surface of the drawings). That is, the step of "forming a cathode electrode" is carried out. Specifically, a photosensitive silver paste is printed on the front surface (first surface) of the support member 10 made of a substrate that transmits exposure light (ultraviolet rays for exposure), such as a white sheet glass (B-270, supplied by SCHOTT), a blue sheet glass (soda-lime glass) or an alkali-free glass (OA2, supplied by Nippon Denki Glass K.K.), by a screen printing method. Then, the photosensitive silver paste is exposed to exposure light through a photomask, followed by development and firing. In this manner, the cathode electrode 11 having the hole 11A in the bottom of which the support member 10 is exposed and having the form of a stripe can be obtained (see FIG. 2A).

[Step-110]

Then, the insulating layer 12 composed of a photosensitive material that transmits exposure light is formed on the entire surface. That is, the step of "forming an insulating layer composed of a photosensitive material that transmits exposure light" is carried out. Specifically, for example, a positive-type photosensitive glass paste is printed on the entire surface (specifically, on the cathode electrode 11 and the support member 10 and inside the hole 11A) by a screen printing method, followed by drying.

[Step-120]

Figure 2A:
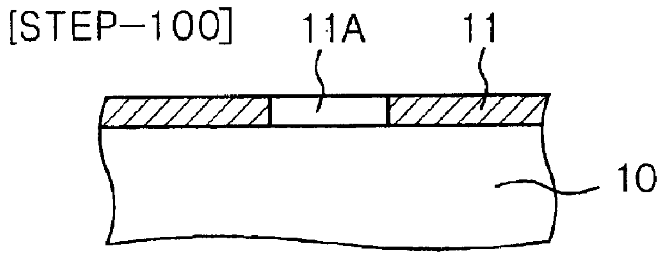
FIGS. 2A to 2C are schematic partial cross-sectional views of a support member, etc., for explaining the process for producing a cold cathode field emission device in Example 1.
Figure 2B:
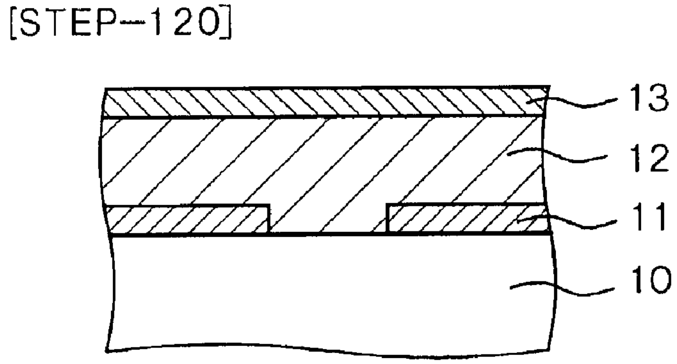

Then, the gate electrode 13 composed of a photosensitive material and extending in a second direction (leftward and rightward on the paper surface of the drawing) different from the first direction is formed on the insulating layer 12 (see FIG. 2B). That is, the step of "forming a gate electrode composed of a photosensitive material" is carried out. Specifically, for example, a positive-type photosensitive silver paste is printed on the insulating layer 12 by a screen printing method, followed by drying, whereby the gate electrode 13 in the form of a stripe can be obtained.

[Step-130]

Figure 2C:
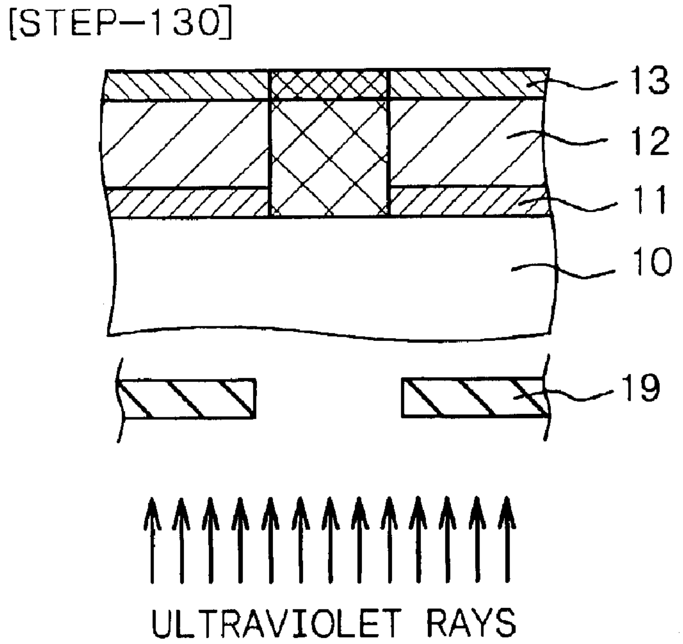

Then, the support member 10 is irradiated with exposure light (specifically, ultraviolet rays) from the back surface (second surface) side of the support member 10 through the hole 11A as a mask for exposure, to expose the insulating layer 12 and the gate electrode 13 in portions above the hole 11A (FIG. 2C). Then, the insulating layer 12 and the gate electrode 13 are developed, and the insulating layer 12 and the gate electrode 13 are removed in the portions above the hole 11A, whereby the opening portion 14 having a larger diameter than the hole 11A is formed through the insulating layer 12 and the gate electrode 13 above the hole 11A, and part of the cathode electrode 11 is exposed in a bottom portion of the opening portion 14 (see FIG. 3A). That is, the step of "forming an opening portion by exposure from the back surface side and exposing the cathode electrode" is carried out. Then, the materials constituting the insulating layer 12 and the gate electrode 13 are fired. The opening portion 14 is formed in a self-aligned manner in regard to the hole 11A.

When the support member 10 is irradiated with the exposure light from the back surface (second surface) side of the support member 10 through the hole 11A as a mask for exposure in [Step-130], it is preferred to provide an exposure-light-shielding member (mask 19) on the back surface (second surface) side of the support member 10, so that the insulating layer 12 and the gate electrode 13 are not exposed to the exposure light in portions that are not to be exposed to the exposure light.

Further, for forming the opening portion 14A having a larger diameter than the hole 11A through the insulating layer 12 and the gate electrode 13 above the hole 11A in [Step-130], there can be employed a method in which the insulating layer 12 and the gate electrode 13 are exposed to the exposure light to excess (that is, a method of over-exposure) and/or a method in which the insulating layer 12 and the gate electrode 13 are developed to excess (that is, a method of over-development).

[Step-140]

Figure 3A:
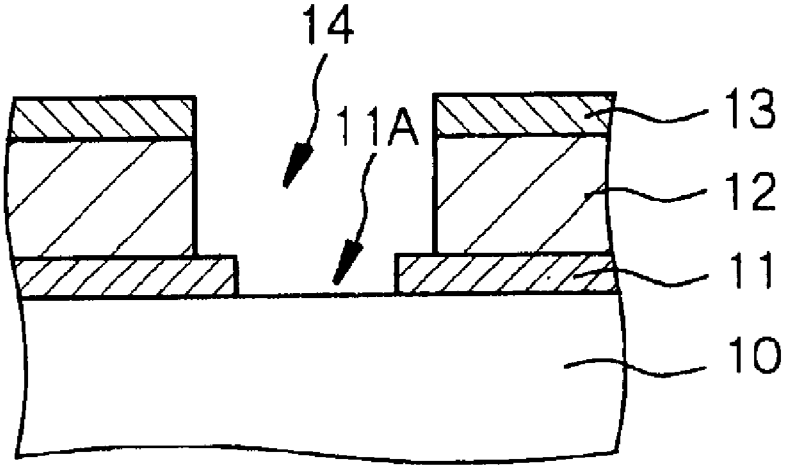
FIGS. 3A and 3B, following
Figure 3B:
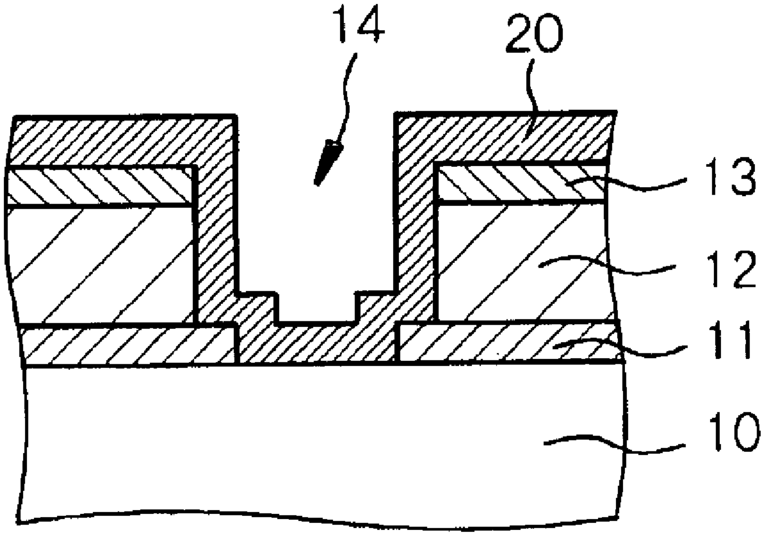

Then, an electron-emitting-portion-forming-layer composed of a photosensitive material is formed at least inside the opening portion (see FIG. 3B). That is, the step of "forming an electron-emitting-portion-forming-layer composed of a photosensitive material" is carried out. Specifically, for example, a negative-type photosensitive electrically conductive paste containing carbon nanotubes is printed on the entire surface including the inside of the opening portion 14 by a screen printing method, whereby an electron-emitting-portion-forming-layer 20 composed of a photosensitive material can be formed. The carbon nanotubes can be produced by an arc discharge method, and have an average diameter of 30 nm and an average length of 1 $\mu$m. Carbon nanotubes in explanations hereinafter are the same as these carbon nanotubes.

[Step-150]

Then, the support member 10 is irradiated with exposure light (specifically, ultraviolet rays) from the back surface (second surface) side of the support member 10 through the hole 11A as a mask for exposure, to expose the electron-emitting-portion-forming-layer 20 to the exposure light in a portion above the hole 11A (see FIG. 4A). When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the electron-emitting-portion-forming-layer 20 is not exposed to the exposure light in a portion that is not to be exposed to the exposure light. Then, the electron-emitting-portion-forming-layer 20 is developed, and the electron-emitting-portion-forming-layer 20 is left in the portion above the hole 11A, whereby the electron emitting portion 15 constituted of the electron-emitting-portion-forming-layer 20 is formed on the cathode electrode 11 and extends to the inside of the hole 11A (see FIG. 4B). That is, the step of "forming an electron emitting portion on the cathode electrode by exposure and development" is carried out. Then, the material constituting the electron-emitting-portion-forming-layer 20 is fired. The electron emitting portion 15 is formed in a self-aligned manner in regard to the hole 11A. That is, the electron emitting portion 15 can be obtained by a back-surface-exposure method, and the electron emitting portion 15 can be formed in the bottom portion of the opening portion 14 made through the gate electrode 13 and the insulating layer 12 in a self-aligned manner in regard to the opening portion 14.

[Step-160]

Then, the display is assembled. Specifically, the anode panel AP and the cathode panel CP are arranged such that the phosphor layer 31 and the field emission device face each other, and the anode panel AP and the cathode panel CP (more specifically, the substrate 30 and the support member 10) are bonded to each other in their circumferential portions through the frame 34. In the bonding, frit glass is applied to bonding portions of the frame 34 and the anode panel AP and to bonding portions of the frame 34 and the cathode panel CP, the anode panel AP, the cathode panel CP and the frame 34 are attached, and the frit glass is dried by preliminary calcining or sintering, followed by primary calcining or sintering at approximately 450° C. for 10 to 30 minutes. Then, a space surrounded by the anode panel AP, the cathode panel CP, the frame 34 and the frit glass is vacuumed through the through-hole 36 and the chip tube 37, and when the space comes to have a pressure of approximately $10^{-4}$ Pa, the chip tube is sealed by thermal fusion. In this manner, the space surrounded by the anode panel AP, the cathode panel CP and the frame 34 can be vacuumed. Then, wiring to necessary external circuits is conducted, to complete the display.

In the production steps of the field emission device, some or all of carbon nanotubes change in surface state (for example, oxygen atoms, oxygen molecules, etc., are adsorbed on the surface), and such carbon nanotubes come to be inactive for field emission in some cases. In such cases, preferably, the electron emitting portion 15 is subjected to plasma treatment in an hydrogen gas atmosphere after [Step-150], whereby the electron emitting portion is activated and the efficiency of electron emission from the electron emitting portion can be further improved. Table 1 shows a condition of the plasma treatment. The plasma treatment can be also applied to various Examples to be explained later.

TABLE 1

| | |
|---|---|
| Gas to be used | $H_2$ = 100 sccm |
| Power source power | 1000 W |
| Voltage to be applied to support member | 50 V |
| Reaction pressure | 0.1 Pa |
| Support member temperature | 300° C. |

EXAMPLE 2

Example 2 is concerned with the process for producing a field emission device according to the first-B aspect of the present invention and the process for producing a display according to the first-B aspect of the present invention, and also concerned with the field emission device and the display according to the first aspect of the present invention. The constitution and structure of the field emission device and display in Example 2 and such constitutions and structures in Examples 3 to 6 to be described later are substantially the same as those in Example 1, so that detailed explanations thereof will be omitted.

The processes for producing the field emission device and the display in Example 2 will be explained with reference to FIGS. 5A and 5B, FIGS. 6A and 6B and FIG. 7 hereinafter.

[Step-200]

First, the step of "forming a cathode electrode", the step of "forming an insulating layer composed of a photosensitive material that transmits exposure light", the step of "forming a gate electrode composed of a photosensitive material" and the step of "forming an opening portion by exposure from the back surface side and exposing the cathode electrode" are carried out in the same manner as in [Step-100] to [Step-130] in Example 1.

[Step-210]

Figure 5A:
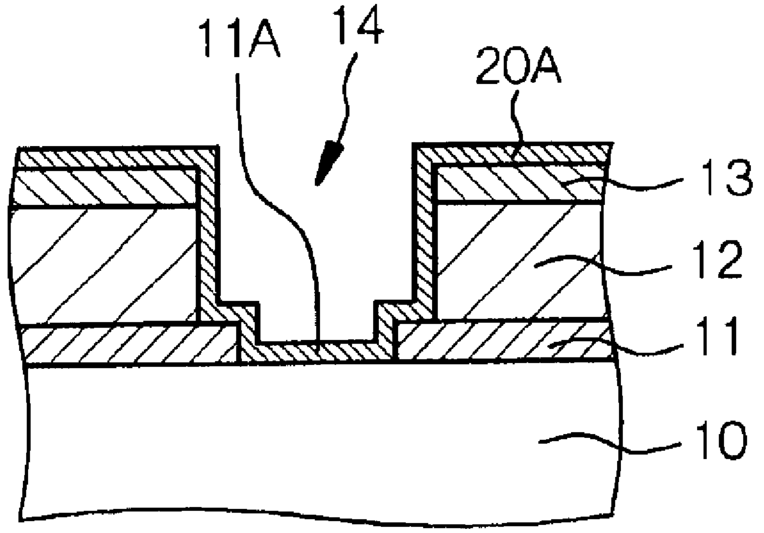
FIGS. 5A and 5B are schematic partial end views of a support member, etc., for explaining the process for producing a cold cathode field emission device in Example 2.

Then, an electron-emitting-portion-forming-layer 20A composed of a non-photosensitive material that transmits exposure light is formed at least inside an opening portion 14 (see FIG. 5A). That is, the step of "forming an electron-emitting-portion-forming-layer composed of a non-photosensitive material" is carried out. Specifically, a mixture of an inorganic binder such as a silver paste or water glass or an organic binder such as an epoxy resin or an acrylic resin, for example, with carbon nanotubes is printed on the entire surface including the inside of the opening portion 14 by a screen printing method, and a printed mixture is dried, whereby the electron-emitting-portion-forming-layer 20A composed of a non-photosensitive material that transmits exposure light can be formed.

[Step-220]

Figure 5B:
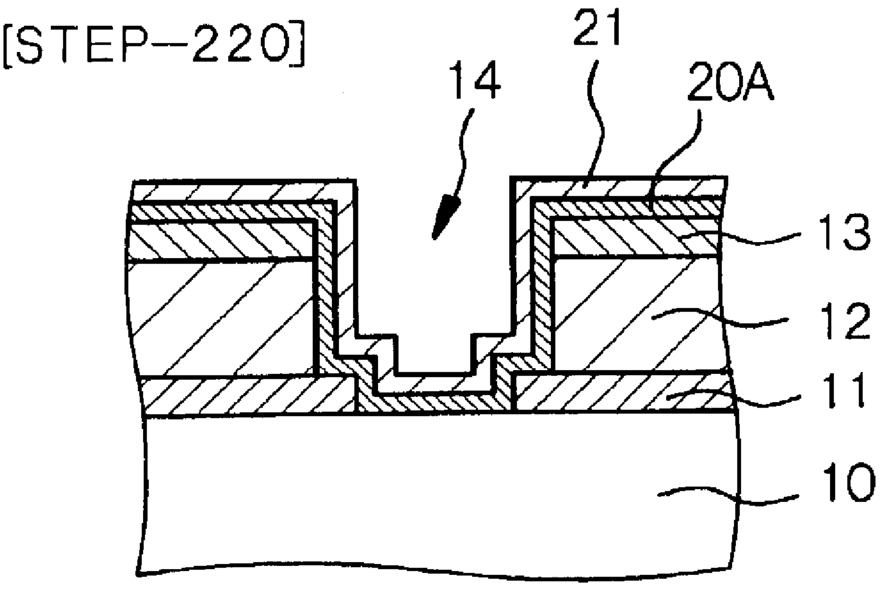

Then, an etching mask layer 21 composed of a negative-type resist material is formed on the entire surface (see FIG. 5B). That is, the step of "forming an etching mask layer" is carried out.

[Step-230]

Figure 6A:
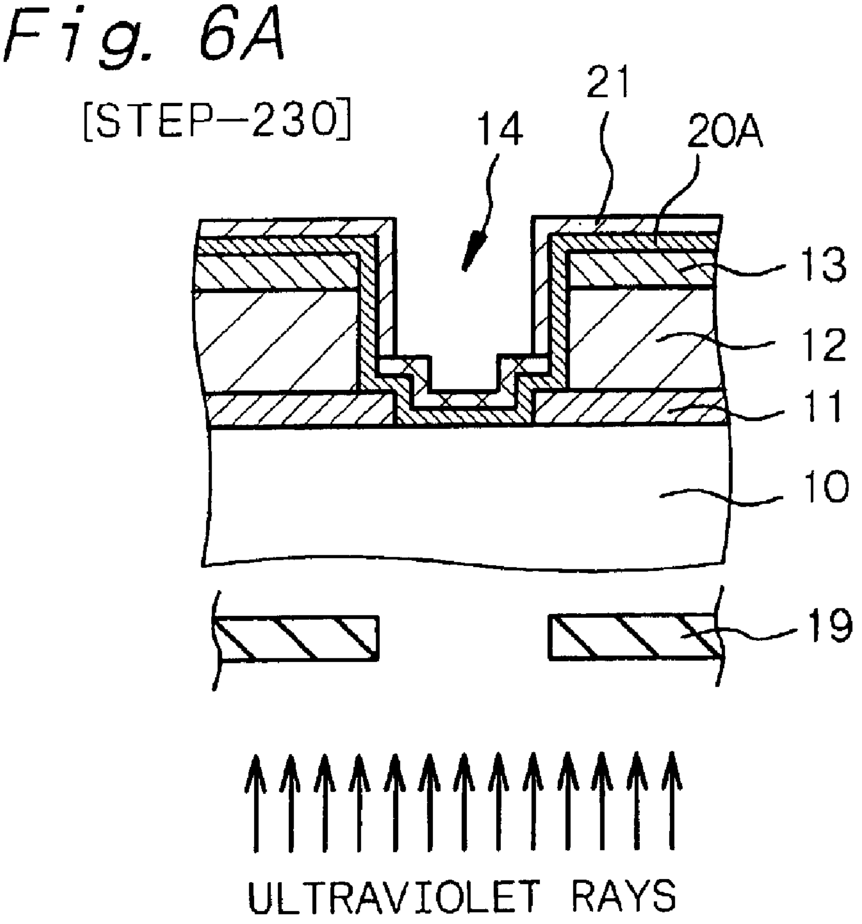
FIGS. 6A and 6B, following
Figure 6B:
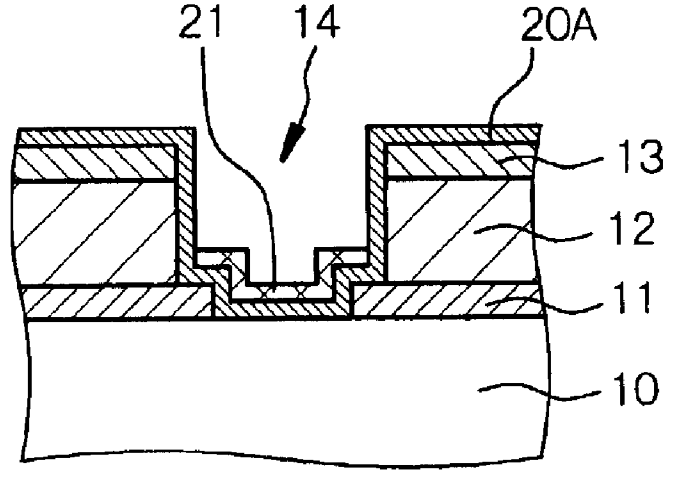

The support member 10 is irradiated with exposure light (specifically, ultraviolet rays) from the back surface (second surface) side of the support member 10 through the hole 11A as a mask for exposure, to expose the etching mask layer 21 to the exposure light in a portion above the hole 11A (see FIG. 6A), and then the etching mask layer 21 is developed, whereby the etching mask layer 21 is left on the electron-emitting-portion-forming-layer 20A positioned in the bottom portion of the opening portion 14 (see FIG. 6B). That is, the step of "exposing and developing the etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the etching mask layer 21 is not exposed to the exposure light in a portion that is not to be exposed to the exposure light.

[Step-240]

Figure 7:
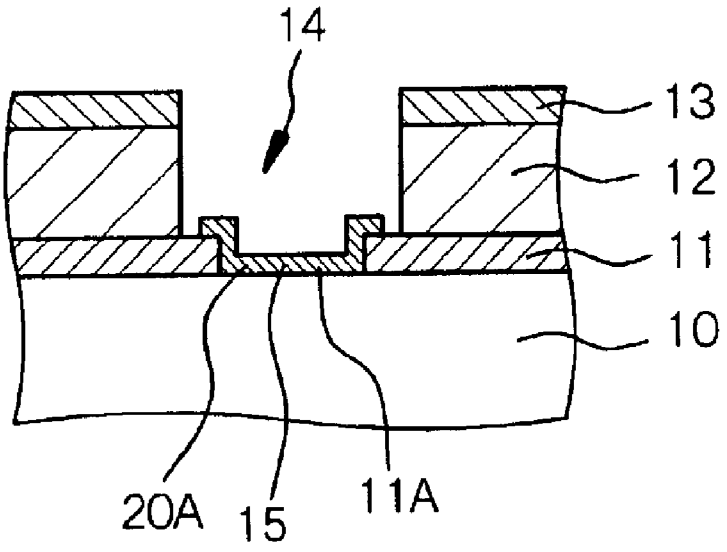
FIG. 7, following

Then, the electron-emitting-portion-forming-layer 20A is etched with the etching mask layer 21, and then, the etching mask layer 21 is removed, to form an electron emitting portion 15 constituted of the electron-emitting-portion-forming-layer 20A on the cathode electrode 11 and inside the hole 11A (see FIG. 7). That is, the step of "forming an electron emitting portion on the cathode electrode on the basis of etching" is carried out. Then, the material constituting the electron-emitting-portion-forming-layer 20A is fired. The electron emitting portion 15 is formed in a self-aligned manner in regard to the hole 11A. That is, the electron emitting portion 15 can be obtained by a back-surface-exposure method, and the electron emitting portion 15 can be formed in the bottom portion of the opening portion 14 formed through the gate electrode 13 and the insulating layer 12, in a self-aligned manner in regard to the opening portion 14.

[Step-250]

Then, the display is assembled in the same manner as in [Step-160] in Example 1.

The electron-emitting-portion-forming-layer 20A can be also formed from a metal compound solution (dispersion) of carbon nanotubes. That is, in [Step-210], a metal compound solution (dispersion), which is composed of an organic acid metal compound and carbon nanotube structures dispersed therein, is applied to the entire surface, for example, by a spray method. Specifically, a metal compound solution (dispersion) shown in Table 2 below is used. In the metal compound solution, an organic tin compound and an organic indium compound are dissolved in an acid (such as hydrochloric acid, nitric acid or sulfuric acid). During the above application, preferably, the support member is heated to 70 to 150° C. beforehand. The atmosphere for the application is an aerial atmosphere. After the application, the support member is heated for 5 to 30 minutes, to fully evaporate butyl acetate. The support member is heated during the application, so that the drying of the application solution starts before the carbon nanotubes undergo self-leveling in directions closer to the horizontal direction in which the cathode electrode surface lies. As a result, the carbon nanotubes can be arranged on the cathode electrode surface in a state where the carbon nanotubes are not horizontally lying. That is, the carbon nanotubes can be oriented in a state in which top ends of the carbon nanotubes face the anode electrode, in other words, in the direction in which the carbon nanotubes come close to the normal of the support member. A metal compound solution (dispersion) having a composition shown in Table 2 may be prepared in advance, or a metal compound solution free of the carbon nanotubes may be prepared in advance and mixed with the carbon nanotubes immediately before the application. For improving the dispersibility of the carbon nanotubes, the metal compound solution may be supersonically treated when prepared.

TABLE 2

| | |
|---|---|
| Organic tin compound and organic indium compound | 0.1–10 parts by weight |
| Dispersing agent (sodium dodecylsulfate) | 0.1–5 parts by weight |
| Carbon nanotubes | 0.1–20 parts by weight |
| Butyl acetate | Balance |

As an organic acid metal compound solution, a solution of an organic tin compound in an acid gives tin oxide as a matrix, a solution of an organic indium compound in an acid gives indium oxide as a matrix, a solution of an organic zinc compound in an acid gives zinc oxide as a matrix, a solution of an organic antimony compound in an acid gives antimony oxide as a matrix, and a solution of an organic antimony compound and an organic tin compound in an acid gives antimony-tin oxide as a matrix. As an organometal compound solution, an organic tin compound gives tin oxide as a matrix, an organic indium compound gives indium oxide as a matrix, an organic zinc compound gives zinc oxide as a matrix, an organic antimony compound gives antimony oxide as a matrix, and an organic antimony compound and an organic tin compound give antimony-tin oxide as a matrix. Alternatively, a solution of metal chlorides (for example, tin chloride and indium chloride) may be used.

After the electron emitting portion 15 is obtained in [Step-240], the metal compound obtained from the organic acid metal compound is fired, whereby the electron emitting portion 15 can be obtained, in which the carbon nanotubes are fixed on the surfaces of the cathode electrode 11 and the support member 10 with the matrix (specifically, metal oxide, more specifically, ITO) containing metal atoms (specifically, In and Sn) derived from the organic acid metal compound. The firing can be carried out in an aerial atmosphere under a condition of 350° C. and 20 minutes. The thus-obtained matrix has a volume resistivity of approximately $5\times10^{-7}$ Ω·m. When the organic acid metal compound is used as a starting material, a matrix made of ITO can be obtained at a firing temperature of as low as 350° C. The organic acid metal compound solution may be replaced with the organic metal compound solution. When a solution of metal chlorides (for example, tin chloride and indium chloride) is used, a matrix made of ITO is formed while tin chloride and indium chloride are oxidized.

After [Step-240] is carried out, desirably, the matrix is etched with hydrochloric acid having a temperature of 10 to 60° C. for 1 to 30 minutes, to remove an unnecessary portion of the electron-emitting-portion-forming-layer 20A. Further, when carbon nanotubes still remain in a region other than the desired region, desirably, the carbon nanotubes are etched by oxygen plasma etching treatment under a condition shown in the following Table 3. The bias power may be 0 W, i.e., direct current, while it is desirable to apply bias power. Further, the support member may be heated, for example, up to approximately 80° C.

TABLE 3

| | |
|---|---|
| Apparatus | RIE apparatus |
| Gas to be introduced | Gas containing oxygen |
| Plasma-exciting power | 500 W |
| Bias power | 0–150 W |
| Treatment time period | at least 10 seconds |

Alternatively, the carbon nanotubes may be etched by wet-etching treatment under a condition shown in Table 4.

TABLE 4

| | |
|---|---|
| Solution to be used | $KMnO_4$ |
| Temperature | 20–120° C. |
| Treatment time period | 10 seconds–20 minutes |

EXAMPLE 3

Example 3 is concerned with the process for producing a field emission device according to the first-C aspect of the present invention and the process for producing a display according to the first-C aspect of the present invention. Further, it is concerned with the field emission device and the display according to the first aspect of the present invention.

The processes for producing the field emission device and the display in Example 3 will be explained with reference to FIGS. 8A and 8B and FIGS. 9A and 9B.

[Step-300]

First, the step of "forming a cathode electrode" is carried out in the same manner as in [Step-100] in Example 1.

[Step-310]

Then, an insulating layer 12A composed of a non-photosensitive material that transmits exposure light is formed on the entire surface. That is, the step of "forming an insulating layer composed of a non-photosensitive material that transmits exposure light" is carried out. The insulating layer 12A can be made, for example, from an $SiO_2$-containing material, and can be formed, for example, by a screen printing method.

[Step-320]

Then, a gate electrode 13 A composed of a non-photosensitive material that transmits exposure light and extending in a second direction different from the first direction is formed on the insulating layer 12A. That is, the step of "forming a gate electrode composed of a non-photosensitive material" is carried out. Specifically, for example, an electrically conductive layer composed of ITO is formed on the entire surface by a sputtering method, and then patterned, whereby the gate electrode 13A in the form of a stripe can be obtained.

[Step-330]

Figure 8A:
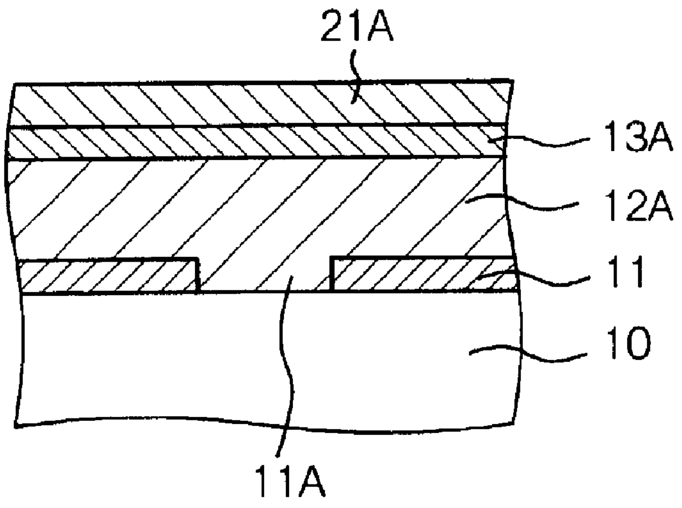
FIGS. 8A and 8B are schematic partial end views of a support member, etc., for explaining the process for producing a cold cathode field emission device in Example 3.

Then, an etching mask layer 21A composed of a positive-type resist material is formed on the gate electrode 13A and the insulating layer 12A (see FIG. 8A). That is, the step of "forming an etching mask layer on the gate electrode and the insulating layer" is carried out.

[Step-340]

Figure 8B:
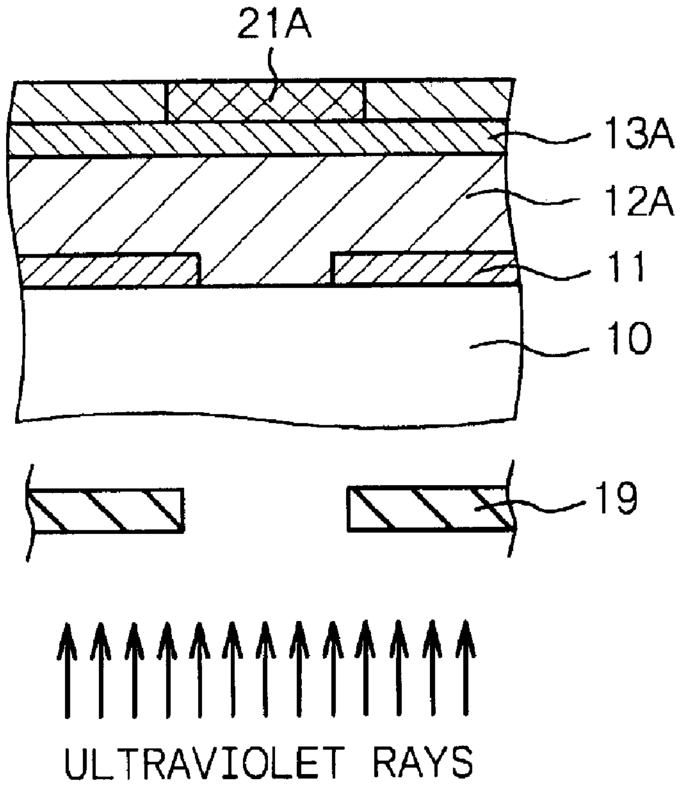

Then, the support member 10 is irradiated with exposure light from the back surface (second surface) side of the support member 10 through the hole 11A as a mask for exposure, to expose the etching mask layer 21A to the exposure light (see FIG. 8B). Then, the etching mask layer 21A is developed to form a mask-layer-opening 22A through the etching mask layer 21A in a portion above the hole 11A (see FIG. 9A). That is, the step of "forming a mask-layer-opening through the etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the etching mask layer 21A is not exposed to the exposure light in a portion that is not to be exposed to the exposure light.

[Step-350]

Figure 9A:
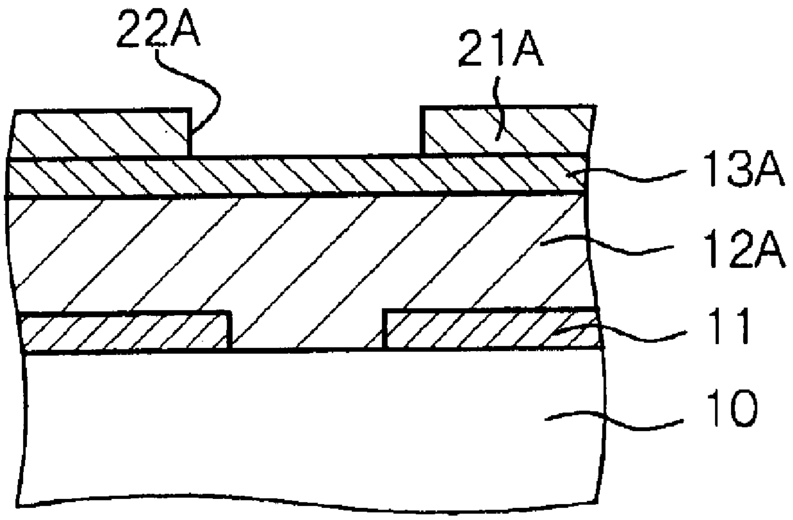
FIGS. 9A and 9B, following
Figure 9B:
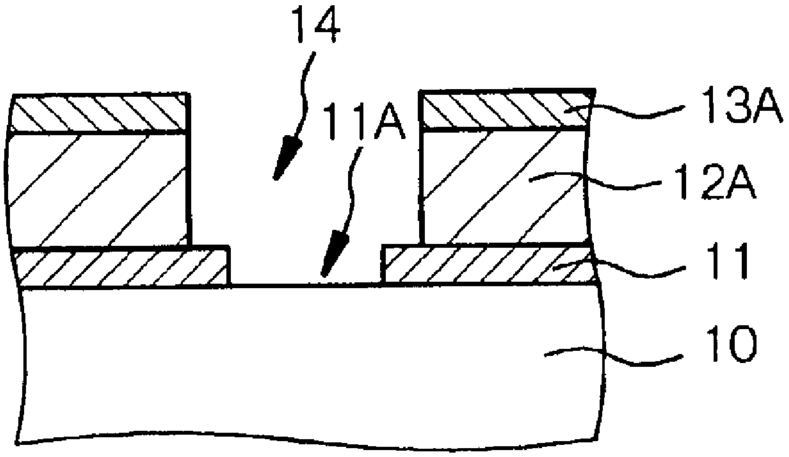

Then, the gate electrode 13A and the insulating layer 12A below the mask-layer-opening 22A are etched with the etching mask layer 21A, and the etching mask layer 21A is removed, whereby an opening portion 14 having a larger diameter than the hole 11A is formed through the insulating layer 12A and the gate electrode 13A above the hole 11A, and part of the cathode electrode 11 is exposed in a bottom portion of the opening portion 14 (see FIG. 9B). The above opening portion 14 can be formed by over-etching of the insulating layer 12A and the gate electrode 13A.

[Step-360]

Then, [Step-140] of Example 1 (the step of "forming an electron-emitting-portion-forming-layer composed of a photosensitive material" and [Step-150] of Example 1 (the step of "forming an electron emitting portion on the cathode electrode by exposure and development") are carried out.

[Step-370]

Then, the display is assembled in the same manner as in [Step-160] in Example 1.

EXAMPLE 4

Example 4 is concerned with the process for producing a field emission device according to the first-D aspect of the present invention and the process for producing a display according to the first-D aspect of the present invention, and it is further concerned with the field emission device and the display according to the first aspect of the present invention.

The processes for producing the field emission device and the display in Example 4 will be explained with reference to FIGS. 10A and 10B, FIGS. 11A and 11B, FIGS. 12A and 12B, FIGS. 13A and 13B and FIG. 14 hereinafter.

[Step-400]

First, [Step-100] of Example 1 (the step of "forming a cathode electrode"), [Step-310] of Example 3 (the step of "forming an insulating layer composed of a non-photosensitive material that transmits exposure light") and [Step-320] of Example 3 (the step of "forming a gate electrode composed of a non-photosensitive material") are carried out.

[Step-140]

Figure 10A:
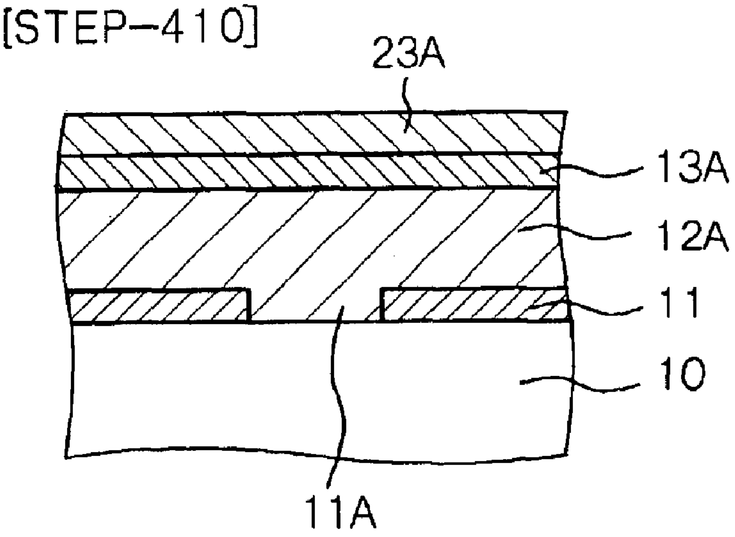
FIGS. 10A and 10B are schematic partial end views of a support member, etc., for explaining the process for producing a cold cathode field emission device in Example 4.

Then, a first etching mask layer 23A composed of a positive-type resist material is formed on the gate electrode 13A and the insulating layer 12A (see FIG. 10A). That is, the step of "forming a first etching mask layer on the gate electrode and the insulating layer" is carried out.

[Step-420]

Figure 10B:
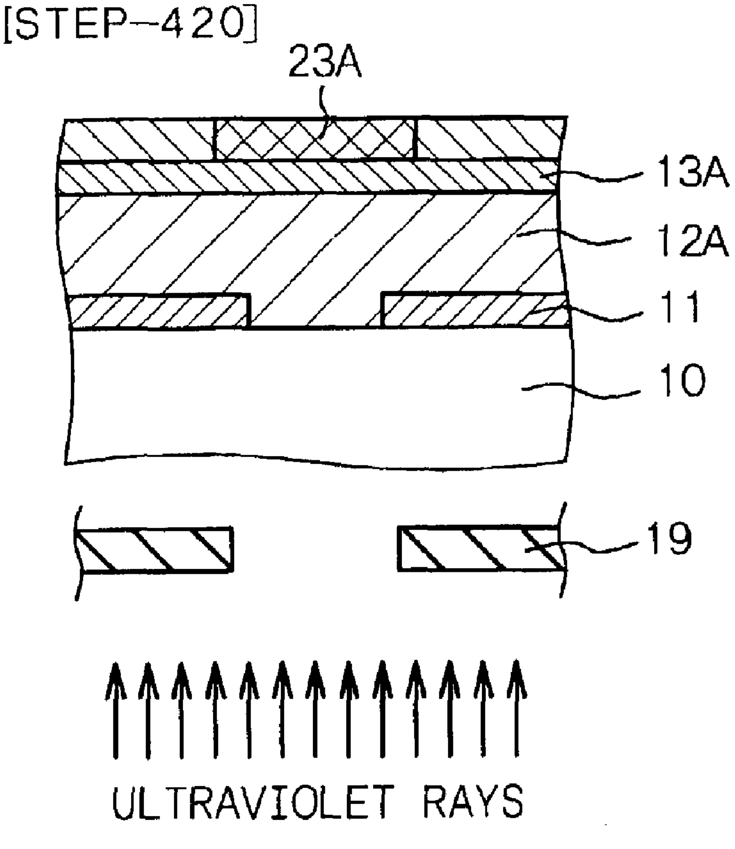

Then, the support member 10 is irradiated with exposure light (specifically, ultraviolet rays) from the back surface (second surface) side of the support member 10 through the hole 11A as a mask for exposure, to expose the first etching mask layer 23A to the exposure light (see FIG. 10B). Then, the first etching mask layer 23A is developed to form a mask-layer-opening 24A through the first etching mask layer 23A in a portion above the hole 11A. That is, the step of "forming a mask-layer-opening through the first etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the first etching mask layer 23A is not exposed to the exposure light in a portion that is not to be exposed to the exposure light.

[Step-430]

Figure 11A:
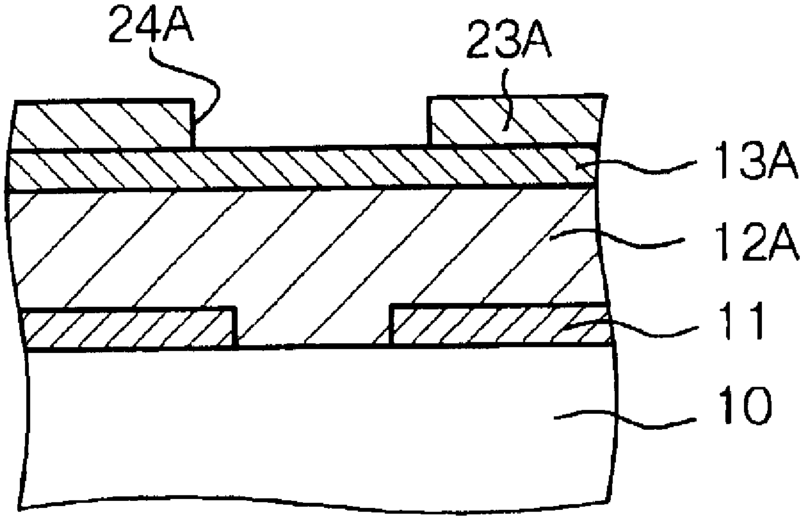
FIGS. 11A and 11B, following
Figure 11B:
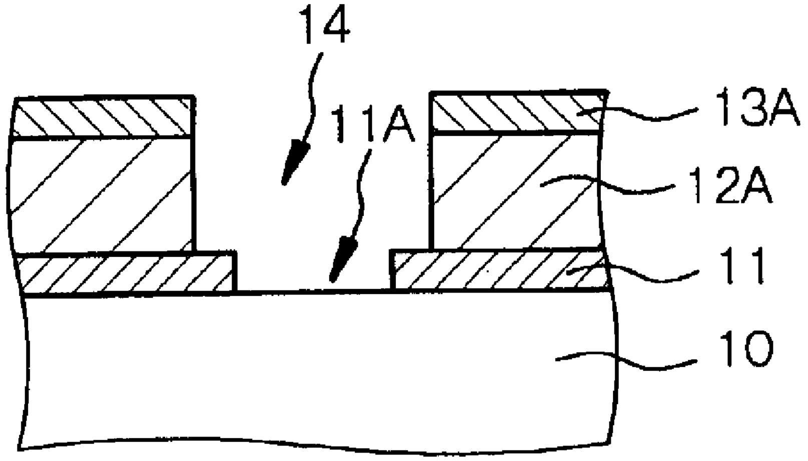

Then, the gate electrode 13A and the insulating layer 12A below the mask-layer-opening 24A are etched with the first etching mask layer 23A, and then, the first etching mask layer 23A is removed, whereby an opening portion 14 having a larger diameter than the hole 11A is formed through the insulating layer 12A and the gate electrode 13A above the hole 11A, and part of the cathode electrode 11 is exposed in a bottom portion of the opening portion 14 (see FIG. 11B). The above opening portion 14 can be formed by over-etching of the insulating layer 12A and the gate electrode 13A.

[Step-440]

Figure 12A:
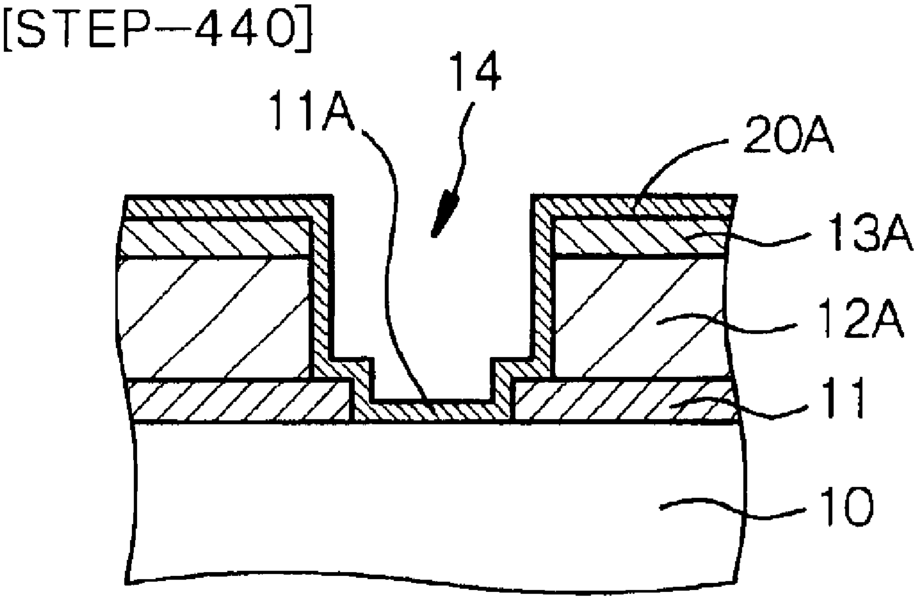
FIGS. 12A and 12B, following

Then, the step of "forming an electron-emitting-portion-forming-layer composed of a non-photosensitive material" is carried out in the same manner as in [Step-210] of Example 2 or the variant thereof (see FIG. 12A).

[Step-450]

Figure 12B:
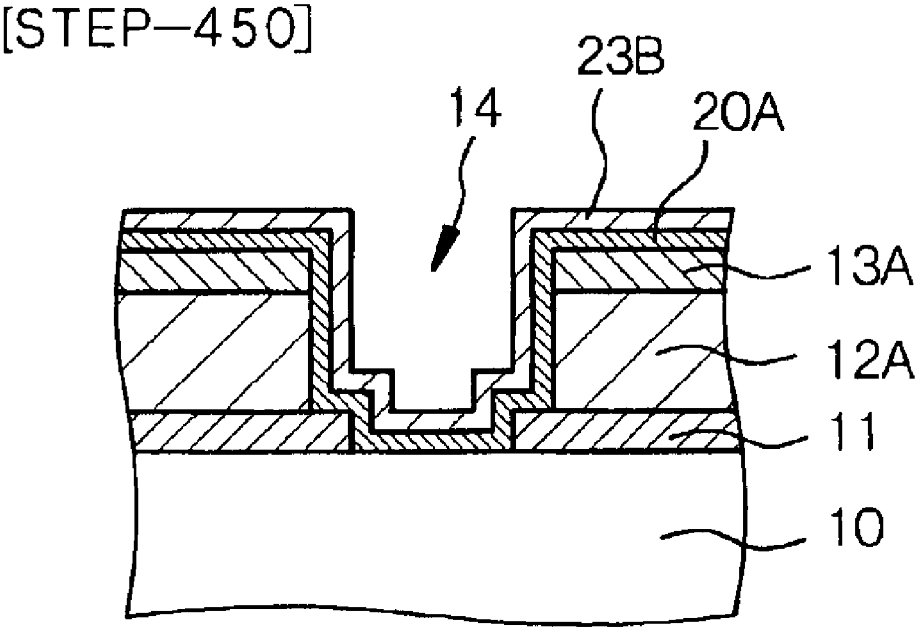

Then, a second etching mask layer 23B composed of a negative-type resist material is formed on the entire surface (see FIG. 12B). That is, the step of "forming a second etching mask layer" is carried out.

[Step-460]

Figure 13A:
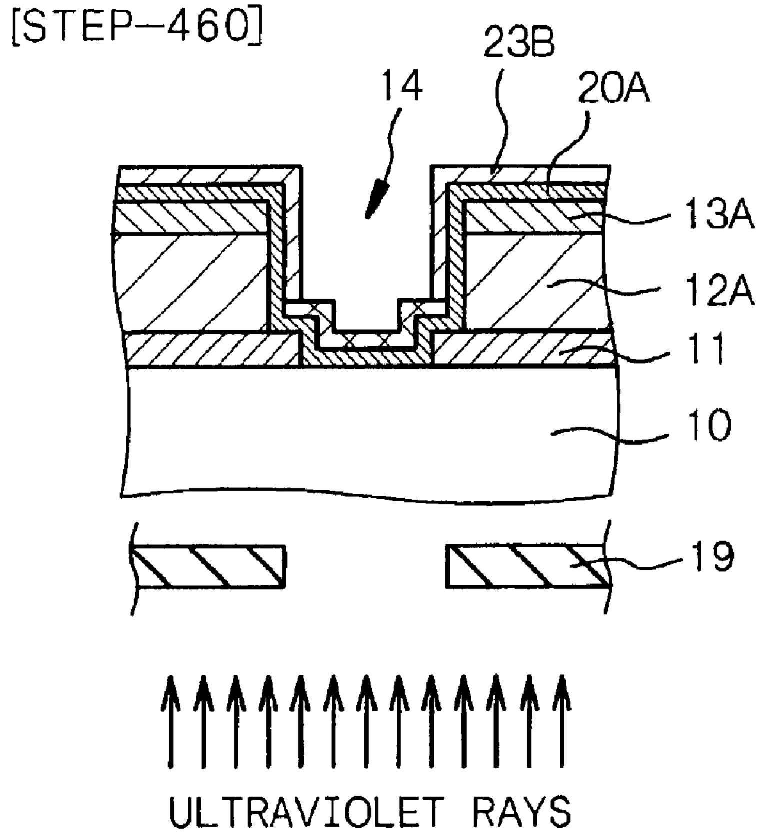
FIGS. 13A and 13B, following
Figure 13B:
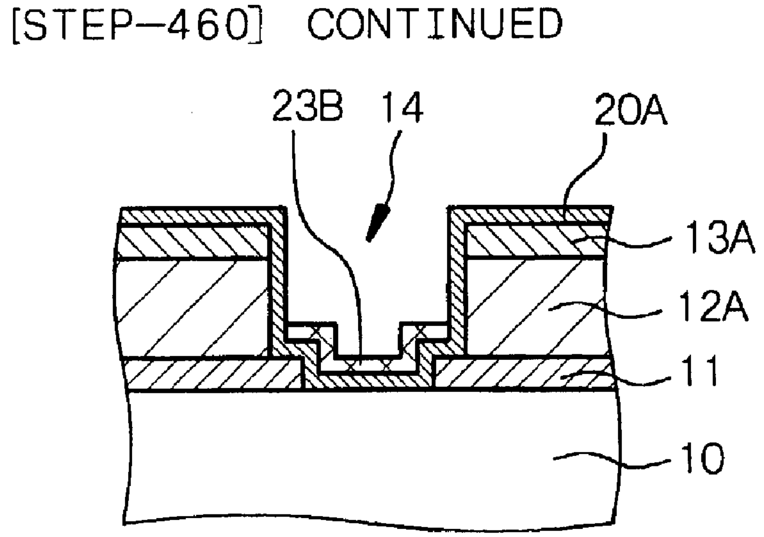
Figure 14:
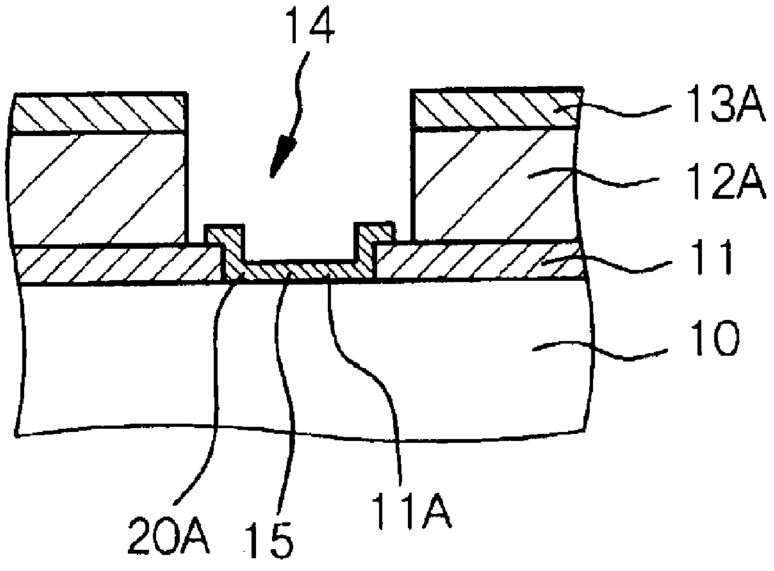
FIG. 14, following

Then, the support member 10 is irradiated with exposure light (specifically, ultraviolet rays) from the back surface (second surface) side of the support member 10 through the hole 11A as a mask for exposure, to expose the second etching mask layer 23B above the hole 11A to the exposure light (see FIG. 13A). Then, the second etching mask layer 23B is developed, whereby the second etching mask layer 23B is left on the electron-emitting-portion-forming-layer 20A positioned in the bottom portion of the opening portion 14 (see FIG. 13B). That is, the step of "exposing and developing the second etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the second etching mask layer 23B is not exposed to the exposure light in a portion that is not to be exposed to the exposure light.

[Step-470]

Then, the electron-emitting-portion-forming-layer 20A is etched with the second etching mask layer 23B in the same manner as in [Step-240] of Example 2 or the variant thereof. Then, the second etching mask layer 23B is removed, and an electron emitting portion 15 constituted of the electron-emitting-portion-forming-layer 20A is formed on the cathode electrode 11 and inside the hole 11A (see FIG. 14).

[Step-480]

Then, the display is assembled in the same manner as in [Step-160] of Example 1.

EXAMPLE 5

Example 5 is concerned with the process for producing a field emission device according to the second-A aspect of the present invention and the process for producing a display according to the second-A aspect of the present invention, and it is further concerned with the field emission device according to the first aspect of the present invention.

The processes for producing the field emission device and the display in Example 5 will be explained with reference to FIGS. 15A and 15B and FIG. 16 hereinafter.

[Step-500]

First, the step of "forming a cathode electrode" is carried out in the same manner as in [Step-100] of Example 1. The cathode electrode 11 extends in a first direction (perpendicular to the paper surface of the drawing).

[Step-510]

Then, an insulating layer 12B composed of a photosensitive material is formed on the entire surface. That is, the step of "forming an insulating layer composed of a photosensitive material" is carried out. Specifically, for example, a negative-type photosensitive glass paste is printed on the entire surface (specifically, on the surfaces of the cathode electrode 11 and the support member 10 including the inside of the hole 11A) by a screen printing method, followed by drying.

[Step-520]

Figure 15A:
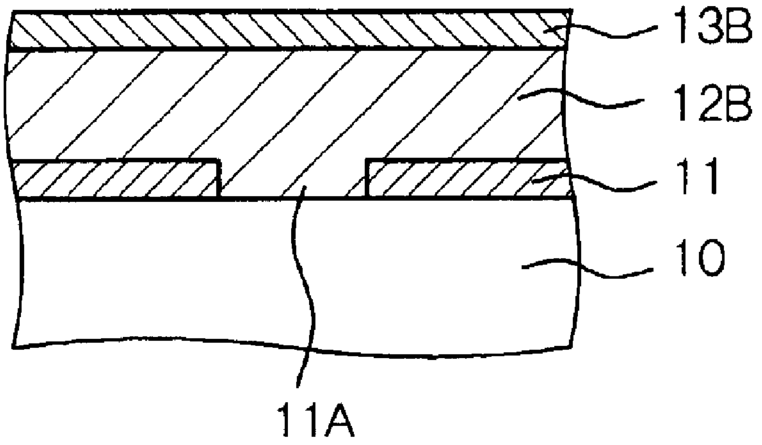
FIGS. 15A and 15B are schematic partial end views of a support member, etc., for explaining the process for producing a cold cathode field emission device in Example 5.

Then, a gate electrode 13B composed of a photosensitive material that transmits exposure light and extending in a second direction different from the first direction is formed on the insulating layer 12B (see FIG. 15A). That is, the step of "forming a gate electrode composed of a photosensitive material that transmits exposure light" is carried out. Specifically, for example, a negative-type photosensitive silver paste is printed on the insulating layer 12B by a screen printing method, followed by drying, whereby a gate electrode 13B in the form of a strip can be obtained. The silver paste transmits exposure light at an exposure stage. The gate electrode 13B in the form of a stripe extends in a second direction (rightward and leftward on the paper surface of the drawing) different from the first direction.

[Step-530]

Figure 15B:
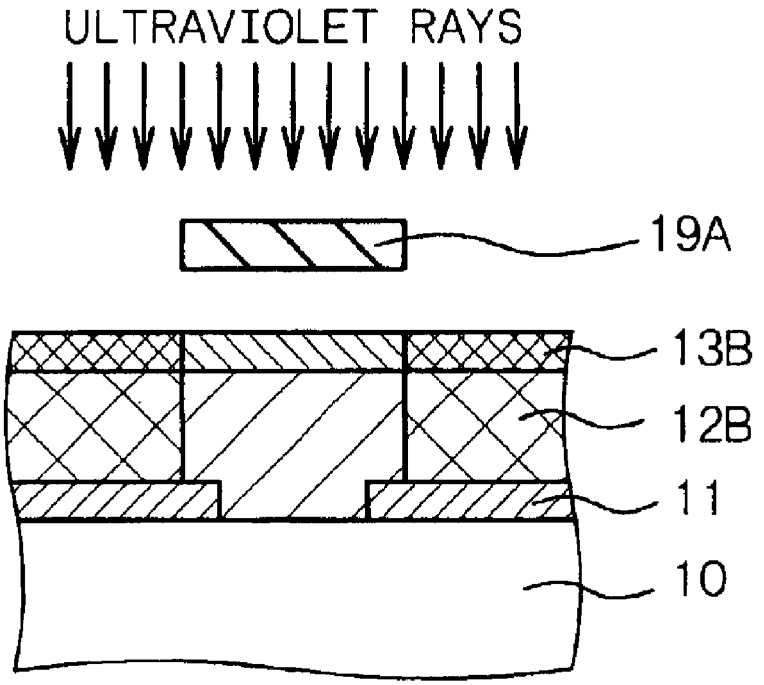

Then, the support member 10 is irradiated with exposure light (specifically, ultraviolet rays) from the front surface (first surface) side of the support member 10 to expose the gate electrode 13B and the insulating layer 12B to the exposure light (see FIG. 15B). Then, the gate electrode 13B and the insulating layer 12B are developed, whereby an opening portion 14, having a larger diameter than the hole 11A, is formed through the gate electrode 13B and the insulating layer 12B above the hole 11A, and part of the cathode electrode 11 is exposed in a bottom portion of the opening portion 14 (see FIG. 16). That is, the step of "forming an opening portion by exposure from the front surface side" is carried out. For the exposure of the gate electrode 13B and the insulating layer 12B to the exposure light, it is preferred to provide an exposure-light-shielding member (mask 19A) having a larger exposure-light-shielding portion than the hole 11A on the front surface (first surface) side of the support member 10.

[Step-540]

Then, [Step-140] of Example 1 (the step of "forming an electron-emitting-portion-forming-layer composed of a photosensitive material") and [Step-150] of Example 1 (the step of "forming an electron emitting portion on the cathode electrode by exposure and development") are carried out.

[Step-550]

Then, the display is assembled in the same manner as in [Step-160] of Example 1.

The materials for constituting the insulating layer and the gate electrode may be selected from positive-type materials. In this case, in [Step-530], portions to be exposed to the exposure light in the insulating layer and the gate electrode are portions where the opening portion is to be formed.

EXAMPLE 6

Example 6 is concerned with the process for producing a field emission device according to the second-B aspect of the present invention and the process for producing a display according to the second-B aspect of the present invention, and it is further concerned with the field emission device and the display according to the first aspect of the present invention.

The processes for producing the field emission device and the display in Example 6 will be explained with reference to FIGS. 15A and 15B, FIG. 16, FIGS. 5A and 5B, FIGS. 6A and 6B and FIG. 7 hereinafter.

[Step-600]

First, the step of "forming a cathode electrode" is carried out in the same manner as in [Step-100] of Example 1.

[Step-610]

Figure 16:
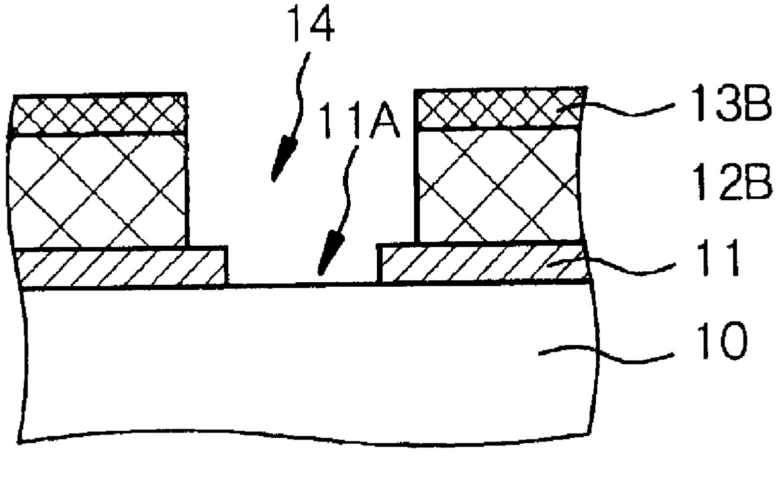
FIG. 16, following

The step of "forming an insulating layer composed of a photosensitive material", the step of "forming a gate electrode composed of a photosensitive material that transmits exposure light" and the step of "forming an opening portion by exposure from the front surface side" are carried out in the same manner as in [Step-50], [Step-520] and [Step-530] of Example 5 (see FIGS. 15A and 15B and FIG. 16).

[Step-620]

Then, the step of "forming an electron-emitting-portion-forming-layer composed of a non-photosensitive material" is carried out in the same manner as in [Step-210] of Example 2 or the variant thereof (see FIG. 5A). Further, the step of "forming an etching mask layer" is carried out in the same manner as in [Step-220] of Example 2 (see FIG. 5B).

[Step-630]

Then, the step of "exposing and developing the etching mask layer" is carried out in the same manner as in [Step-230] of Example 2 (see FIGS. 6A and 6B). Then, the step of "forming an electron emitting portion on the cathode electrode on the basis of etching" is carried out in the same manner as in [Step-240] of Example 2 of the variant thereof (see FIG. 7).

[Step-640]

Then, the display is assembled in the same manner as in [Step-160] of Example 1.

EXAMPLE 7

Example 7 is concerned with the field emission device according to the second aspect of the present invention, the process for producing a field emission device according to the third-A aspect of the present invention, the display according to the second aspect of the present invention and the process for producing a display according to the third-A aspect of the present invention.

In Example 7 or Examples 8 to 12 to be described later, a light-transmittable layer 25 composed of an electrically conductive material or resistance material is formed at least inside a hole and that an electron emitting portion 15 is formed on the light-transmittable layer 25. Example 7 or Examples 8 to 12 are different from Example 1 or Examples 2 to 6in the above points and are the same as Example 1 or Examples 2 to 6 in any other points.

The display of Example 7 has the same schematic partial end view as that of the display of Example 1 shown in FIG. 1 except that the light-transmittable layer is formed on the cathode electrode 11, so that its showing and detailed explanation will be omitted. Further, Example 7 uses an anode panel AP that is structurally the same as that in Example 1, so that its detailed explanation will be omitted. Further, the schematic partial exploded perspective view of the cathode panel CP and the anode panel AP are substantially the same as that shown in FIG. 33.

The field emission device of Example 7 comprises;

(a) a cathode electrode 11 formed on a support member 10 and extending in a first direction, (b) an insulating layer 12 formed on the support member 10 and the cathode electrode 11, (c) a gate electrode 13 formed on the insulating layer 12 and extending in a second direction different from the first direction, (d) an opening portion 14 made through the gate electrode 13 and the insulating layer 12 (a first opening portion 14A formed through the gate electrode 13 and a second opening portion 14B formed through the insulating layer 12), and (e) an electron emitting portion 15, wherein electrons are emitted from the electron emitting portion 15 exposed in a bottom portion of the opening portion 14.

And, a hole 11A reaching the support member 10 is formed through the cathode electrode 11 in a portion positioned in a bottom portion of the opening portion 14. A light-transmittable layer 25 is formed at least inside the hole 11A, and the electron emitting portion 15 is formed on the light-transmittable layer 25 positioned in the bottom portion of the opening portion 14. The projection image of the cathode electrode in the form of a strip and the projection image of the gate electrode 13 in the form of a stripe cross each other at right angles.

The processes for producing the field emission device and the display in Example 7 will be explained with reference to FIGS. 17A to 17C, FIGS. 18A and 18B and FIGS. 19A and 19B hereinafter.

[Step-700]

First, the cathode electrode 11 is formed on the front surface (first surface) of the support member 10 that transmits exposure light, in the same manner as in [Step-100] of Example 1. The cathode electrode 11 has the hole 11A in a bottom of which the support member 10 is exposed, is composed of a material that does not transmit exposure light, and extends in a first direction (perpendicular to the paper surface of the drawing). That is, the step of "forming a cathode electrode" is carried out. Then, a light-transmittable layer composed of an electrically conductive material or resistance material that transmits exposure light is formed at least inside the hole 11A (see FIG. 17A). That is, the step of "forming a light-transmittable layer" is carried out. Specifically, for example, a light-transmittable layer 25 composed of amorphous silicon (resistance material) is formed on the entire surface by a CVD method and patterned by lithography and an etching technique, whereby the light-transmittable layer 25 is formed on the entire surface of the cathode electrode 11. Alternatively, a light-transmittable layer 25 composed of ITO (electrically conductive material) is formed on the entire surface by a sputtering method and patterned by lithography and an etching technique, whereby the light-transmittable layer 25 is formed on the entire surface of the cathode electrode 11.

[Step-710]

Then, the insulating layer 12 composed of a photosensitive material that transmits exposure light is formed on the entire surface in the same manner as in [Step-110] of Example 1. That is, the step of "forming an insulating layer composed of a photosensitive material that transmits exposure light" is carried out.

[Step-720]

Figure 17A:
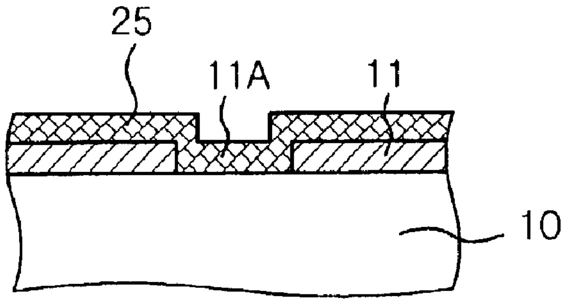
FIGS. 17A to 17C are schematic partial cross-sectional views of a support member, etc., for explaining the process for producing a cold cathode field emission device in Example 7.
Figure 17B:
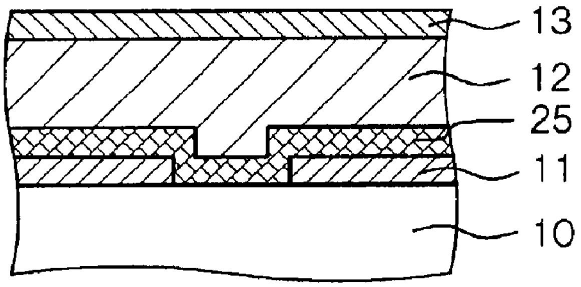

Then, the gate electrode 13 composed of a photosensitive material and extending in a second direction (leftward and rightward on the paper surface of the drawing) different from the first direction is formed on the insulating layer 12 in the same manner as in [Step-120] of Example 1 (see FIG. 17B). That is, the step of "forming a gate electrode composed of a photosensitive material" is carried out.

[Step-730]

Figure 17C:
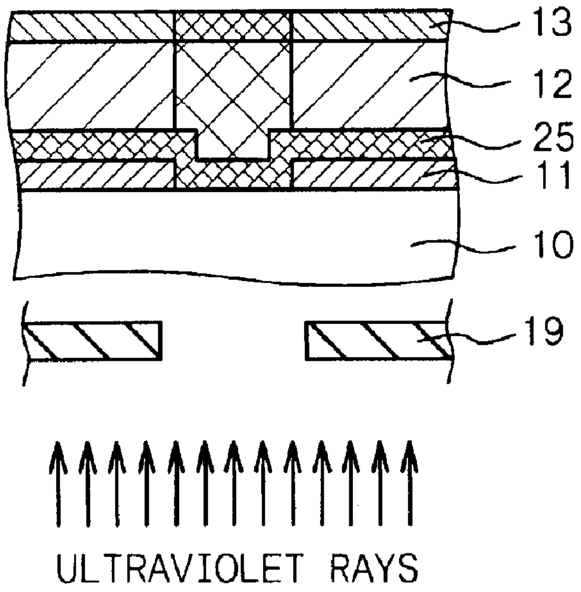

The support member 10 is irradiated with exposure light (specifically, ultraviolet rays) from the back surface (second surface) side of the support member 10 through the hole 11A as a mask for exposure, to expose the insulating layer 12 and the gate electrode 13 in portions above the hole 11A (see FIG. 17C). Then, the insulating layer 12 and the gate electrode 13 are developed, and the insulating layer 12 and the gate electrode 13 are removed in the portions above the hole 11A, whereby the opening portion 14 is formed through the insulating layer 12 and the gate electrode 13 above the hole 11A, and the light-transmittable layer 25 is exposed in a bottom portion of the opening portion 14 (see FIG. 18A). That is, the step of "forming an opening portion by exposure from the back surface side and exposing the light-transmittable layer" is carried out. Then, the materials constituting the insulating layer 12 and the gate electrode 13 are fired. The opening portion 14 is formed in a self-aligned manner in regard to the hole 11A.

When the support member 10 is irradiated with the exposure light from the back surface (second surface) side of the support member 10 through the hole 11A as a mask for exposure in [Step-730], it is preferred to provide an exposure-light-shielding member (mask 19) on the back surface (second surface) side of the support member 10, so that the insulating layer 12 and the gate electrode 13 are not exposed to the exposure light in portions that are not to be exposed to the exposure light.

Further, it is desirable to form the opening portion 14 having a larger diameter than the hole 11A through the insulating layer 12 and the gate electrode 13 above the hole 11A in [Step-730]. For this purpose, there can be employed a method in which the insulating layer 12 and the gate electrode 13 are exposed to the exposure light to excess (that is, a method of over-exposure) and/or a method in which the insulating layer 12 and the gate electrode 13 are developed to excess (that is, a method of over-development).

[Step-740]

Figure 18A:
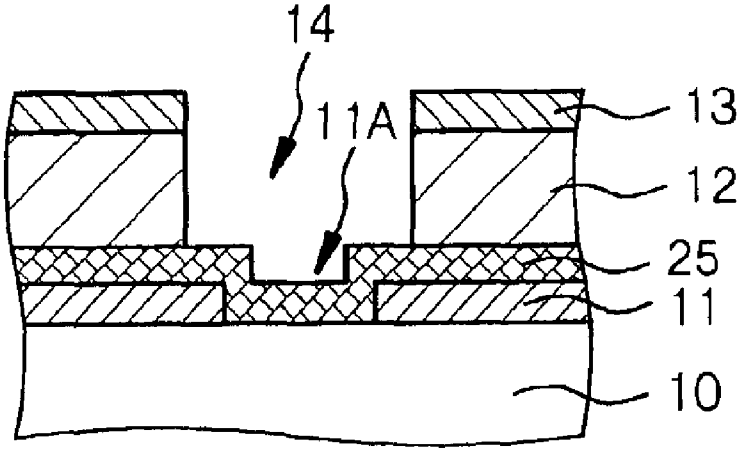
FIGS. 18A and 18B, following
Figure 18B:
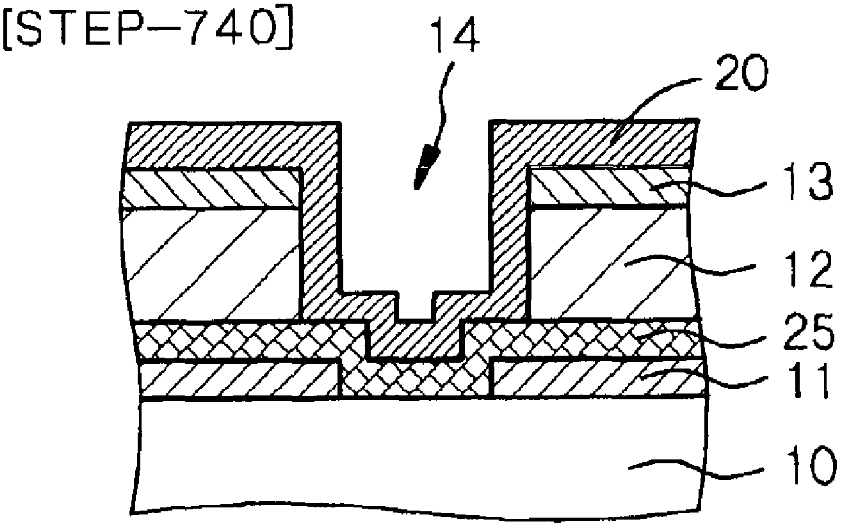

Then, an electron-emitting-portion-forming-layer 20 composed of a photosensitive material is formed at least inside the opening portion 14 in the same manner as in [Step-140] of Example 1 (see FIG. 18B). That is, the step of "forming an electron-emitting-portion-forming-layer composed of a photosensitive material" is carried out.

[Step-750]

Figure 19A:
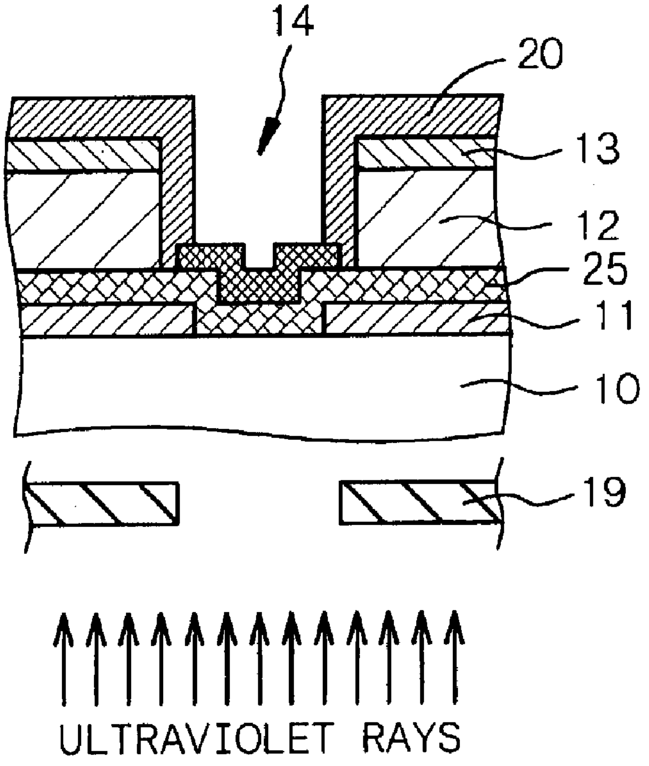
FIGS. 19A and 19B, following
Figure 19B:
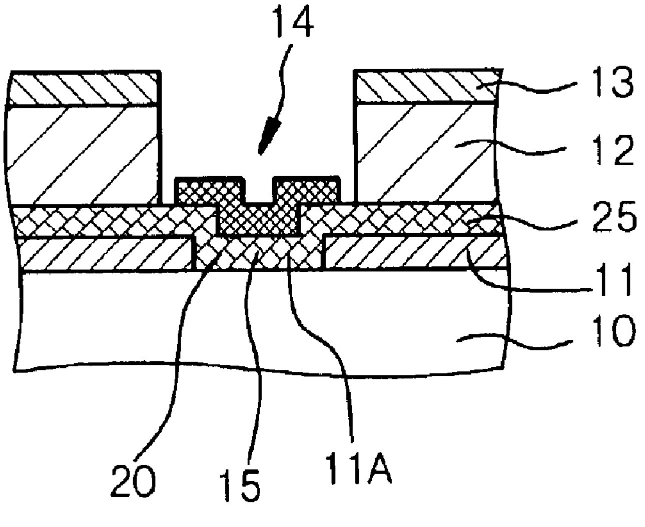

Then, the support member 10 is irradiated with exposure light (specifically, ultraviolet rays) from the back surface (second surface) side of the support member 10 through the hole 11A as a mask for exposure, to expose the electron-emitting-portion-forming-layer 20 to the exposure light in a portion above the hole 11A (see FIG. 19A). When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the electron-emitting-portion-forming-layer 20 is not exposed to the exposure light in a portion that is not to be exposed to the exposure light. Then, the electron-emitting-portion-forming-layer 20 is developed, the electron-emitting-portion-forming-layer 20 is left in a portion above the hole 11A, and the electron emitting portion 15 constituted of the electron-emitting-portion-forming-layer 20 is formed on the light-transmittable layer 25 (see FIG. 19B). That is, the step of "forming an electron emitting portion on the light-transmittable layer by exposure and development" is carried out. Then, the material constituting the electron-emitting-portion-forming-layer 20 is fired. The electron emitting portion 15 is formed in a self-aligned manner in regard to the hole 11A. That is, the electron emitting portion 15 can be formed by a back-surface-exposure method, and the electron emitting portion 15 can be formed in the bottom portion of the opening portion 14 formed through the gate electrode 13 and the insulating layer 12 in regard to the opening portion 14.

[Step-760]

Then, the display is assembled in the same manner as in [Step-160] of Example 1.

EXAMPLE 8

Example 8 is concerned with the process for producing a field emission device according to the third-B aspect of the present invention and the process for producing a display according to the third-B aspect of the present invention, and it is further concerned with the field emission device and the display according to the second aspect of the present invention. The constitution and structure of the field emission device and the display in Example 8 and such constitution and structure of the field emission device and the display in Examples 9 to 12 to be described later are substantially the same as those of the field emission device and the display in Example 7, so that their detailed explanations will be omitted.

The processes for producing the field emission device and the display in Example 8 will be explained with reference to FIGS. 20A and 20B, FIGS. 21A and 21B and FIG. 22 hereinafter.

[Step-800]

First, the step of "forming a cathode electrode", the step of "forming a light-transmittable layer", the step of "forming an insulating layer composed of a photosensitive material that transmits exposure light", the step of "forming a gate electrode composed of a photosensitive material" and the step of "forming an opening portion by exposure from the back surface side and exposing the light-transmittable layer" are carried out in the same manner as in [Step-700] to [Step-730] of Example 7.

[Step-810]

Figure 20A:
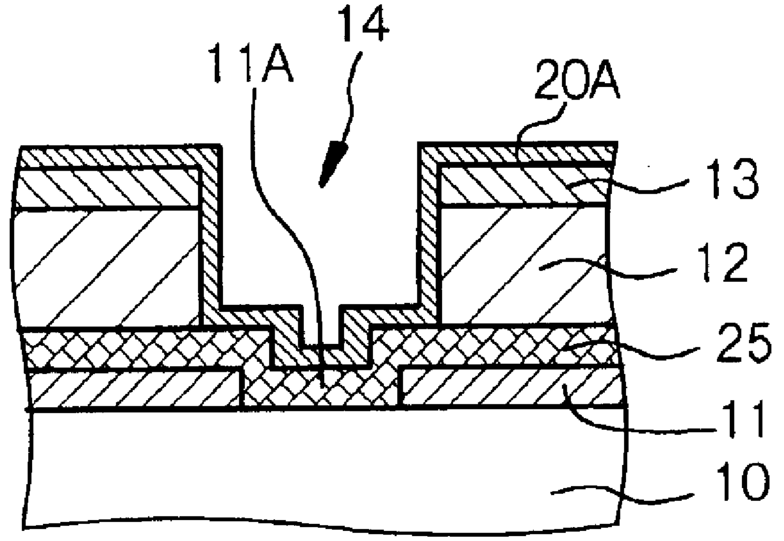
FIGS. 20A and 20B are schematic partial end views of a support member, etc., for explaining the process for producing a cold cathode field emission device in Example 8.

Then, an electron-emitting-portion-forming-layer 20A composed of a non-photosensitive material that transmits exposure light is formed at least inside the opening portion 14 (see FIG. 20A). That is, the step of "forming an electron-emitting-portion-forming-layer composed of a non-photosensitive material" is carried out. Specifically, a step similar to [Step-210] of Example 2 or the variant thereof can be carried out.

[Step-820]

Figure 20B:
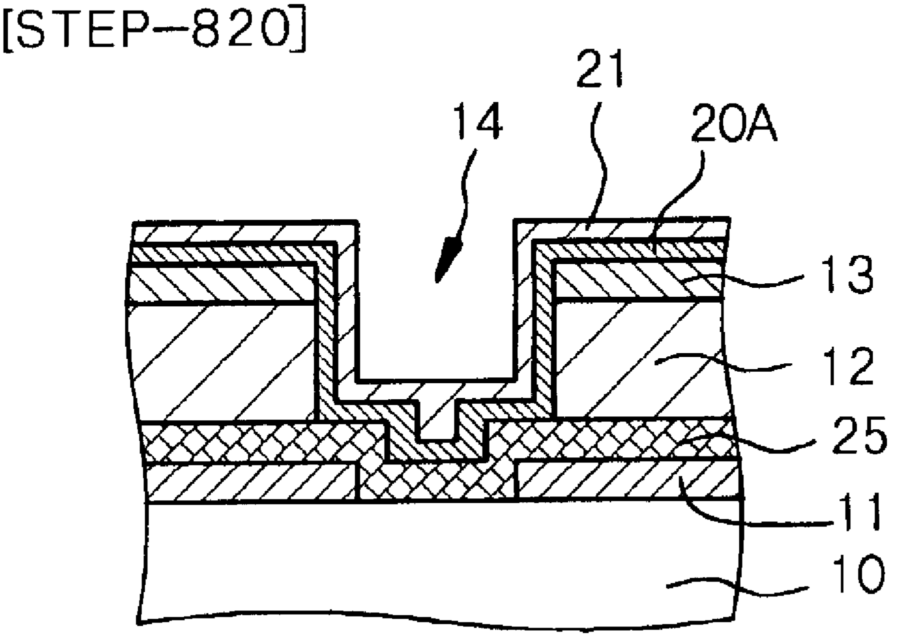

Then, an etching mask layer 21 composed of a negative-type resist material is formed on the entire surface (see FIG. 20B). That is, the step of "forming an etching mask layer" is carried out.

[Step-830]

Figure 21A:
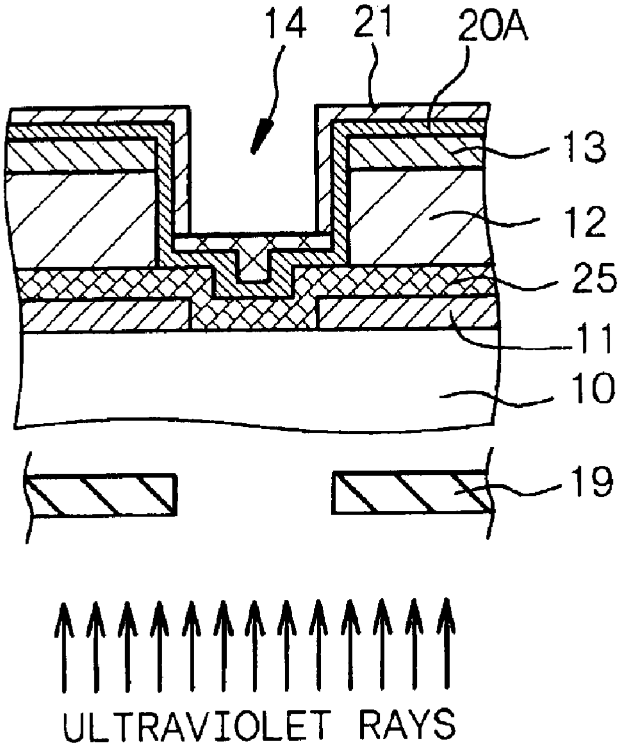
FIGS. 21A and 21B, following

The support member 10 is irradiated with exposure light (specifically, ultraviolet rays) from the back surface (second surface) side of the support member 10 through the hole 11A as a mask for exposure in the same manner as in [Step-230] of Example 2, to expose the etching mask layer 21 to the exposure light in a portion above the hole 11A (see FIG. 21A). Then, the etching mask layer 21 is developed, whereby the etching mask layer 21 is left on the electron-emitting-portion-forming-layer 20A positioned in a bottom portion of the opening portion 14 (see FIG. 21B). That is, the step of "exposing and developing the etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the etching mask layer 21 is not exposed to the exposure light in a portion that is not to be exposed to the exposure light.

[Step-840]

Then, the electron-emitting-portion-forming-layer 20A is etched with the etching mask layer 21 in the same manner as in [Step-240] of Example 2 or the variant of the [Step-240]. Then, the etching mask layer 21 is removed, and an electron emitting portion 15 constituted of the electron-emitting-portion-forming-layer 20A is formed on the light-transmittable layer 25 (see FIG. 22). That is, the step of "forming an electron emitting portion on the light-transmittable layer on the basis of etching" is carried out. The electron emitting portion 15 is formed in a self-aligned manner in regard to the hole 11A. That is, the electron emitting portion 15 can be obtained by a back-surface-exposure method, and the electron emitting portion 15 can be formed in the bottom portion of the opening portion 14 formed through the gate electrode 13 and the insulating layer 12 in a self-aligned manner in regard to the opening portion 14.

[Step-850]

Then, the display is assembled in the same manner as in [Step-160] of Example 1.

EXAMPLE 9

Example 9 is concerned with the process for producing a field emission device according to the third-C aspect of the present invention and the process for producing a display according to the third-C aspect of the present invention, and it is further concerned with the field emission device and the display according to the second aspect of the present invention.

The processes for producing the field emission device and the display in Example 9 will be explained with reference to FIGS. 23A and 23B and FIGS. 24*a* and 24B hereinafter.

[Step-900]

The step of "forming a cathode electrode" and the step of "forming a light-transmittable layer" are carried out in the same manner as in [Step-700] of Example 7.

[Step-910]

Then, an insulating layer 12A composed of a non-photosensitive material that transmits exposure light is formed on the entire surface in the same manner as in [Step-310] of Example 3. That is, the step of "forming an insulating layer composed of a non-photosensitive material that transmits exposure light" is carried out.

[Step-920]

Then, a gate electrode 13A composed of a non-photosensitive material that transmits exposure light and extending in a second direction different from the first direction is formed on the insulating layer 12A in the same manner as in [Step-320] of Example 3. That is, the step of "forming a gate electrode composed of a non-photosensitive material" is carried out.

[Step-930]

Figure 23A:
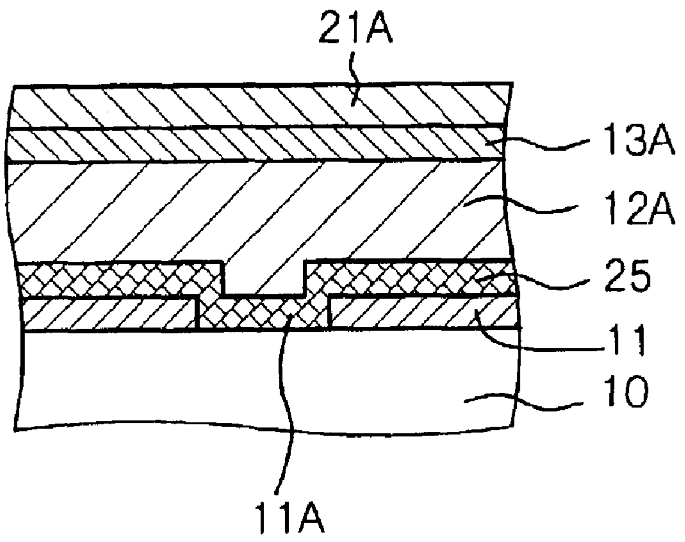
FIGS. 23A and 23B are schematic partial end views of a support member, etc., for explaining the process for producing a cold cathode field emission device in Example 9.

Then, an etching mask layer 21A composed of a positive-type resist material is formed on the gate electrode 13A and the insulating layer 12A in the same manner as in [Step-330] of Example 3 (see FIG. 23A). That is, the step of "forming an etching mask layer on the gate electrode and the insulating layer" is carried out.

[Step-940]

Figure 23B:
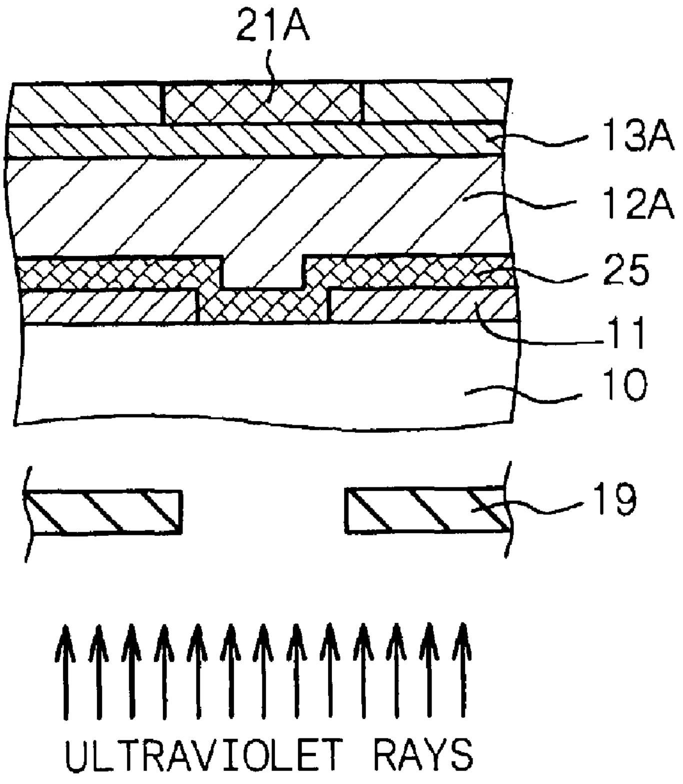
Figure 24A:
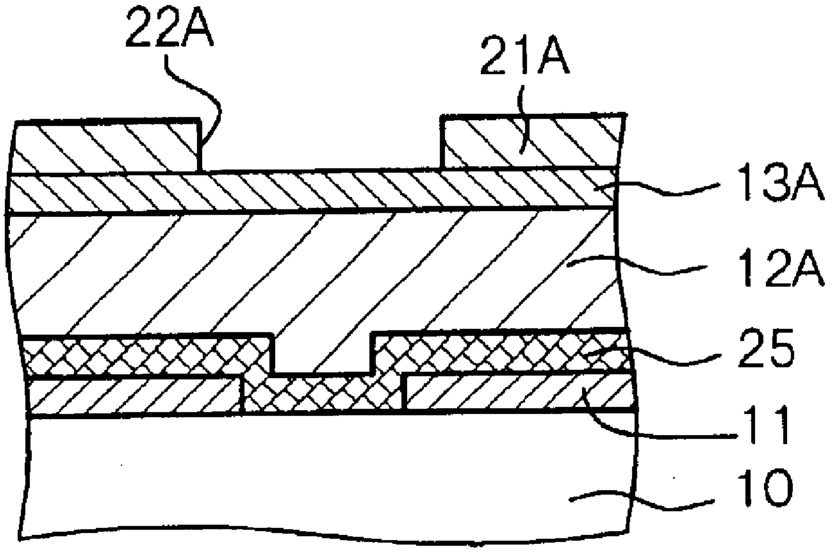
FIGS. 24A and 24B, following
Figure 24B:
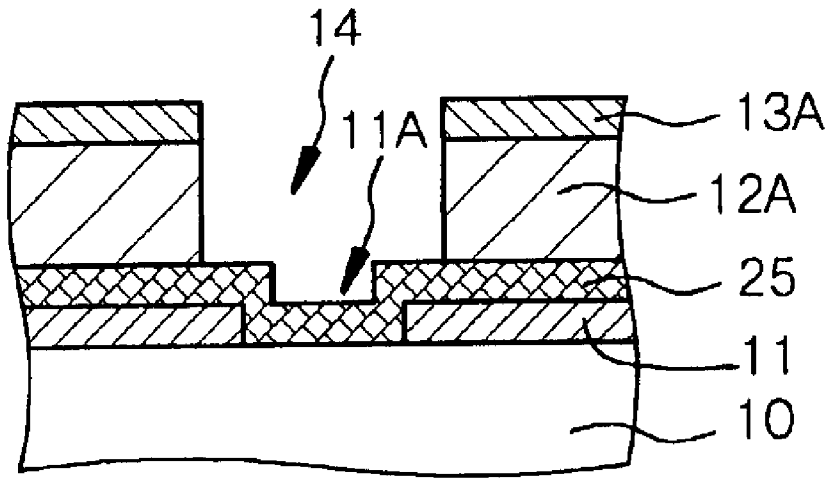

Then, the support member 10 is irradiated with exposure light from the back surface (second surface) side of the support member 10 through the hole 11A as a mask for exposure in the same manner as in [Step-340] of Example 3, to expose the etching mask layer 21A to the exposure light (see FIG. 23B). Then, the etching mask layer 21A is developed, and a mask-layer-opening 22A is formed through the etching mask layer 21A in a portion above the hole 11A (see FIG. 24A). That is, the step of "forming a mask-layer-opening through the etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the etching mask layer 21A is not exposed to the exposure light in a portion that is not to be exposed to the exposure light.

[Step-950]

Then, the gate electrode 13A and the insulating layer 12A below the mask-layer-opening 22A are etched with the etching mask layer 21A in the same manner as in [Step-350] of Example 3. Then, the etching mask layer 21*a* is removed, whereby an opening portion 14 is formed through the insulating layer 12A and the gate electrode 13A above the hole 11A, and the light-transmittable layer 25 is exposed in a bottom portion of the opening portion 14 (see FIG. 24A). Preferably, the opening portion 14 has a larger diameter than the hole 11A, and such an opening portion 14 can be formed by over-etching of the insulating layer 12A and the gate electrode 13A.

[Step-960]

Then, [Step-740] of Example 7 (the step of "forming an electron-emitting-portion-forming-layer composed of a photosensitive material") and [Step-750] of Example 7 (the step of "forming an electron emitting portion on the light-transmittable layer by exposure and development") are carried out.

[Step-970]

Then, the display is assembled in the same manner as in [Step-160] of Example 1.

EXAMPLE 10

Example 10 is concerned with the process for producing a field emission device according to the third-D aspect of the present invention and the process for producing a display according to the third-D aspect of the present invention, and it is further concerned with the field emission device and the display according to the second aspect of the present invention.

The processes for producing the field emission device and the display in Example 10 will be explained with reference to FIGS. 25A and 25B, FIGS. 26A and 26B, FIGS. 27A and 27B, FIGS. 28A and 28B and FIG. 29.

First, [Step-700] of Example 7 (the step of "forming a cathode electrode" and the step of "forming a light-transmittable layer"), [Step-310] of Example 3 (the step of "forming an insulating layer composed of a non-photosensitive material that transmits exposure light") and [Step-320] of Example 3 (the step of "forming a gate electrode composed of a non-photosensitive material") are carried out.

[Step-1010]

Figure 25A:
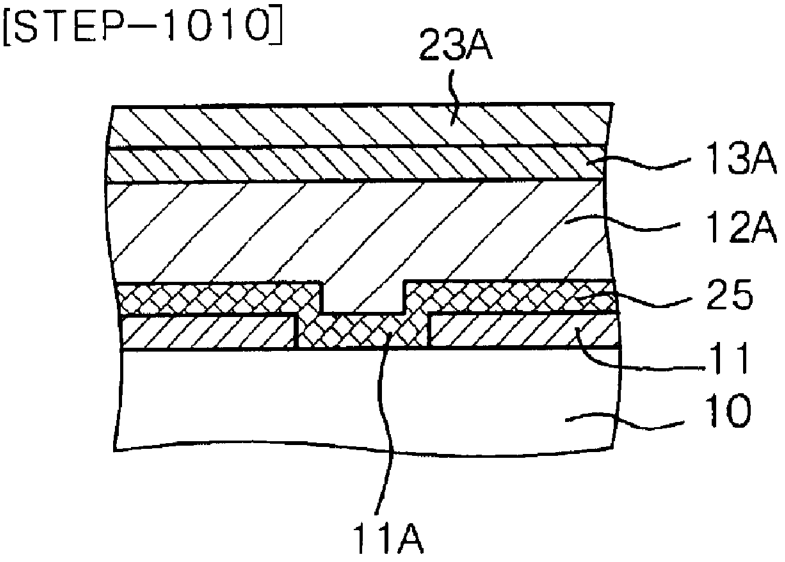
FIGS. 25A and 25B are schematic partial end views of a support member, etc., for explaining the process for producing a cold cathode field emission device in Example 10.

Then, a first etching mask layer 23A composed of a positive-type resist material is formed on the gate electrode 13A and the insulating layer 12A (see FIG. 25A). That is, the step of "forming a first etching mask layer on the gate electrode and the insulating layer" is carried out.

[Step-1020]

Figure 25B:
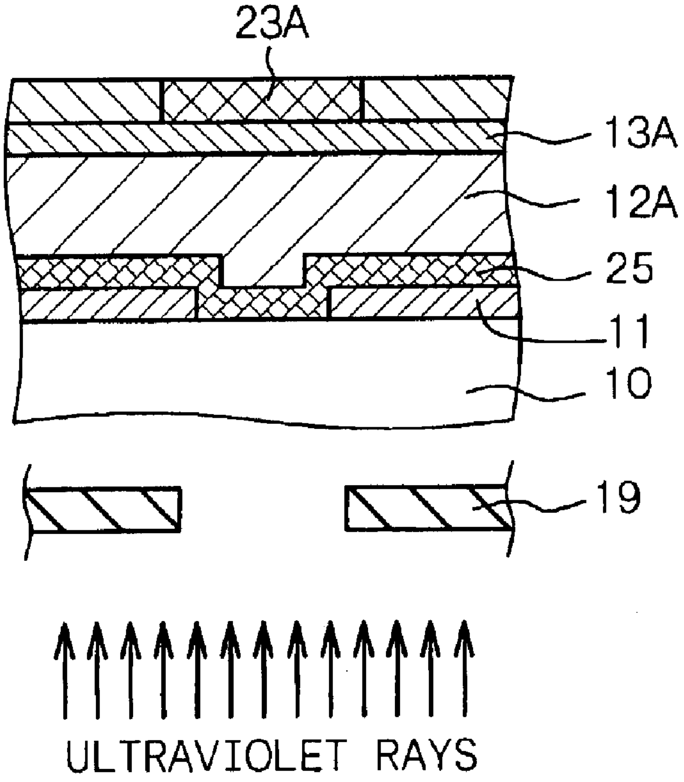

Then, the support member 10 is irradiated with exposure light (specifically, ultraviolet rays) from the back surface (second surface) side of the support member 10 through the hole 11A as a mask for exposure, to expose the first etching mask layer 23A to the exposure light (see FIG. 25B). Then, the first etching mask layer 23A is developed, and a mask-layer-opening 24A is formed through the first etching mask layer 23A in a portion above the hole 11A. That is, the step of "forming a mask-layer-opening through the first etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the first etching mask layer 23A is not exposed to the exposure light in a portion that is not to be exposed to the exposure light.

[Step-1030]

Figure 26A:
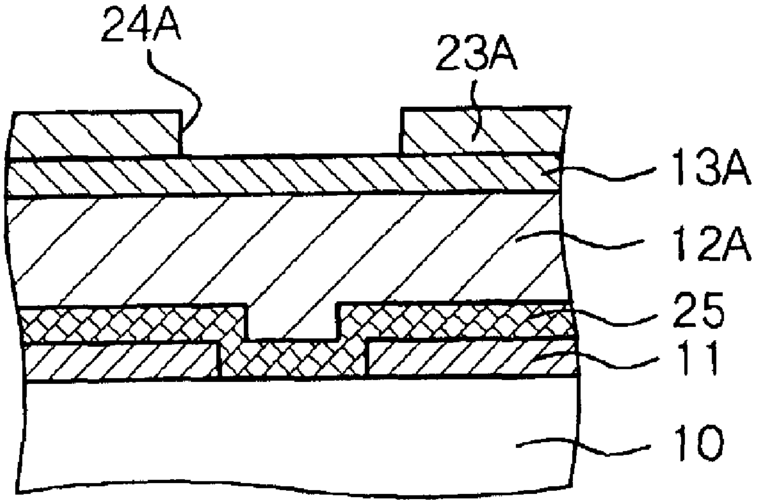
FIGS. 26A and 26B, following
Figure 26B:
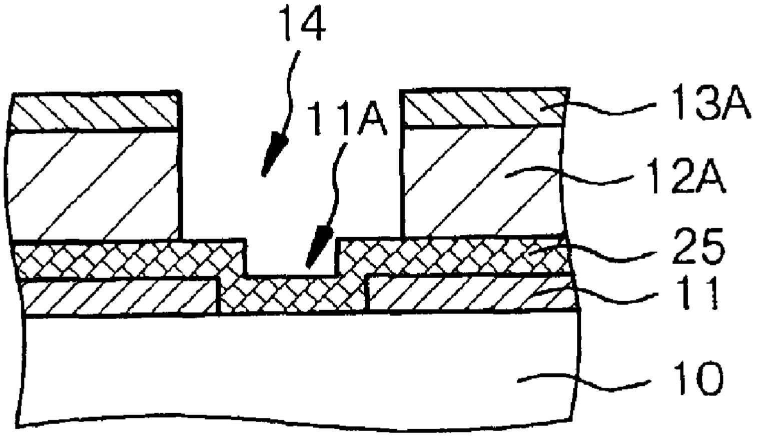

Then, the gate electrode 13A and the insulating layer 12A below the mask-layer-opening 24A are etched with the first etching mask layer 23A, and then the first etching mask layer 23A is removed, whereby an opening portion 14 is formed through the insulating layer 12A and the gate electrode 13A above the hole 11A, and part of the light-transmittable layer 25 is exposed in a bottom portion of the opening portion 14 (see FIG. 26B). Preferably, the opening portion 14 has a larger diameter than the hole 11A, and such an opening portion 14 can be formed by over-etching of the insulating layer 12A and the gate electrode 13A.

[Step-1040]

Figure 27A:
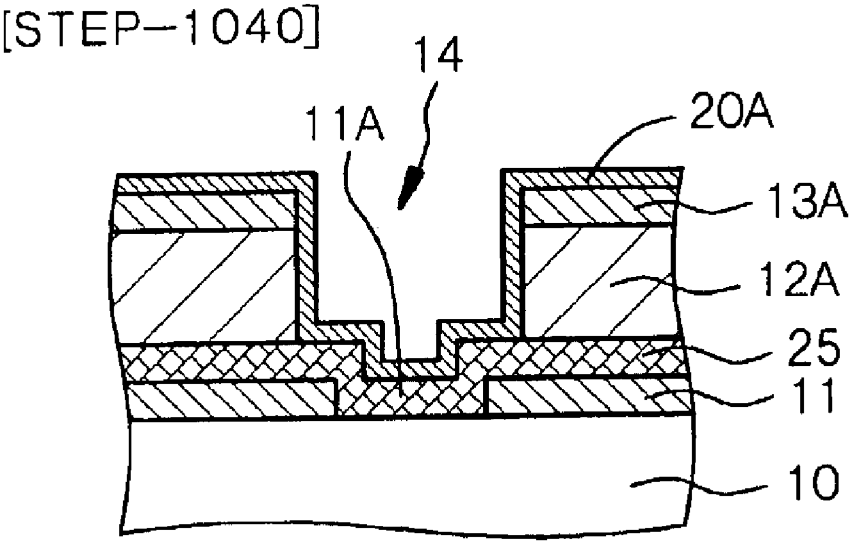
FIGS. 27A and 27B, following

Then, the step of "forming an electron-emitting-portion-forming-layer composed of a non-photosensitive material" is carried out in the same manner as in [Step-210] of Example 2 or the variant thereof (see FIG. 27A).

[Step-1050]

Figure 27B:
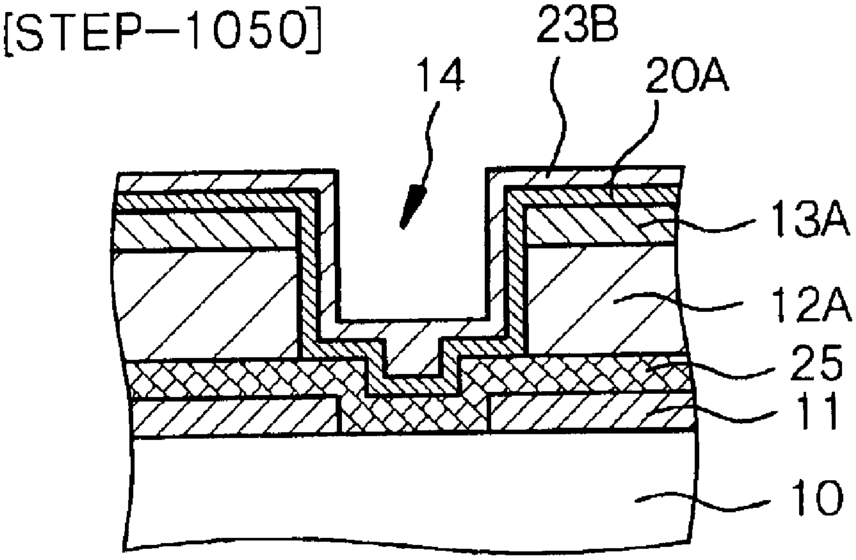

Then, a second etching mask layer 23B composed of a negative-type resist material is formed on the entire surface (see FIG. 27B). That is, the step of "forming a second etching mask layer" is carried out.

[Step-1060]

Figure 28A:
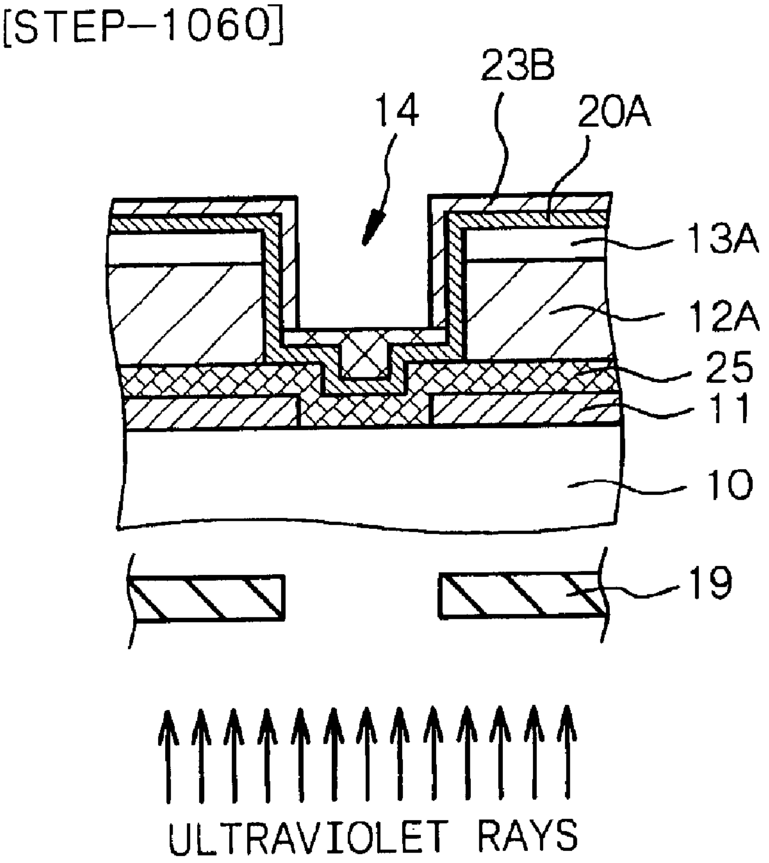
FIGS. 28A and 28B, following
Figure 28B:
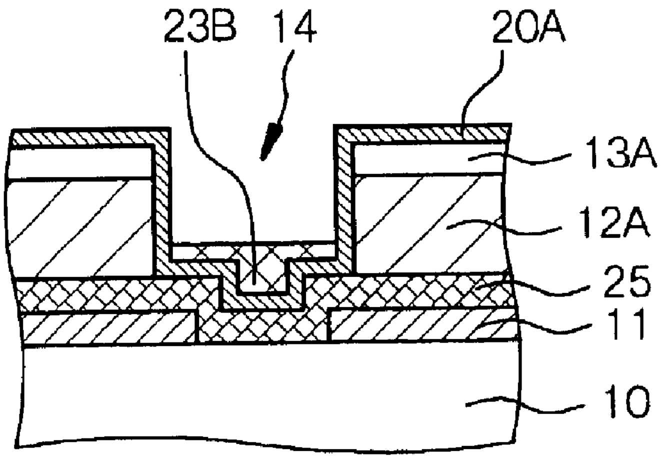

And, the support member 10 is irradiated with exposure light (specifically, ultraviolet rays) from the back surface (second surface) side of the support member 10 through the hole 11A as a mask for exposure, to expose the second etching mask layer 23B to the exposure light in a portion above the hole 11A (see FIG. 28A). Then, the second etching mask layer 23B is developed, whereby the second etching mask layer 23B is left on the electron-emitting-portion-forming-layer 20A positioned in a bottom portion of the opening portion 14 (see FIG. 28B). That is, the step of "exposing and developing the second etching mask layer" is carried out. When the support member 10 is irradiated with the exposure light from the back surface (second surface) side of the support member 10 through the hole 11A as a mask for exposure, it is preferred to provide an exposure-light-shielding member (mask 19) on the back surface (second surface) side of the support member 10, so that the second etching mask layer 23B is not exposed to the exposure light in a portion that is not to be exposed to the exposure light.

[Step-1070]

Figure 29:
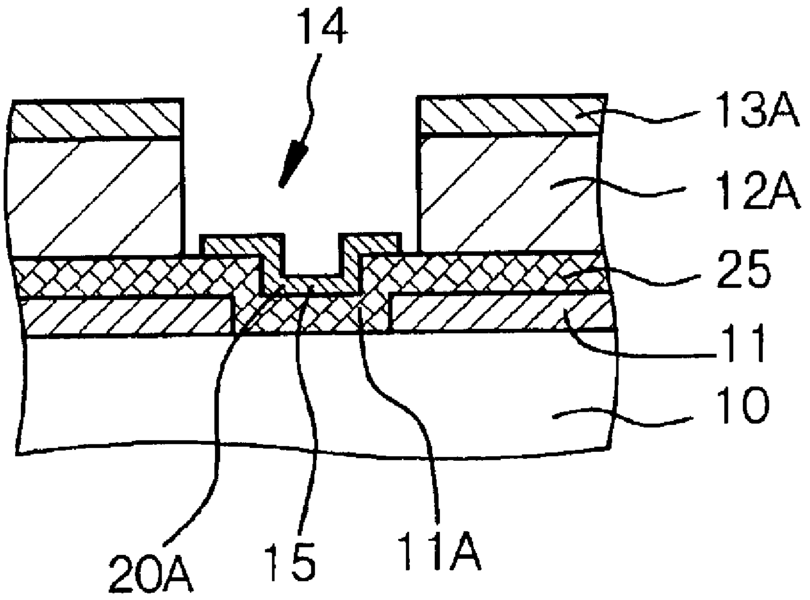
FIG. 29, following

Then, the electron-emitting-portion-forming-layer 20A is etched with the second etching mask layer 23B in the same manner as in [Step-240] of Example 2 or the variant thereof, and then the second etching mask layer 23B is removed, to form an electron emitting portion 15 constituted of the electron-emitting-portion-forming-layer 20A on the light-transmittable layer 25 (see FIG. 29).

[Step-1080]

Then, the display is assembled in the same manner as in [Step-160] of Example 1.

EXAMPLE 11

Example 11 is concerned with the process for producing a field emission device according to the fourth-A aspect of the present invention and the process for producing a display according to the fourth-A aspect of the present invention, and it is further concerned with the field emission device and the display according to the second aspect of the present invention.

The processes for producing the field emission device and the display in Example 11 will be explained with reference to FIGS. 30A and 30B and FIG. 31 hereinafter.

[Step-1100]

First, the step of "forming a cathode electrode" and the step of "forming a light-transmittable layer" are carried out in the same manner as in [Step-700] of Example 7. The cathode electrode 11 extends in a first direction (perpendicular to the paper surface of the drawing). [Step-1110]

Then, an insulating layer 12B composed of a photosensitive material is formed on the entire surface in the same manner as in [Step-510] of Example 5. That is, the step of "forming an insulating layer composed of a photosensitive material" is carried out.

[Step-1120]

Figure 30A:
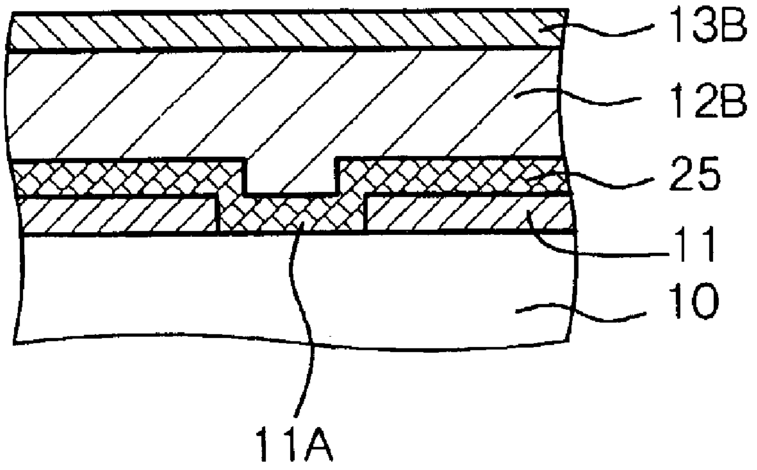
FIGS. 30A and 30B are schematic partial end views of a support member, etc., for explaining the process for producing a cold cathode field emission device in Example 11.

Then, a gate electrode 13B composed of a photosensitive material that transmits exposure light and extending in a second direction (leftward and rightward on the paper surface of the drawing) different from the first direction is formed on the insulating layer 12B in the same manner as in [Step-520] of Example 5 (see FIG. 30A). That is, the step of "forming a gate electrode composed of a photosensitive material that transmits exposure light" is carried out.

[Step-1130]

Figure 30B:
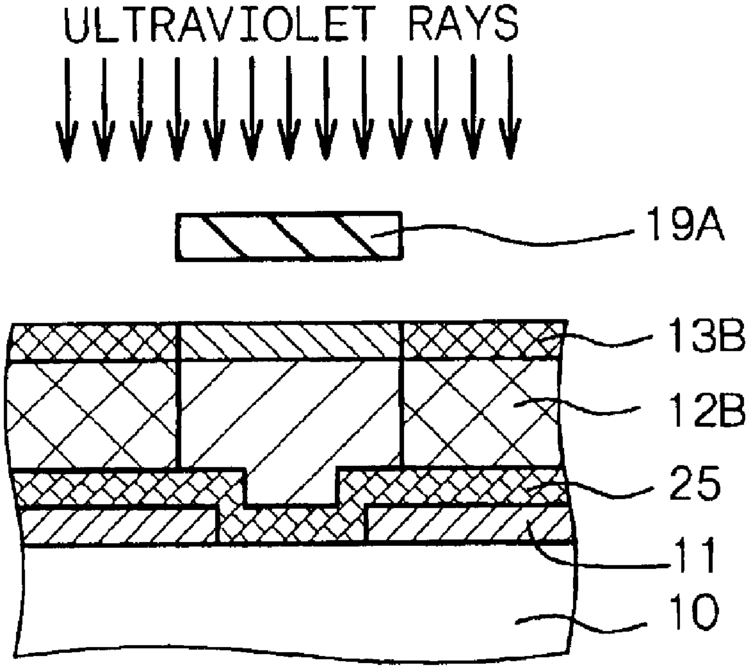

Then, the support member 10 is irradiated with exposure light (specifically, ultraviolet rays) from the front surface (first surface) side of the support member 10 to expose the gate electrode 13B and the insulating layer 12B to the exposure light (see FIG. 30B). Then, the gate electrode 13B and the insulating layer 12B are developed, whereby an opening portion 14 is formed through the gate electrode 13B and the insulating layer 12*b* above the hole 11A, and the light-transmittable layer 25 is exposed in a bottom portion of the opening portion 14 (see FIG. 31). That is, the step of "exposing the light-transmittable layer in a bottom portion of the opening portion" is carried out. When the gate electrode 13B and the insulating layer 12B are exposed to the exposure light, it is preferred to provide an exposure-light-shielding member (mask 19) having a larger size than the hole 11A on the front surface (first surface) side of the support member 10.

[Step-1140]

Then, [Step-740] of Example 7 (the step of "forming an electron-emitting-portion-forming-layer composed of a photosensitive material") and [Step-750] of Example 7 (the step of "forming an electron emitting portion on the light-transmittable layer by exposure and development") are carried out.

[Step-1150]

Then, the display is assembled in the same manner as in [Step-160] of Example 1.

The materials for constituting the insulating layer and the gate electrode may be selected from positive-type materials. In this case, in [Step-1130], portions to be exposed to the exposure light in the insulating layer and the gate electrode are portions where the opening portion is to be formed.

EXAMPLE 12

Example 12 is concerned with the process for producing a field emission device according to the fourth-B aspect of the present invention and the process for producing a display according to the fourth-B aspect of the present invention, and it is further concerned with the field emission device and the display according to the second aspect of the present invention.

The processes for producing the field emission device and the display in Example 12 will be explained with reference again to FIGS. 30A and 30B, FIG. 31, FIGS. 20A and 20B, FIGS. 21A and 21B and FIG. 22.

[Step-1200]

First, the step of "forming a cathode electrode" and the step of "forming a light-transmittable layer" are carried out in the same manner as in [Step-700] of Example 7.

[Step-1210]

Figure 31:
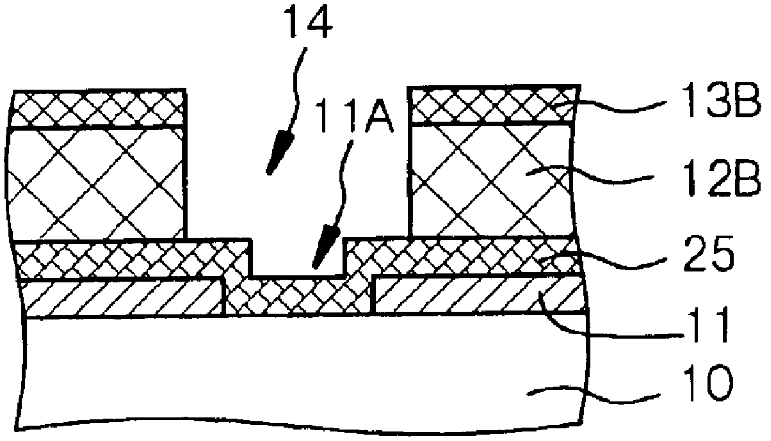
FIG. 31, following
Figure 32:
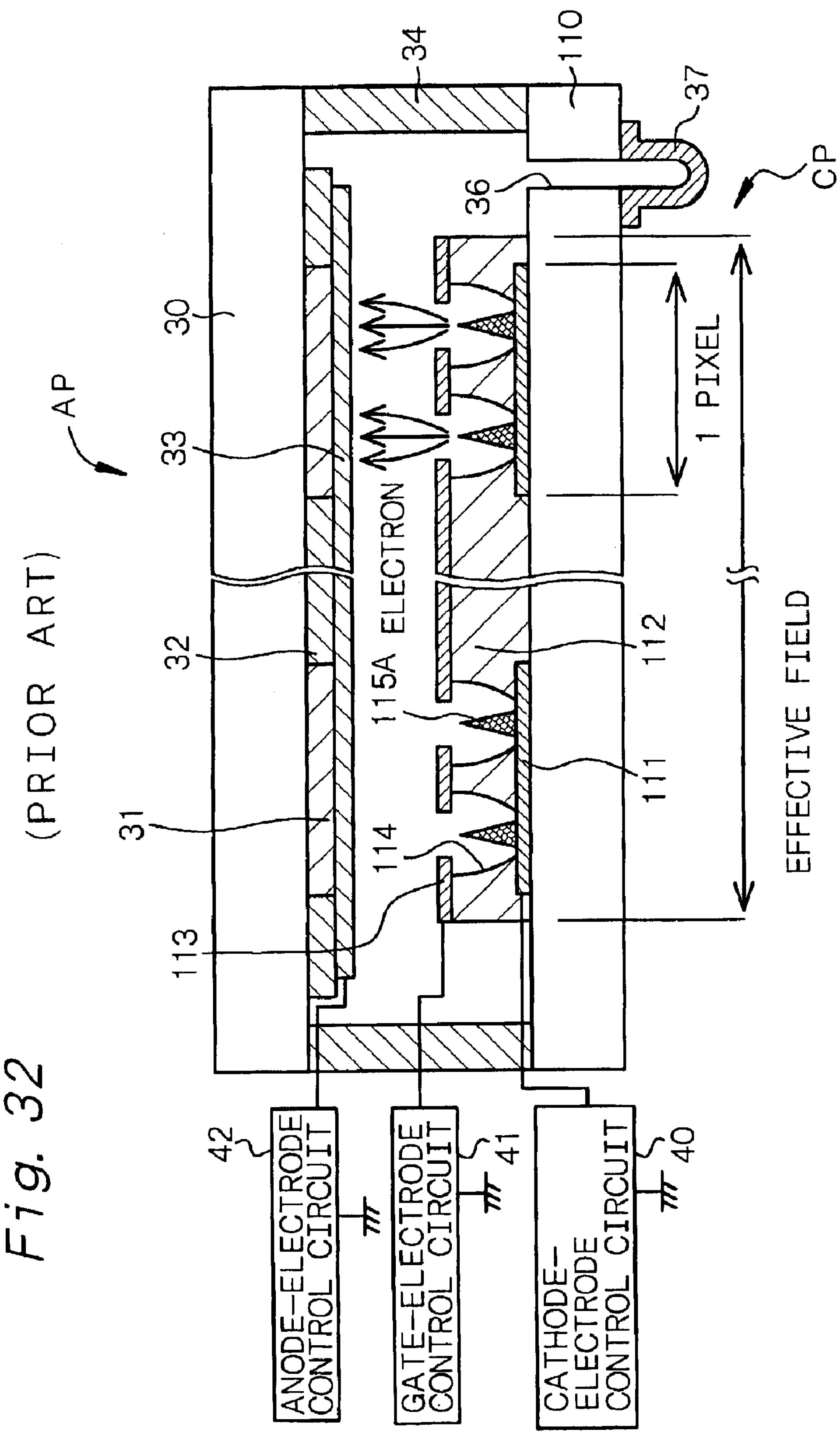
Fig. 32 (PRIOR ART)
FIG. 32 is a schematic partial end view of a conventional cold cathode field emission display having Spindt-type cold cathode field emission devices.

Then, the step of "forming an insulating layer composed of a photosensitive material", the step of "forming a gate electrode composed of a photosensitive material that transmits exposure light" and the step of "exposing the light-transmittable layer in a bottom portion of the opening portion" are carried out in the same manner as in Step-1110], [Step-1120] and [Step-1130] of Example 11 (see FIGS. 30A and 30B and FIG. 31).

[Step-1220]

Then, the step of "forming an electron-emitting-portion-forming-layer composed of a non-photosensitive material" is carried out in the same manner as in [Step-210] of Example 2 or the variant thereof (see FIG. 20A). Further, the step of "forming an etching mask layer" is carried out in the same manner as in [Step-220] of Example 2 (see FIG. 20B).

[Step-1230]

Figure 21B:
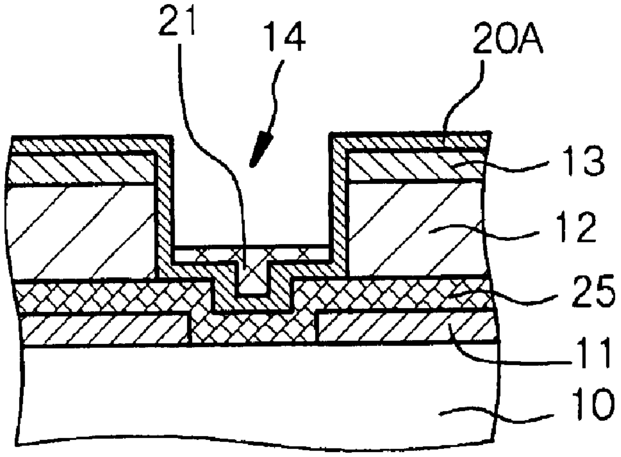
Figure 22:
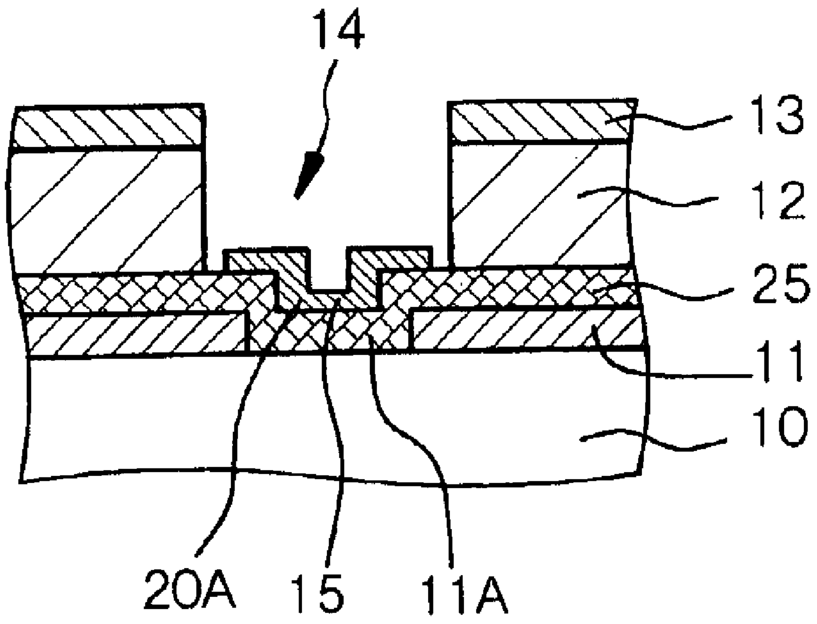
FIG. 22, following

And, the step of "exposing and developing the etching mask layer" is carried out in the same manner as in [Step-230] of Example 2 (see FIGS. 21A and 21B). Then, the step of "forming an electron emitting portion on the cathode electrode on the basis of etching" is carried out in the same manner as in [Step-240] of Example 2 or the variant thereof (see FIG. 22).

[Step-1240]

Then, the display is assembled in the same manner as in [Step-160] of Example 1.

The present invention is explained on the basis of Examples hereinabove, while the present invention shall not be limited thereto. The constitutions and structures of the anode panel, the cathode panel, the display and the field emission device explained in Examples are given for an illustrative purpose and may be modified or altered as required. The production methods, various conditions and materials for the anode panel, the cathode panel, the display and the field emission device are also given for an illustrative purpose and may be modified or altered as required. Further, various materials used in the production of the anode panel and the cathode panel are also given for an illustrative purpose and may be modified or altered as required. All the displays are explained as full-color displays, while they may be constituted as black and white displays.

The display may be provided with a focus electrode. The focus electrode refers to an electrode for focusing the path of electrons that are emitted from the opening portion toward the anode electrode so that the brightness can be improved and that an optical crosstalk between adjacent pixels can be prevented. The focus electrode is particularly effective for a so-called high-voltage type cold cathode field emission display in which the voltage difference between the anode electrode and the cathode electrode is on the order of several kilovolts and the distance between the anode electrode and the cathode electrode is relatively large. A relatively negative voltage is applied to the focus electrode from a focus-electrode control circuit. It is not necessarily required to form a focus electrode for every cold cathode field emission device, but a focus electrode extending in a predetermined arrangement direction of cold cathode field emission devices can exert a common focusing effect on a plurality of such cold cathode field emission devices.

The above focus electrode can be formed, for example, by forming an insulating film made, for example, of $SiO_2$ on each surface of an approximately several tens μm thick metal sheet made of a 42% Ni—Fe alloy and forming opening portions through the metal sheet in regions corresponding to pixels by punching or etching. The cathode panel, the metal sheet and the anode panel are stacked, a frame is arranged in circumferential portions of the panels, the insulating film formed on one surface of the metal sheet and the insulating layer 12 are bonded to each other by heat treatment, the insulating film formed on the other surface of the metal sheet and the anode panel are bonded to each other by heat treatment, to integrate these members, and the thus-assembled unit is vacuumed and sealed, whereby a display can be completed.

The gate electrode may have a constitution in which an electrically conductive material (having opening portions) in the form of one sheet covers the effective field. In this case, a positive voltage is applied to the gate electrode. And, a switching element constituted, for example, of TFT is provided between the cathode electrode constituting each pixel and the cathode-electrode control circuit, and the state of voltage application to the cathode electrode constituting each pixel is controlled by the operation of the switching element, whereby the light emission state of the pixel can be controlled.

Alternatively, the cathode electrode may have a constitution in which an electrically conductive material in the form of one sheet covers the effective field. In this case, a voltage is applied to the cathode electrode. And, a switching element constituted, for example, of TFT is provided between the gate electrode constituting each pixel and the gate-electrode control circuit, and the state of voltage application to the gate electrode constituting each pixel is controlled by the operation of the switching element, whereby the light emission state of the pixel can be controlled.

The anode electrode may be an anode electrode having a constitution in which an electrically conductive material in the form of one sheet covers the effective field, or may have a constitution in which anode electrode units corresponding to one or a plurality of electron emitting portions each or one or a plurality of pixels each are gathered. When the anode electrode has the former constitution, such an anode electrode can be connected to the anode-electrode control circuit, and when the anode electrode has the latter constitution, for example, each anode electrode unit can be connected to the anode-electrode control circuit.

In the processes for producing a field emission device or a display according to the first-A aspect to first-D aspect of the present invention, the second-A aspect and second-B aspect of the present invention, the third-A aspect to third-D aspect of the present invention and the fourth-A aspect and fourth-B aspect of the present invention, a selective-growth-region forming layer and a selective growth region may be formed in place of the electron-emitting-portion-forming-layer and the electron emitting portion in the step of forming the electron-emitting-portion-forming-layer and the electron emitting portion. In this case, after the selective growth region is finally formed, an electron emitting portion constituted of carbon nanotubes or carbon nanofibers can be formed on the selective growth region by a CVD method. The selective growth region can be formed from a material having a kind of catalytic function for forming the electron emitting portion by a CVD method.

According to the present invention, the electron emitting portion is formed by the back-surface-exposure method, so that the electron emitting portion can be formed in the bottom portion of the opening portion in a self-aligned manner in regard to the opening portion formed through the gate electrode and the insulating layer. In the process for producing a cold cathode field emission device or a cold cathode field emission display according to any one of the first A-aspect to first-D aspects of the present invention and the third-A aspect to the third-D aspect of the present invention, the opening portion is formed by the back-surface-exposure method, the opening portion can be formed through the gate electrode and the insulating layer in a self-aligned manner in regard to the hole.

Therefore, it is made possible to prevent the occurrence of display non-uniformity caused by positional deviation of the support member from a mask for exposure in exposure, which deviation is caused by the deformation or shrinkage/elongation of the support member.

Further, the present invention employs the back-surface-exposure method using the hole as a mask for exposure, so that the number of photomasks can be decreased and that the steps of adjusting positions in exposure can be also decreased in number or omitted. Therefore, the production cost can be decreased, and less expensive cold cathode field emission displays can be provided. Further, the distance between the electron emitting portion and the gate electrode can be decreased by highly accurate patterning, so that the voltage for emitting electrons can be decreased. There can be therefore produced low-power-consumption and less expensive cold cathode field emission displays. Furthermore, since a screen printing method can be mainly employed, it is no longer required to frequently use expensive production apparatuses for semiconductor devices, so that the production cost of cold cathode field emission displays can be finally decreased.

What is claimed is:

1. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer on an entire surface, said insulating layer being composed of a photosensitive material that transmits exposure light, (C) forming a gate electrode on the insulating layer, said gate electrode being composed of a photosensitive material and extending in a second direction different from the first direction, (D) irradiating the support member with exposure light from a back surface side of the support member through said hole as a mask for exposure, to expose the insulating layer and the gate electrode in portions above the hole to the exposure light, developing the insulating layer and the gate electrode to remove the insulating layer and the gate electrode in the portions above the hole, whereby an opening portion is formed through the insulating layer and the gate electrode above the hole and part of the cathode electrode is exposed in a bottom portion of the opening portion, said opening portion having a larger diameter than said hole, (E) forming an electron-emitting-portion-forming-layer composed of a photosensitive material at least inside the opening portion, and (F) irradiating the support member with exposure light from a back surface side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole.

2. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer on an entire surface, said insulating layer being composed of a photosensitive material that transmits exposure light, (C) forming a gate electrode on the insulating layer, said gate electrode being composed of a photosensitive material and extending in a second direction different from the first direction, (D) irradiating the support member with exposure light from a back surface side of the support member through said hole as a mask for exposure, to expose the insulating layer and the gate electrode in portions above the hole to the exposure light, developing the insulating layer and the gate electrode to remove the insulating layer and the gate electrode in the portions above the hole, whereby an opening portion is formed through the insulating layer and the gate electrode above the hole and part of the cathode electrode is exposed in a bottom portion of the opening portion, said opening portion having a larger diameter than said hole, (E) forming an electron-emitting-portion forming-layer composed of a photosensitive material at least inside the opening portion, and (F) irradiating the support member with exposure light from a back surface side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole.

3. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer on an entire surface, said insulating layer being composed of a photosensitive material that transmits exposure light, (C) forming a gate electrode on the insulating layer, said gate electrode being composed of a photosensitive material and extending in a second direction different from the first direction, (D) irradiating the support member with exposure light from a back surface side of the support member through said hole as a mask for exposure, to expose the insulating layer and the gate electrode in portions above the hole to the exposure light, developing the insulating layer and the gate electrode to remove the insulating layer and the gate electrode in the portions above the hole, whereby an opening portion is formed through the insulating layer and the gate electrode above the hole and part of the cathode electrode is exposed in a bottom portion of the opening portion, said opening portion having a larger diameter than said hole, (E) forming an electron-emitting-portion-forming-layer composed of a non-photosensitive material that transmits exposure light, at least inside the opening portion, (F) fanning an etching mask layer composed of a resist material on an entire surface, (G) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (H) etching the electron-emitting-portion-forming-layer with the etching mask layer, and then removing the etching mask layer, to form an electron emitting portion constituted of the electron-emitting-portion-forming-layer on the cathode electrode and inside the hole.

4. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer on an entire surface, said insulating layer being composed of a photosensitive material that transmits exposure light, (C) forming a gate electrode on the insulating layer, said gate electrode being composed of a photosensitive material and extending in a second direction different from the first direction, (D) irradiating the support member with exposure light from a back surface side of the support member through said hole as a mask for exposure, to expose the insulating layer and the gate electrode in portions above the hole to the exposure light, developing the insulating layer and the gate electrode to remove the insulating layer and the gate electrode in the portions above the hole, whereby an opening portion is formed through the insulating layer and the gate electrode above the hole and part of the cathode electrode is exposed in a bottom portion of the opening portion, said opening portion having a larger diameter than said hole, (E) forming an electron-emitting-portion-forming-layer composed of a non-photosensitive material that transmits exposure light, at least inside the opening portion, (F) forming an etching mask layer composed of a resist material on an entire surface, (G) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (H) etching the electron-emitting-portion-forming-layer with the etching mask layer, and then removing the etching mask layer, to form an electron emitting portion constituted of the electron-emitting-portion-forming-layer on the cathode electrode and inside the hole.

5. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a non-photosensitive material that transmits exposure light on an entire surface, (C) forming a gate electrode on the insulating layer, said gate electrode being composed of a non-photosensitive material that transmits exposure light and extending in a second direction different from the first direction, (D) forming an etching mask layer composed of a resist material on the gate electrode and the insulating layer, (E) irradiating the support member with exposure light from a back surface side of the support member through said hole as a mask for exposure, to expose the etching mask layer to the exposure light, and then developing the etching mask layer to form a mask-layer-opening through the etching mask layer in a portion above the hole, (F) etching the gate electrode and the insulating layer below the mask-layer-opening with the etching mask layer, and then removing the etching mask layer, whereby an opening portion is formed through the insulating layer and the gate electrode above the hole and part of the cathode electrode is exposed in a bottom portion of the opening portion, said opening portion having a larger diameter than said hole, (G) forming an electron-emitting-portion-forming-layer composed of a photosensitive material at least inside the opening portion, and (H) irradiating the support member with exposure light from a back surface side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole.

6. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a non-photosensitive material that transmits exposure light on an entire surface, (C) forming a gate electrode on the insulating layer, said gate electrode being composed of a non-photosensitive material that transmits exposure light and extending in a second direction different from the first direction, (D) forming an etching mask layer composed of a resist material on the gate electrode and the insulating layer, (E) irradiating the support member with exposure light from a back surface side of the support member through said hole as a mask for exposure, to expose the etching mask layer to the exposure light, and then developing the etching mask layer to form a mask-layer-opening through the etching mask layer in a portion above the hole, (F) etching the gate electrode arid the insulating layer below the mask-layer-opening with the etching mask layer, and then removing the etching mask layer, whereby an opening portion is formed through the insulating layer and the gate electrode above the hole and part of the cathode electrode is exposed in a bottom portion of the opening portion, said opening portion having a larger diameter than said hole, (G) forming an electron-emitting-portion-forming-layer composed of a photosensitive material at least inside the opening portion, and (H) irradiating the support member with exposure light from a back surface side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole.

7. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a non-photosensitive material that transmits exposure light on an entire surface, (C) forming a gate electrode on the insulating layer, said gate electrode being composed of a non-photosensitive material that transmits exposure light and extending in a second direction different from the first direction, (D) forming a first etching mask layer composed of a resist material on the gate electrode and the insulating layer, (E) irradiating the support member with exposure light from a back surface side of the support member through said hole as a mask for exposure to expose the first etching mask layer to the exposure light, and then developing the first etching mask layer to form a mask-layer-opening through the first etching mask layer in a portion above the hole, (F) etching the gate electrode and the insulating layer below the mask-layer-opening with the first etching mask layer, and then removing the first etching mask layer, whereby an opening portion is formed through the insulating layer and the gate electrode above the hole and part of the cathode electrode is exposed in a bottom portion of the opening portion, said opening portion having a larger diameter than said hole, (G) forming an electron-emitting-portion-forming-layer composed of a non-photosensitive material that transmits exposure light, at least inside the opening portion, (H) forming a second etching mask layer composed of a resist material on an entire surface, (I) irradiating the support member with exposure light from a back surface side of the support member through said hole as a mask for exposure, to expose the second etching mask layer to the exposure light in a portion above the hole, and then developing the second etching mask layer, thereby to leave (he second etching mask layer on the electron-emitting-portion-forming-layer positioned in a bottom portion of the opening portion, and (J) etching the electron-emitting-portion-forming-layer with the second etching mask layer, and then removing the second etching mask layer, to form an electron emitting portion constituted of the electron-emitting-portion-forming-layer on the cathode electrode and inside the hole.

8. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a non-photosensitive material that transmits exposure light on an entire surface, (C) forming a gate electrode on the insulating layer, said gate electrode being composed of a non-photosensitive material that transmits exposure light and extending in a second direction different from the first direction, (D) forming a first etching mask layer composed of a resist material on the gate electrode and the insulating layer, (E) irradiating the support member with exposure light from a back surface side of the support member through said hole as a mask for exposure to expose the first etching mask layer to the exposure light, and then developing the first etching mask layer to form a mask-layer-opening through the first etching mask layer in a portion above the hole, (F) etching the gate electrode and the insulating layer below the mask-layer-opening with the first etching mask layer, and then removing the first etching mask layer, whereby an opening portion is formed through the insulating layer and the gate electrode above the hole and part of the cathode electrode is exposed in a bottom portion of the opening portion, said opening portion having a larger diameter than said hole, (G) forming an electron-emitting-portion-forming-layer composed of a non-photosensitive material that transmits exposure light, at least inside the opening portion, (H) forming a second etching mask layer composed of a resist material on an entire surface, (I) irradiating the support member with exposure light from a back surface side of the support member through said hole as a mask for exposure, to expose the second etching mask layer to the exposure light in a portion above the hole, and then developing the second etching mask layer, thereby to leave the second etching mask layer on the electron-emitting-portion-forming-layer positioned in a bottom portion of the opening portion, and (J) etching the electron-emitting-portion-forming-layer with the second etching mask layer, and then removing the second etching mask layer, to form an electron emitting portion constituted of the electron-emitting-portion-forming-layer on the cathode electrode and inside the hole.

9. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a photosensitive material on an entire surface, (C) forming a gate electrode on the insulating layer, said gate electrode being composed of a photosensitive material that transmits exposure light and extending in a second direction different from the first direction, (D) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and part of the cathode electrode is exposed in a bottom portion of the opening portion, said opening portion having a larger diameter than said hole, (E) forming an electron-emitting-portion-forming-layer composed of a photosensitive material at least inside the opening portion, and (F) irradiating the support member with exposure light from a back surface side of the support member through said hole as a mask for exposure, to expose the electron-emitting-portion-forming-layer above the hole to the exposure light, and developing the electron-emitting-portion-forming-layer to form an electron emitting portion composed of the electron-emitting-portion-forming-layer on the cathode electrode and inside the hole.

10. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a photosensitive material on an entire surface, (C) forming a gate electrode on the insulating layer, said gate electrode being composed of a photosensitive material that transmits exposure light and extending in a second direction different from the first direction, (D) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and part of the cathode electrode is exposed in a bottom portion of the opening portion, said opening portion having a larger diameter than said hole, (E) forming an electron-emitting-portion-forming-layer composed of a photosensitive material at least inside the opening portion, and (F) irradiating the support member with exposure light from a back surface side of the support member through said hole as a mask for exposure, to expose the electron-emitting-portion-forming-layer above the hole to the exposure light, and developing the electron-emitting-portion-forming-layer to form an electron emitting portion constituted of the electron-emitting-portion-forming-layer on the cathode electrode and inside the hole.

11. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a photosensitive material on an entire surface, (C) forming a gate electrode on the insulating layer, said gate electrode being composed of a photosensitive material that transmits exposure light and extending in a second direction different from the first direction, (D) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and part of the cathode electrode is exposed in a bottom portion of the opening portion, said opening portion having a larger diameter than said hole, (E) forming an electron-emitting-portion-forming-layer composed of a non-photosensitive material that transmits exposure light, at least inside the opening portion, (F) forming an etching mask layer composed of a resist material on an entire surface, (G) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (H) etching the electron-emitting-portion-forming-layer with the etching mask layer, and then removing the etching mask layer, to form an electron emitting portion constituted of the electron-emitting-portion-forming-layer on the cathode electrode and inside the hole.

12. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming an insulating layer composed of a photosensitive material on an entire surface, (C) forming a gate electrode on the insulating layer, said gate electrode being composed of a photosensitive material that transmits exposure light and extending in a second direction different from the first direction, (D) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and part of the cathode electrode is exposed in a bottom portion of the opening portion, said opening portion having a larger diameter than said hole, (E) forming an electron-emitting-portion-forming-layer composed of a non-photosensitive material that transmits exposure light, at least inside the opening portion, (F) forming an etching mask layer composed of a resist material on an entire surface, (G) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (H) etching the electron-emitting-portion-forming-layer with the etching mask layer, and then removing the etching mask layer, to form an electron emitting portion constituted of the electron-emitting-portion-forming-layer on the cathode electrode and inside the hole.

13. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer on an entire surface, said insulating layer being composed of a photosensitive material that transmits exposure light, (D) forming a gate electrode on the insulating layer, said gate electrode being composed of a photosensitive material and extending in a second direction different from the first direction, (E) irradiating the support member from a back surface side of the support member through said hole as a mask for exposure to expose the insulating layer and the gate electrode to the exposure light in portions above the hole, then, developing the insulating layer and the gate electrode to remove the insulating layer and the gate electrode in portions above the hole, whereby an opening portion is formed through the insulating layer and the gate electrode above the hole and the light-transmittable layer is exposed in a bottom portion of the opening portion, (F) forming an electron-emitting-portion-forming-layer composed of a photosensitive material at least inside the opening portion, and (G) irradiating the support member from a back surface side of the support member through said hole as a mask for exposure to expose the electron-emitting-portion-forming-layer to the exposure light in a portion above the hole, and then developing the electron-emitting-portion-forming-layer to form an election emitting portion constituted of the electron-emitting-portion-forming-layer on the light-transmittable layer.

14. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer on an entire surface, said insulating layer being composed of a photosensitive material that transmits exposure light, (D) forming a gate electrode on the insulating layer, said gate electrode being composed of a photosensitive material and extending in a second direction different from the first direction, (E) irradiating the support member from a back surface side of the support member through said hole as a mask for exposure to expose the insulating layer and the gate electrode to the exposure light in portions above the hole, then, developing the insulating layer and the gate electrode to remove the insulating layer and the gate electrode in portions above the hole, whereby an opening portion is formed through the insulating layer and the gate electrode above the hole and the light-transmittable layer is exposed in a bottom portion of the opening portion, (F) forming an electron-emitting-portion-forming-layer composed of a photosensitive material at least inside the opening portion, and (G) irradiating the support member from a back surface side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer.

15. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer on an entire surface, said insulating layer being composed of a photosensitive material that transmits exposure light, (D) forming a gate electrode on the insulating layer, said gate electrode being composed of a photosensitive material and extending in a second direction different from the first direction, (E) irradiating the support member from a back surface side of the support member through said hole as a mask for exposure to expose the insulating layer and the gate electrode to the exposure light in portions above the hole, then, developing the insulating layer and the gate electrode to remove the insulating layer and the gate electrode in portions above the hole, whereby an opening portion is formed through the insulating layer and the gate electrode above the hole and the light-transmittable layer is exposed in a bottom portion of the opening portion, (F) forming an electron-emitting-portion-forming-layer composed of a non-photosensitive material that transmits exposure light, at least inside the opening portion, (G) forming an etching mask layer composed of a resist material on an entire surface, (H) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (I) etching the electron-emitting-portion-forming-layer with the etching mask layer, and then removing the etching mask layer, to form an electron emitting portion constituted of the electron-emitting-portion-forming-layer on the light-transmittable layer.

16. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer on an entire surface, said insulating layer being composed of a photosensitive material that transmits exposure light, (D) forming a gate electrode on the insulating layer, said gate electrode being composed of a photosensitive material and extending in a second direction different from the first direction, (E) irradiating the support member from a back surface side of the support member through said hole as a mask for exposure to expose the insulating layer and the gate electrode to the exposure light in portions above the hole, then, developing the insulating layer and the gate electrode to remove the insulating layer and the gate electrode in portions above the hole, whereby an opening portion is formed through the insulating layer and the gate electrode above the hole and the light-transmittable layer is exposed in a bottom portion of the opening portion, (F) forming an electron-emitting-portion-forming-layer composed of a non-photosensitive material that transmits exposure light, at least inside the opening portion, (G) forming an etching mask layer composed of a resist material on an entire surface, (H) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (I) etching the electron-emitting-portion-forming-layer with the etching mask layer, and then removing the etching mask layer, to form an electron emitting portion constituted of the electron-emitting-portion-forming-layer on the light-transmittable layer.

17. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a non-photosensitive material that transmits exposure light on an entire surface, (D) forming a gate electrode on the insulating layer, said gate electrode being composed of a non-photosensitive material that transmits exposure light and extending in a second direction different from the first direction, (E) forming an etching mask layer composed of a resist material on the gate electrode and the insulating layer, (F) irradiating the support member with exposure light from a back surface side of the support member through said hole as a mask for exposure, to expose the etching mask layer to the exposure light, and then developing the etching mask layer to form a mask-layer-opening through the etching mask layer in a portion above the hole, (G) etching the gate electrode and the insulating layer below the mask-layer-opening with the etching mask layer, and then removing the etching mask layer, whereby an opening portion is formed through the insulating layer and the gate electrode above the hole and the light-transmittable layer is exposed in a bottom portion of the opening portion, (H) forming an electron-emitting-portion-forming-layer composed of a photosensitive material at least inside the opening portion, and (I) irradiating the support member from a back surface side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer.

18. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a non-photosensitive material that transmits exposure light on an entire surface, (D) forming a gate electrode on the insulating layer, said gate electrode being composed of a non-photosensitive material that transmits exposure light and extending in a second direction different from the first direction, (E) forming an etching mask layer composed of a resist material on the gate electrode and the insulating layer, (F) irradiating the support member with exposure light from a back surface side of the support member through said hole as a mask for exposure, to expose the etching mask layer to the exposure light, and then developing the etching mask layer to form a mask-layer-opening through the etching mask layer in a portion above the hole, (G) etching the gate electrode and the insulating layer below the mask-layer-opening with the etching mask layer, and then removing the etching mask layer, whereby an opening portion is formed through the insulating layer and the gate electrode above the hole and the light-transmittable layer is exposed in a bottom portion of the opening portion, (H) forming an electron-emitting-portion-forming-layer composed of a photosensitive material at least inside the opening portion, and (I) irradiating the support member from a back surface side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer.

19. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a non-photosensitive material that transmits exposure light on an entire surface, (D) forming a gate electrode on the insulating layer, said gate electrode being composed of a non-photosensitive material that transmits exposure light and extending in a second direction different from the first direction, (E) forming a first etching mask layer composed of a resist material on the gate electrode and the insulating layer, (F) irradiating the support member with exposure light from a back surface side of the support member through said hole as a mask for exposure to expose the first etching mask layer to the exposure light, and then developing the first etching mask layer to form a mask-layer-opening through the first etching mask layer in a portion above the hole, (G) etching the gate electrode and the insulating layer in portions below the mask-layer-opening with the first etching mask layer, and then removing the first etching mask layer, whereby an opening portion is formed through the insulating layer and the gate electrode above the hole and the light-transmittable layer is exposed in a bottom portion of the opening portion, (H) forming an electron-emitting-portion-forming-layer composed of a non-photosensitive material that transmits exposure light, at least inside the opening portion, (I) forming a second etching mask layer composed of a resist material on an entire surface, (J) irradiating the support member with exposure light from a back surface side of the support member through said hole as a mask for exposure, to expose the second etching mask layer to the exposure light in a portion above the hole, and then developing the second etching mask layer, thereby to leave the second etching mask layer on the electron-emitting-portion-forming-layer positioned in a bottom portion of the opening portion, and (K) etching the electron-emitting-portion-forming-layer with the second etching mask layer and then removing the second etching mask layer, to form an electron emitting portion constituted of the electron-emitting-portion-forming-layer on the light-transmittable layer.

20. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a non-photosensitive material that transmits exposure light on an entire surface, (D) forming a gate electrode on the insulating layer, said gate electrode being composed of a non-photosensitive material that transmits exposure light and extending in a second direction different from the first direction, (E) forming a first etching mask layer composed of a resist material on the gate electrode and the insulating layer, (F) irradiating the support member with exposure light from a back surface side of the support member through said hole as a mask for exposure to expose the first etching mask layer to the exposure light, and then developing the first etching mask layer to form a mask-layer-opening through the first etching mask layer in a portion above the hole, (G) etching the gate electrode and the insulating layer in portions below the mask-layer-opening with the first etching mask layer, and then removing the first etching mask layer, whereby an opening portion is formed through the insulating layer and the gate electrode above the hole and the light-transmittable layer is exposed in a bottom portion of the opening portion, (H) forming an electron-emitting-portion-forming-layer composed of a non-photosensitive material that transmits exposure light, at least inside the opening portion, (I) forming a second etching mask layer composed of a resist material on an entire surface, (J) irradiating the support member with exposure light from a back surface side of the support member through said hole as a mask for exposure, to expose the second etching mask layer to the exposure light in a portion above the hole, and then developing the second etching mask layer, thereby to leave the second etching mask layer on the electron-emitting-portion-forming-layer positioned in a bottom portion of the opening portion, and (K) etching the electron-emitting-portion-forming-layer with the second etching mask layer and then removing the second etching mask layer, to form an electron emitting portion constituted of the electron-emitting-portion-forming-layer on the light-transmittable layer.

21. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a photosensitive material on an entire surface, (D) forming a gate electrode on the insulating layer, said gate electrode being composed of a photosensitive material that transmits exposure light and extending in a second direction different from the first direction, (E) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and the light-transmittable layer is exposed in a bottom portion of the opening portion, (F) forming an electron-emitting-portion-forming-layer composed of a photosensitive material at least inside the opening portion, and (G) irradiating the support member from a back surface side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer.

22. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a photosensitive material on an entire surface, (D) forming a gate electrode on the insulating layer, said gate electrode being composed of a photosensitive material that transmits exposure light and extending in a second direction different from the first direction, (E) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and the light-transmittable layer is exposed in a bottom portion of the opening portion, (F) forming an electron-emitting-portion-forming-layer composed of a photosensitive material at least inside the opening portion, and (G) irradiating the support member from a back surface side of the support member through said hole as a mask for exposure to expose the electron-emitting-portion-forming-layer to the exposure light in a portion above the hole, and then developing the electron-emitting-portion-forming-layer to form an electron emitting portion constituted of the electron-emitting-portion-forming-layer on the light-transmittable layer.

23. A process for producing a cold cathode field emission device comprising the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a photosensitive material on an entire surface, (D) forming a gate electrode on the insulating layer, said gate electrode being composed of a photosensitive material that transmits exposure light and extending in a second direction different from the first direction, (E) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and the light-transmittable layer is exposed in a bottom portion of the opening portion, (F) forming an electron-emitting-portion-forming-layer composed of a non-photosensitive material that transmits exposure light, at least inside the opening portion, (G) forming an etching mask layer composed of a resist material on an entire surface, (H) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (I) etching the electron-emitting-portion-forming-layer with the etching mask layer, and then removing the etching mask layer, to form an electron emitting portion constituted of the electron-emitting-portion-forming-layer on the light-transmittable layer.

24. A process for producing a cold cathode field emission display comprising arranging a substrate having an anode electrode and a phosphor layer and a support member having a cold cathode field emission device such that the phosphor layer and the cold cathode field emission device face each other, and bonding the substrate and the support member in their circumferential portions, in which the cold cathode field emission device is forming by the steps of;

(A) forming a cathode electrode on a front surface of a support member that transmits exposure light, said cathode electrode having a hole in a bottom of which the support member is exposed, being composed of a material that does not transmit exposure light and extending in a first direction, (B) forming a light-transmittable layer composed of an electrically conductive material or a resistance material that transmits exposure light, at least inside the hole, (C) forming an insulating layer composed of a photosensitive material on an entire surface, (D) forming a gate electrode on the insulating layer, said gate electrode being composed of a photosensitive material that transmits exposure light and extending in a second direction different from the first direction, (E) irradiating the support member with exposure light from a front surface side of the support member to expose the gate electrode and the insulating layer to the exposure light, and then developing the gate electrode and the insulating layer, whereby an opening portion is formed through the gate electrode and the insulating layer above the hole and the light-transmittable layer is exposed in a bottom portion of the opening portion, (F) forming an electron-emitting-portion-forming-layer composed of a non-photosensitive material that transmits exposure light, at least inside the opening portion, (G) forming an etching mask layer composed of a resist material on an entire surface, (H) irradiating the support member with exposure light from a back surface side of the support member through said hole as a mask for exposure, to expose the etching mask layer in a portion above the hole to the exposure light, and developing the etching mask layer to leave the etching mask layer on the electron-emitting-portion-forming-layer positioned in a bottom portion of the opening portion, and (I) etching the electron-emitting-portion-forming-layer with the etching mask layer, and then removing the etching mask layer, to form an electron emitting portion constituted of the electron-emitting-portion-forming-layer on the light-transmittable layer.

* * * * *

UNITED STATES PATENT AND TRADEMARK OFFICE

CERTIFICATE OF CORRECTION

PATENT NO. : 6,900,066 B2
APPLICATION NO. : 10/395379
DATED : May 31, 2005
INVENTOR(S) : Motohiro Toyota et al.

It is certified that error appears in the above-identified patent and that said Letters Patent is hereby corrected as shown below:

Title Page item 57
<u>Abstract:</u>
Line 11, “form” should read --from--.

Title Page item 57
<u>Abstract:</u>
Line 12, “at” should read --as--.

<u>Column 50:</u>
Line 30, “fanning” should read --forming--

<u>Column 52:</u>
Line 42, “arid” should read --and--

<u>Column 53:</u>
Line 39, “to leave (he second” should read --to leave the second--

Signed and Sealed this

Twenty-second Day of May, 2007

JON W. DUDAS
*Director of the United States Patent and Trademark Office*